United States Patent
Hirabayashi et al.

(10) Patent No.: US 7,172,851 B2
(45) Date of Patent: Feb. 6, 2007

(54) LIGHT SENSITIVE COMPOSITION, PLANOGRAPHIC PRINTING PLATE MATERIAL, AND IMAGE FORMATION METHOD

(75) Inventors: Kazuhiko Hirabayashi, Kanagawa (JP); Norio Miura, Sagamihara (JP); Toshiyuki Matsumura, Fujino-machi (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 18 days.

(21) Appl. No.: 10/837,145

(22) Filed: Apr. 30, 2004

(65) Prior Publication Data

US 2005/0037286 A1    Feb. 17, 2005

(30) Foreign Application Priority Data

May 13, 2003  (JP) .............................. 2003-134280
Aug. 27, 2003  (JP) .............................. 2003-302717

(51) Int. Cl.
  *G03F 7/028*  (2006.01)
  *G03F 7/30*  (2006.01)

(52) U.S. Cl. ................ 430/280.1; 430/281.1; 430/288.1; 430/302

(58) Field of Classification Search ............. 430/280.1, 430/281.1, 288.1, 325, 302, 326
See application file for complete search history.

(56) References Cited

U.S. PATENT DOCUMENTS

| | | | | | |
|---|---|---|---|---|---|
| 4,849,320 | A | * | 7/1989 | Irving et al. ............. | 430/280.1 |
| 5,066,564 | A | * | 11/1991 | Zertani et al. ........... | 430/284.1 |
| 5,229,253 | A | * | 7/1993 | Zertani et al. ........... | 430/281.1 |
| 5,252,694 | A | * | 10/1993 | Willett et al. ................. | 522/13 |
| 5,354,784 | A | * | 10/1994 | Timmons et al. ............. | 522/33 |
| 6,287,745 | B1 | * | 9/2001 | Yamamura et al. ......... | 430/269 |
| 2004/0023136 | A1 | * | 2/2004 | Munnelly et al. ............. | 430/18 |
| 2004/0091816 | A1 | * | 5/2004 | Matsumura et al. ..... | 430/281.1 |
| 2004/0229165 | A1 | * | 11/2004 | Munnelly et al. ........ | 430/281.1 |

* cited by examiner

*Primary Examiner*—John S. Chu
(74) *Attorney, Agent, or Firm*—Frishauf, Holtz, Goodman & Chick, P.C.

(57) ABSTRACT

Disclosed is a light sensitive composition comprising an addition polymerizable ethylenically unsaturated monomer A), a photopolymerization initiator B), a polymer binder C), and a cation-polymerization compound D), wherein the photopolymerization initiator D) is an iron-arene complex.

7 Claims, No Drawings

LIGHT SENSITIVE COMPOSITION, PLANOGRAPHIC PRINTING PLATE MATERIAL, AND IMAGE FORMATION METHOD

FIELD OF THE INVENTION

The present invention provides a light sensitive composition, a light sensitive planographic printing plate material and an image formation method, and particularly to a light sensitive composition, a light sensitive planographic printing plate material and an image formation method, providing excellent printing durability, stain elimination property and linearity.

BACKGROUND OF THE INVENTION

Generally, a negative working light sensitive planographic printing plate material is imagewise exposed to harden the exposed portions, dissolving away the unexposed portions, washed with water, and subjected to finisher gumming treatment to obtain a planographic printing plate. In recent years, an attempt has been made in which after digital exposure is made based on image information employing a laser light in order to provide high dissolving power and sharpness, development treatment is carried out to obtain a planographic printing plate. For example, there is a system for preparing a planographic printing plate, in which a light source is modulated based on image information transported from a communication line, or based on output signals from an electronic plate making system or an image processing system, a light sensitive material is directly scanning exposed employing the light source.

There is a problem in a conventional planographic printing plate material employing a diazo resin in that it is difficult to increase sensitivity or to carry out spectral sensitization for meeting an emission wavelength of a laser for digital exposure In order to obtain high sensitivity.

In recent years, as a light sensitive material suitable for laser exposure, which can increase sensitivity and carry out spectral sensitization, a planographic printing plate material has been noted which comprises a photopolymerizable light sensitive layer containing a photopolymerization initiator. However, a planographic printing plate material for CTP (Computer To Plate) for recording a digital image according to laser exposure is generally poor in printing durability. A printing plate material with high printing durability has been desired in various printing industries such as newspaper printing or commercial printing industries.

Hitherto, there have been disclosed a technique employing a titanocene compound as a photopolymerization initiator (see Japanese Patent O.P.I. Publication Nos. 2001-209170 and 2001-183822), a technique employing autoagglutination of urethane bond of a urethane resin (see Japanese Patent O.P.I. Publication No. 2001-100412), a technique employing a an ethylenically unsaturated compound containing a phosphate ester bond (see Japanese Patent O.P.I. Publication No. 10-10719), and a technique employing a silane coupling agent or employing a diazonium compound disclosed in Japanese Patent O.P.I. Publication No. 2001-249444. These techniques are not satisfactory, and development of a method solving the problems has been desired.

SUMMARY OF THE INVENTION

Accordingly, an object of the invention is to provide a light sensitive composition, a light sensitive planographic printing plate material and an image formation method, providing excellent printing durability, excellent stain elimination property and excellent linearity.

The above object of the invention can be attained by the followings:

1. A light sensitive composition comprising an addition polymerizable ethylenically unsaturated monomer A), a photopolymerization initiator B), a polymer binder C), and a cation-polymerizable compound D), wherein the photopolymerization initiator D) is an iron-arene complex.

2. The light sensitive composition of item 1 above, wherein the cation-polymerizable compound has a radical-polymerizable group and a cation-polymerizable group in the molecule.

3. The light sensitive composition of item 1 above, wherein the cation-polymerizable compound is a compound represented by formula (I) or (II),

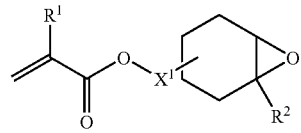

Formula (I)

wherein $R^1$ represents a hydrogen atom or a methyl group; $R^2$ represents a hydrogen atom or an alkyl group having a carbon atom number of not more than 4; and $X^1$ represents a chemical bond, or a divalent organic group.

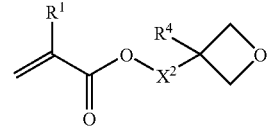

Formula (II)

wherein $R^3$ represents a hydrogen atom or a methyl group; $R^4$ represents a hydrogen atom or an alkyl group having a carbon atom number of not more than 4; and $X^2$ represents a chemical bond, or a divalent organic group.

4. The light sensitive composition of item 1 above, wherein the addition polymerizable ethylenically unsaturated monomer A) is a compound represented by formula (A),

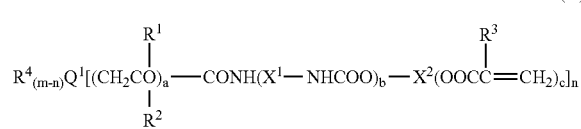

Formula (A)

wherein $Q^1$ represents

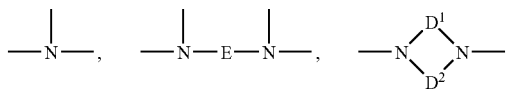

or —S—; $R^4$ represents an alkyl group, a hydroxyalkyl group, or an aryl group; $R^1$ and $R^2$ independently represent a hydrogen atom, an alkyl group, or an alkoxyalkyl group; $R^3$ represents a hydrogen atom, a methyl group or an ethyl group; $x^1$ represents a divalent group having a carbon atom number of from 2 to 12; and $X^1$ represents a divalent, trivalent or tetravalent group or the following group,

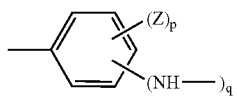

wherein Z represents a hydrogen atom, an alkyl group, an alkenyl group, an aryl group, a halogen atom, an alkoxy group, or a heterocyclic group; p is an integer of from 1 to 4; q is an integer of from 1 to 3; $D^1$ and $D^2$ independently represent a divalent group having a carbon atom number of from 1 to 5; E represents a divalent group having a carbon atom number of from 2 to 12; an aliphatic group having a 5- to 7-membered heterocyclic group containing one or two atoms selected from the group consisting of a nitrogen atom, an oxygen atom and a sulfur atom; an arylene group having a carbon atom number of from 6 to 12 or a 5- or 6-membered aromatic heterocyclic group; "a" is an integer of 0 to 4; "b" is an integer of 0 or 1; "c" represents an integer of 1 to 3; m is an integer of from 2 to 4; and n represents an integer of 1 to m.

5. The light sensitive composition of item 1 above, further comprising a polyhalogenated compound.

6. The light sensitive composition of item 1 above, further comprising a compound having an absorption maximum in the wavelength regions of from 700 to 1200 nm.

7. A light sensitive planographic printing plate material comprising a support and provided thereon, a light sensitive layer comprising an addition polymerizable ethylenically unsaturated monomer A), a photopolymerization initiator B), a polymer binder C), and a cation-polymerizable compound D), wherein the photopolymerization initiator D) is an iron-arene complex.

8. The light sensitive planographic printing plate material of item 7 above, wherein the cation-polymerizable compound has a radical-polymerizable group and a cation-polymerizable group in the molecule.

9. The light sensitive planographic printing plate material of item 7 above, wherein the cation-polymerizable compound is a compound represented by formula (I) or (II), Formula (I)

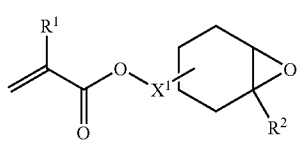

wherein $R^1$ represents a hydrogen atom or a methyl group; $R^2$ represents a hydrogen atom or an alkyl group having a carbon atom number of not more than 4; and $X^1$ represents a chemical bond, or a divalent organic group.

Formula (II)

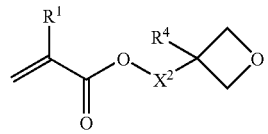

wherein $R^3$ represents a hydrogen atom or a methyl group; $R^4$ represents a hydrogen atom or an alkyl group having a carbon atom number of not more than 4; and $X^2$ represents a chemical bond, or a divalent organic group.

10. The light sensitive planographic printing plate material of item 7 above, wherein the addition polymerizable ethylenically unsaturated monomer A) is a compound represented by formula (A), Formula (A)

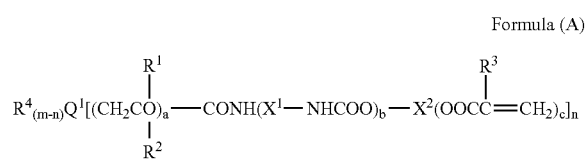

wherein $Q^1$ represents

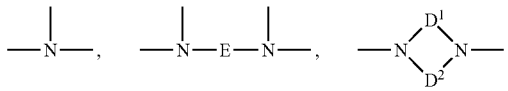

or —S—; $R^4$ represents an alkyl group, a hydroxyalkyl group, or an aryl group; $R^1$ and $R^2$ independently represent a hydrogen atom, an alkyl group, or an alkoxyalkyl group; $R^3$ represents a hydrogen atom, a methyl group or an ethyl group; $x^1$ represents a divalent group having a carbon atom number of from 2 to 12; and $X^1$ represents a divalent, trivalent or tetravalent group or the following group,

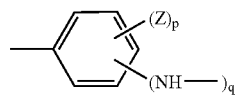

wherein Z represents a hydrogen atom, an alkyl group, an alkenyl group, an aryl group, a halogen atom, an alkoxy group, or a heterocyclic group; p is an integer of from 1 to 4; q is an integer of from 1 to 3; $D^1$ and $D^2$ independently represent a divalent group having a carbon atom number of from 1 to 5; E represents a divalent group having a carbon atom number of from 2 to 12; an aliphatic group having a 5- to 7-membered heterocyclic group containing one or two atoms selected from the group consisting of a nitrogen atom, an oxygen atom and a sulfur atom; an arylene group having a carbon atom number of from 6 to 12 or a 5- or 6-membered aromatic heterocyclic group; "a" is an integer of 0 to 4; "b"

is an integer of 0 or 1; "c" represents an integer of 1 to 3; m is an integer of from 2 to 4; and n represents an integer of 1 to m.

11. The light sensitive planographic printing plate material of item 7 above, wherein the light sensitive layer further comprises a polyhalogenated compound.

12. The light sensitive planographic printing plate material of item 7 above, wherein the light sensitive layer further comprises a compound having an absorption maximum in the wavelength regions of from 700 to 1200 nm.

13. An image formation method comprising the steps of providing a light sensitive composition comprising an addition polymerizable ethylenically unsaturated monomer A), a photopolymerization initiator B), a polymer binder C), a cation-polymerizable compound D), and a compound having an absorption maximum in the wavelength regions of from 700 to 1200 nm, coating the light sensitive composition on a support to obtain a light sensitive planographic printing plate material having a light sensitive layer on the support, and imagewise exposing the light sensitive layer employing a light having an emission wavelength of from 700 to 1200 nm so that the exposure energy on the light sensitive layer surface is not less than 1 mJ/cm$^2$, whereby an image is recorded on the light sensitive layer.

DETAILED DESCRIPTION OF THE INVENTION

In view of the above, the present inventors have made an extensive study. As a result, they have found that a light sensitive composition, which comprising an addition polymerizable ethylenically unsaturated monomer A), a photopolymerization initiator B), a polymer binder C), and a cation-polymerizable compound D), wherein the photopolymerization initiator D) is an iron-arene complex, and a planographic printing plate material comprising the light sensitive composition solve the above problems. They have also found that a composition comprising a compound having an epoxy group and an iron-arene complex can provide further higher printing durability, and have attained the present invention. It is considered that of the two decomposition products of the iron-arene complex, one initiates radical polymerization, and the other initiates cationic polymerization. A conventional photopolymer type planographic printing plate material for CTP employing a titanocene compound is insufficient in printing durability, while the planographic printing plate material of the invention employing the iron-arene complex can greatly increase printing durability, since the iron-arene complex can simultaneously proceed both radical polymerization and cationic polymerization. It has been also found that the planographic printing plate material of the invention provides excellent linearity and excellent stain elimination property.

The present invention will be detailed below.

<<Addition Polymerizable Ethylenically Unsaturated Monomer>>

The addition polymerizable ethylenically unsaturated monomer will be explained.

As the addition polymerizable ethylenically unsaturated monomer in the invention, there are a known monomer such as a radical polymerizable monomer, and a polyfunctional monomer or oligomer having two or more of an ethylenic double bond in the molecule generally used in an ultraviolet curable resin composition. The monomers are not specifically limited.

Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. These prepolymers can be used singly, in combination or as their mixture with the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A•epichlorhydrin•(meth)acrylic acid or phenol novolak•epichlorhydrin•(meth)acrylic acid obtained by incorporating (meth)acrylic acid in an epoxy resin; an urethaneacrylate such as ethylene glycol•adipic acid•tolylenediisocyanate•2-hydroxyethylacrylate, polyethylene glycol•tolylenediisocyanate•2-hydroxyethylacrylate, hydroxyethylphthalyl methacrylate•xylenediisocyanate, 1,2-polybutadieneglycol•tolylenediisocyanate•2-hydroxyethylacrylate or trimethylolpropane•propylene glycol•tolylenediisocyanate•2-hydroxyethylacrylate, obtained by incorporating (meth)acrylic acid in an urethane resin; a silicone acrylate such as polysiloxane acrylate, or polysiloxane•diisocyanate•2-hydroxyethylacrylate; an alkyd modified acrylate obtained by incorporating a methacroyl group in an oil modified alkyd resin; and a spiran resin acrylate.

The light sensitive composition of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomer used in the invention is preferably a phosphate compound having at least one (meth)acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV•EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In the invention, an addition polymerizable ethylenically unsaturated monomer having a tertiary amino group in the molecule is preferably used. Its molecular structure is not limited, but those are preferred in which a tertiary amine having a hydroxyl group is modified with glycidyl methacrylate, methacrylic chloride, or acrylic chloride. Examples thereof include a polymerizable compound disclosed I Japanese Patent O.P.I. Publication Nos. 1-165613, 1-203413 and 1-197213.

A reaction product of a polyhydric alcohol having a tertiary amino group in the molecule, a diisocyanate and a compound having a hydroxyl group and an addition polymerizable ethylenically double bond in the molecule is preferably used in the invention. can be synthesized according to the same method as a conventional method in which a urethaneacrylate compound is ordinarily synthesized employing a diol, a diisocyanate and an acrylate having a hydroxyl group.

Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N, N', N'-tetra-2-hydroxypropylethylenediamine, p-tolyldiethanolamine, N,N, N', N'-tetra-2-hydroxyethylethylenediamine, N,N-bis(2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto. Examples of the compound having a hydroxyl group and an addition polymerizable ethylenically double bond in the molecule include the following compounds MH-1 through MH-13, but the invention is not specifically limited thereto.

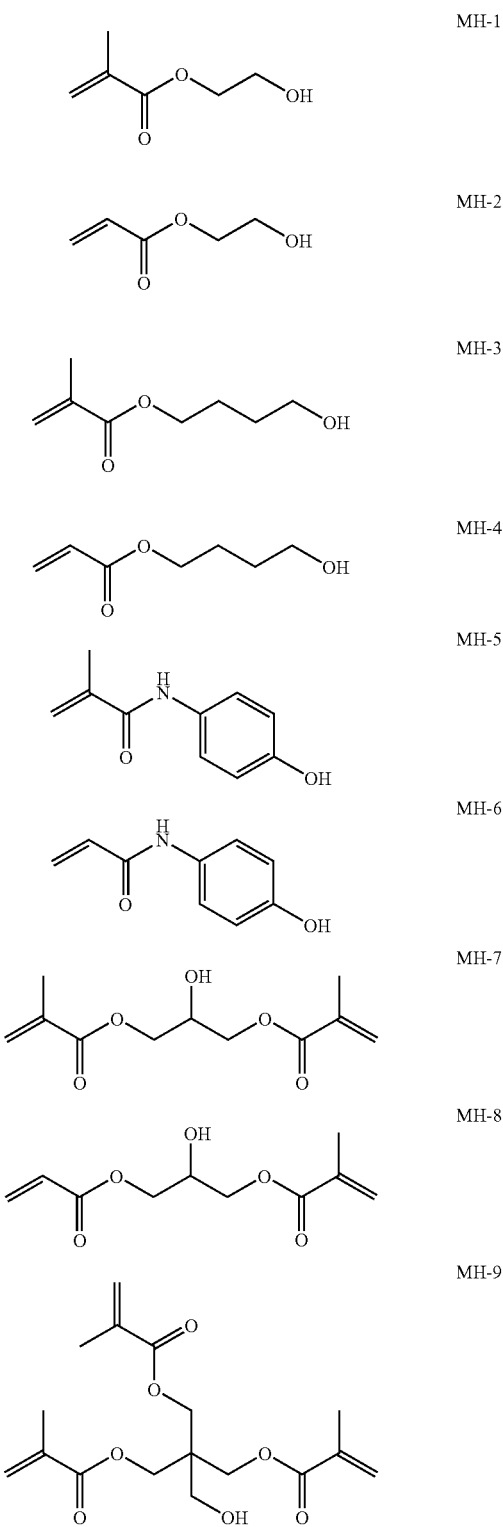

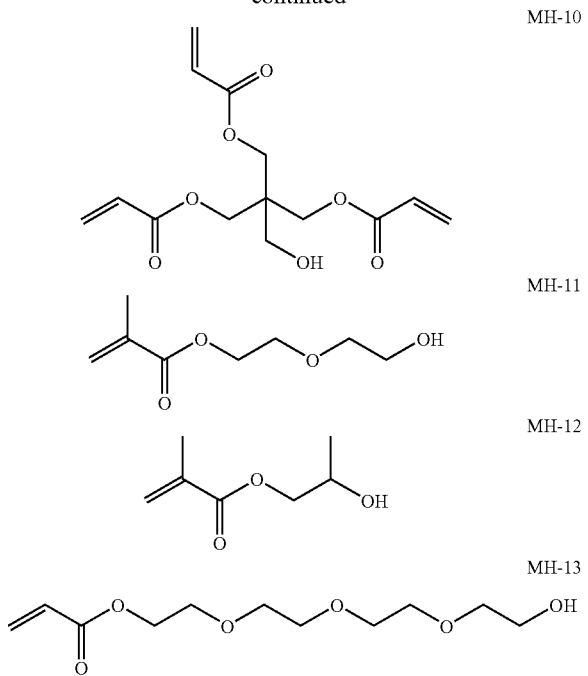

Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

The reaction product above can be synthesized according to the same method as a conventional method in which a urethaneacrylate compound is ordinarily synthesized employing an ordinary diol, a diisocyanate and an acrylate having a hydroxyl group.

Examples of the reaction product of a polyhydric alcohol having a tertiary amino group in the molecule, a diisocyanate and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

In addition to the above, acrylates or methacrylates disclosed in Japanese Patent O.P.I. Publication Nos. 1-105238 and 2-127404 can be used.

In the invention, the addition polymerizable ethylenically unsaturated monomer is preferably an addition polymerizable ethylenically unsaturated compound having a tertiary amino group in the molecule, which is represented by formula (A).

(Compound Represented by Formula (A))

In the invention, the compound represented by formula (A) has a photopolymerizable compound. The compound will be detailed below.

In formula (A), examples of the alkyl group represented by $R^4$ include a methyl group, an ethyl group, a propyl group, a butyl group, a pentyl group, an iso-pentyl group, a 2-ethylhexyl group, an octyl group, a decyl group, an n-dodecyl group, an n-tetradecyl group, an n-pentradecyl group, an n-hexadecyl group, an n-heptadecyl group, an n-octadecyl group, and an n-docosadecyl group.

In formula (A), examples of the hydroxyalkyl group represented by $R^4$ include a hydroxymethyl group, a hydroxyethyl group, a hydroxypropyl group, and a hydroxypentyl group.

In formula (A), examples of the aryl group represented by $R^4$ include a phenyl group, and a naphthyl group.

In formula (A), examples of the alkyl group represented by $R^1$ or $R^2$ are the same as those denoted in $R^4$ above.

In formula (A), examples of the alkoxy group represented by $R^1$ or $R^2$ include a methoxymethyl group, a methoxyethyl group, an ethoxymethyl group, and a propoxyethyl group.

In formula (A), the divalent linkage having a carbon atom number of from 2 to 12 represented by $X^1$ is a saturated hydrocarbon group or an aromatic group.

In formula (A), examples of the divalent saturated hydrocarbon group having a carbon atom number of from 2 to 12 represented by $X^1$ include an ethylene group, a trimethylene group, a tetramethylene group, a propylene group, an ethylethylene group, a pentamethylene group, a hexamethylene group, a heptamethylene group, an octamethylene group, a nonamethylene group, a decamethylene group, an undecamethylene group, a dodecamethylene group, a cyclohexylene group (e.g., a 1,6-cyclohexanediyl group), and a cyclopentylene group (e.g., a 1,5-cyclopentanediyl group).

In formula (A), examples of the arylene group having a carbon atom number of from 6 to 12 represented by $X^1$ include a phenylene group, and a naphthylene group. The phenylene group is especially preferred.

In formula (A), examples of the divalent group represented by $x^2$ include the same as those denoted in the divalent linkage having a carbon atom number of from 2 to 12 represented by $X^1$. Examples of the divalent group represented by $X^2$ further include those in which up to five methylene groups of the divalent saturated hydrocarbon group above are replaced by oxygen atoms.

In formula (A), examples of the trivalent group represented by $X^2$ include an ethanetriyl group, a propanetriyl group, a butanetriyl group, a pentanetriyl group, a hexanetriyl group, a heptanetriyl group, a octanetriyl group, a nonanetriyl group, a decanetriyl group, an undecanetriyl group, a dodecanetriyl group, a cyclohexanetriyl group, a cyclopentanetriyl group, a benzenetriyl group and a naphthalenetriyl group.

In formula (A), examples of the tetravalent group represented by $X^2$ include a propanediylidene group, a 1,3-propanediyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group and a naphthalenetetrayl group.

In formula (A), examples of the alkyl group represented by Z include a methyl group, an ethyl group, a propyl group, a butyl group, a pentyl group, an isopentyl group, a 2-ethylhexyl group, an octyl group and a decyl group.

In $X^2$ of formula (A), examples of the alkenyl group represented by Z include a 2-propenyl group, a butenyl group, a 1-methyl-3-propenyl group, a 3-pentenyl group, a 1-methyl-3-butenyl group, and a 4-hexenyl group.

In $X^2$ of formula (A), examples of the aryl group represented by Z include a phenyl group, a m-chlorophenyl group, a tolyl group, and a naphthyl group.

In $X^2$ of formula (A), examples of the halogen atom represented by Z include a fluorine atom, a chlorine atom, a bromine atom and an iodine atom.

In $X^2$ of formula (A), examples of the alkoxy group represented by Z include a methoxy group, an ethoxy group, a propoxy group, and a butoxy group.

In $X^2$ of formula (A), examples of the heterocyclic group represented by Z include a pyridyl group, a pyrrolyl group, a 2-methylpyrrolyl group, an indolyl group, an imidazolyl group, a furyl group, a thiazolyl group, and a pyrimidinyl group.

In formula (A), examples of the divalent group having a carbon atom number of from 1 to 5 represented by $D^1$ or $D^2$ include a methylene group, a trimethylene group, a tetramethylene group, a propylene group, an ethylethylene group, a pentamethylene group, and a cyclopentylene group.

In formula (A), the divalent group having a carbon atom number of from 2 to 12 represented by E are the same as those denoted above in the divalent group having a carbon atom number of from 2 to 12 represented by $X^1$.

In formula (A), the aliphatic groups above include those having as a substituent a 5- to 7-member heterocyclic group. Examples of the 5- to 7-membered heterocyclic include a pyridyl group, a furyl group, a pyrrolyl group, a pyrazolyl group, an imidazolyl group, an oxazolyl group, a thiazolyl group, a pyrimidinyl group, a pyridazinyl group, a pyrranyl group, a thienyl group, an isoxazolyl group, a pyrrolinyl group, an imidazolinyl group, an imidazolidinyl group, a pyrazolidinyl group, a pyrazolinyl group, a piperidinyl group, a piperazinyl group, a morpholyl group, and a quinuclidinyl group.

The aliphatic groups include a divalent group with a carbon atom number of from 2 to 12 having the heterocyclic group described above, and the divalent group is the same as the divalent group with a carbon atom number of from 2 to 12 represented by $X^1$.

In formula (A), examples of the arylene group having a carbon atom number of from 2 to 12 represented by E include a phenylene group and a naphthylene group.

In formula (A), examples of the aromatic heterocyclic ring constituting a 5- or 6-membered aromatic heterocyclic group represented by E include those having as a substituent a 5- to 7-member heterocyclic group include a furan ring, a pyrrole ring, a pyrazole ring, an imidazole ring, an oxazole ring, a thiazole ring, 1,2,3-triazole ring, 1,2,4-triazoe ring, a 1,3,4-thiadiazole ring, a pyridine ring, a pyridazine ring, a pyrimidine ring, a pyrazine ring, an s-triazine ring, a benzofurane ring, a benzothiophene ring, a benzimidazole ring, a benzothiazole ring, a purine ring, a quinoline ring and an isoquinoline ring.

Each of the substituents denoted in formula (A) above may further have a substituent.

The content of the compound represented by formula (A) above in the photopolymerizable layer is preferably from 30 to 70% by weight, and more preferably from 40 to 60% by weight. The compound represented by formula (A) above can be synthesized by a known method, for example a method described in Japanese Patent No. 2509288 and Japanese Patent O.P.I. Publication No. 60-158439.

Exemplified compounds of the compound represented by formula (A) will be listed below, but the present invention is not limited thereto.

$$R^4{}_{(m-n)}Q^1[CH_2\overset{R^1}{\underset{R^2}{C}}O]_a-CONH(X^1-NHCOO)_b-X^2(OOC\overset{R^3}{C}=CH_2)_c]_n$$

| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
| 1-1 | " | —N⟨ | 3 | 1 | H | H | 0 | — | $C_2H_4$ | 1 | $CH_3$ | 3 |
| 1-2 | " | —N⟨ | 3 | 1 | $CH_3$ | H | 0 | — | $C_2H_4$ | 1 | $CH_3$ | 3 |
| 1-3 | $C_2H_4OH$ | —N⟨ | 3 | 1 | H | H | 0 | — | $C_2H_4$ | 1 | $CH_3$ | 2 |
| 1-4 | " | —N⟨ | 3 | 1 | H | H | 1 | *1 | $C_2H_4$ | 1 | $CH_3$ | 3 |
| 1-5 | " | ⟩NCH$_2$CH$_2$N⟨ | 4 | 1 | H | H | 0 | — | $C_2H_4$ | 1 | $CH_3$ | 4 |
| 1-6 | " | ⟩NCH$_2$CH$_2$N⟨ | 4 | 1 | $CH_3$ | H | 0 | — | $C_2H_4$ | 1 | $CH_3$ | 4 |

-continued
$$R^4_{(m-n)}Q^1[CH_2CO)_a\underset{R^2}{\overset{R^1}{|}}-CONH(X^1-NHCOO)_b-X^2(OOC\overset{R^3}{\underset{}{C}}=CH_2)_c]_n$$
| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
| 1-7 | " | —N< | 3 | 1 | H | H | 0 | — | $C_3H_6$ | 1 | $CH_3$ | 3 |
| 1-8 | " | >NCH$_2$CH$_2$N< | 4 | 1 | H | H | 0 | — | $C_3H_6$ | 1 | $CH_3$ | 4 |
| 1-9 | " | —N< | 3 | 1 | H | H | 0 | — | $C_2H_4$ | 1 | H | 3 |
| 1-10 | " | >NCH$_2$CH$_2$N< | 4 | 1 | H | H | 0 | — | $C_2H_4$ | 1 | H | 4 |
| 1-11 | " | —S— | 2 | 1 | H | H | 0 | — | $C_2H_4$ | 1 | $CH_3$ | 2 |
*1: 2,2,4-trimethylhexamethylene
10-1
10-2
10-3
10-4
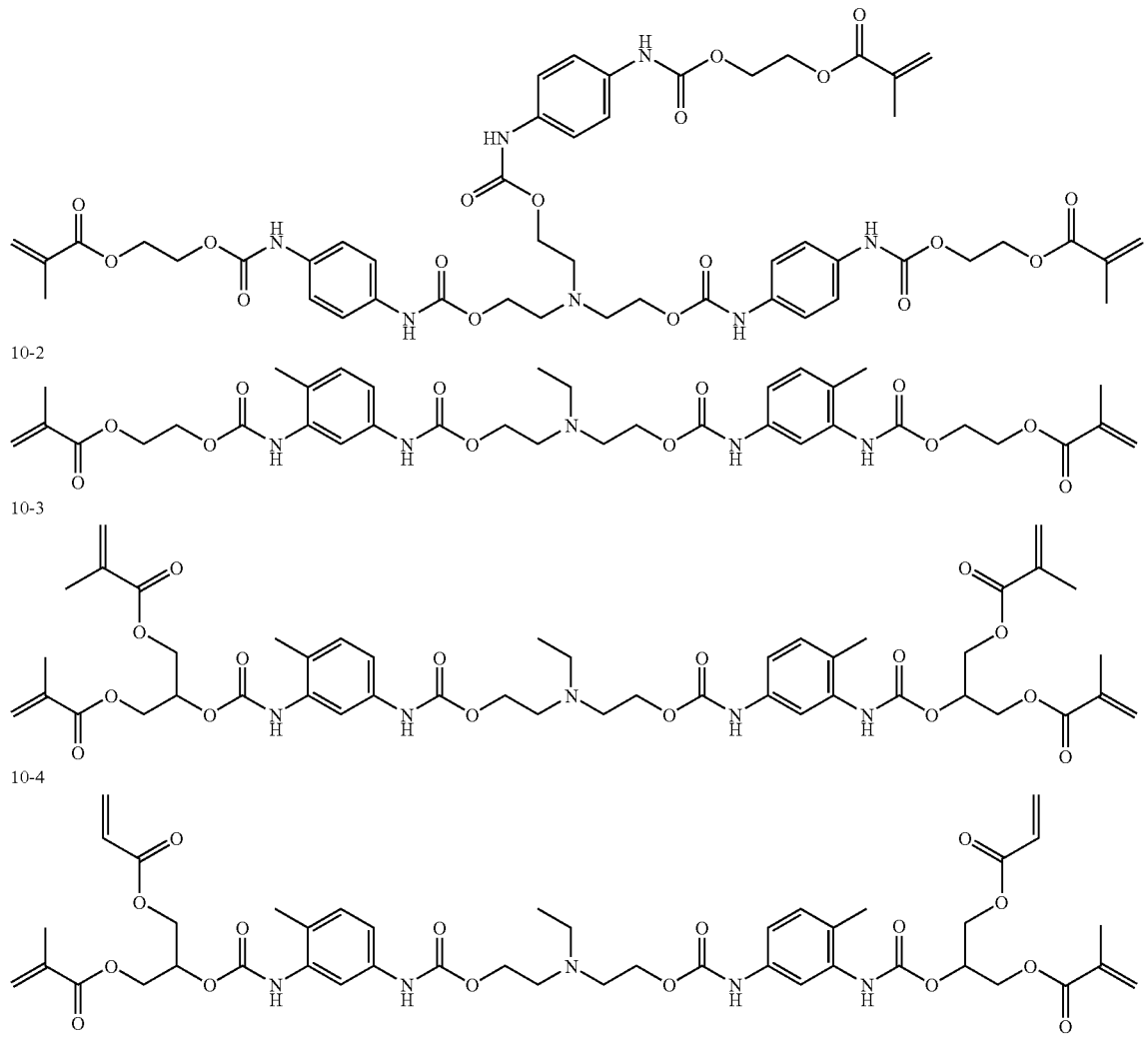

-continued
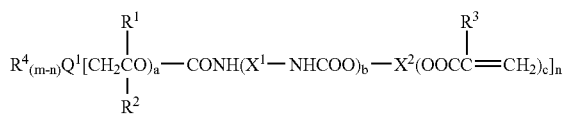
| Compound No. | R⁴ | Q¹ | m | a | R¹ | R² | b | X¹ | X² | c | R³ | n |
|---|---|---|---|---|---|---|---|---|---|---|---|---|
10-5
10-6
10-7
10-8
10-9

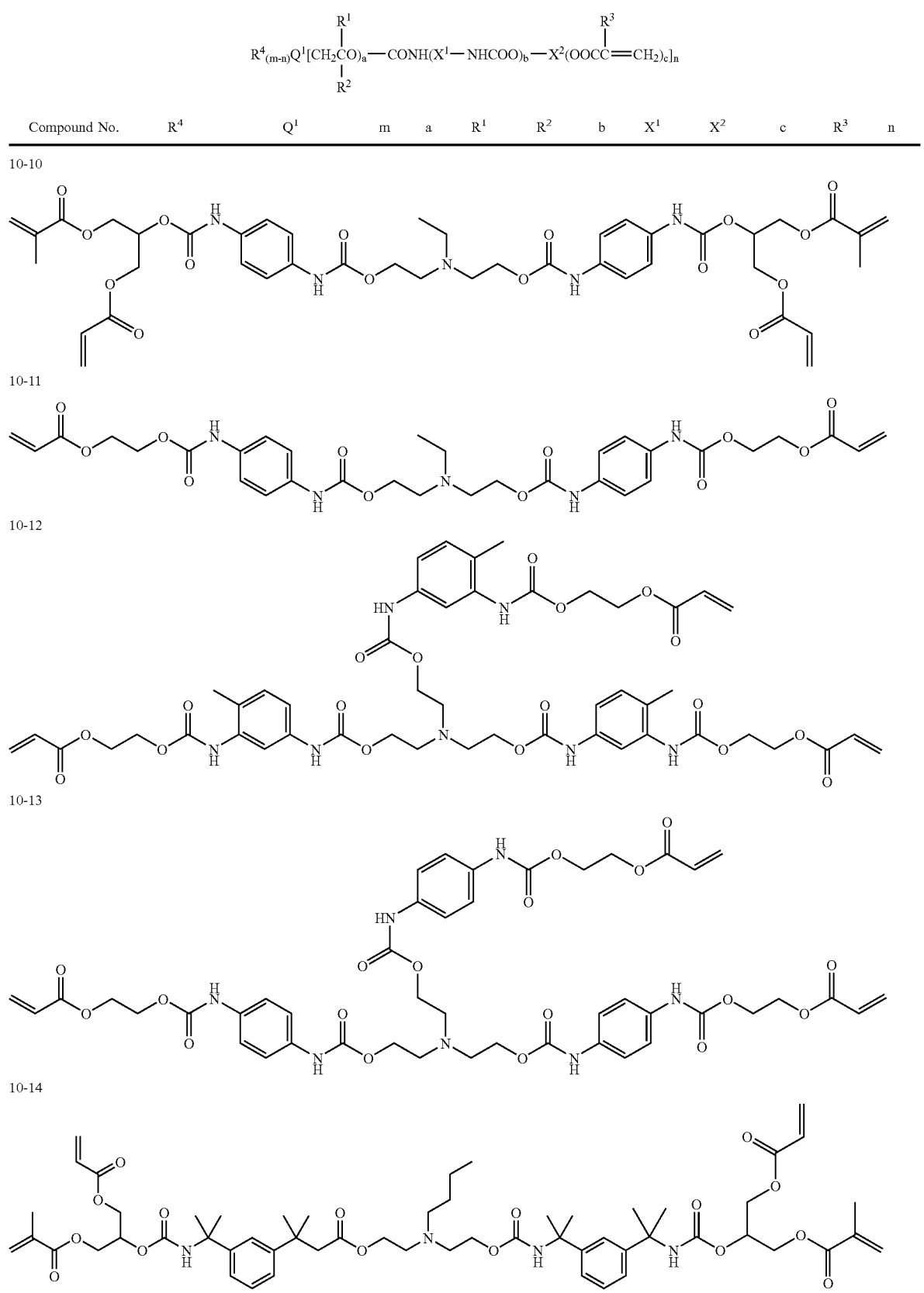

-continued
$$R^4{}_{(m-n)}Q^1[\underset{R^2}{\underset{|}{\overset{R^1}{\overset{|}{CH_2CO}}}})_a\text{—CONH}(X^1\text{—NHCOO})_b\text{—}X^2(\text{OOC}\overset{R^3}{\overset{|}{C}}=CH_2)_c]_n$$
| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
10-15
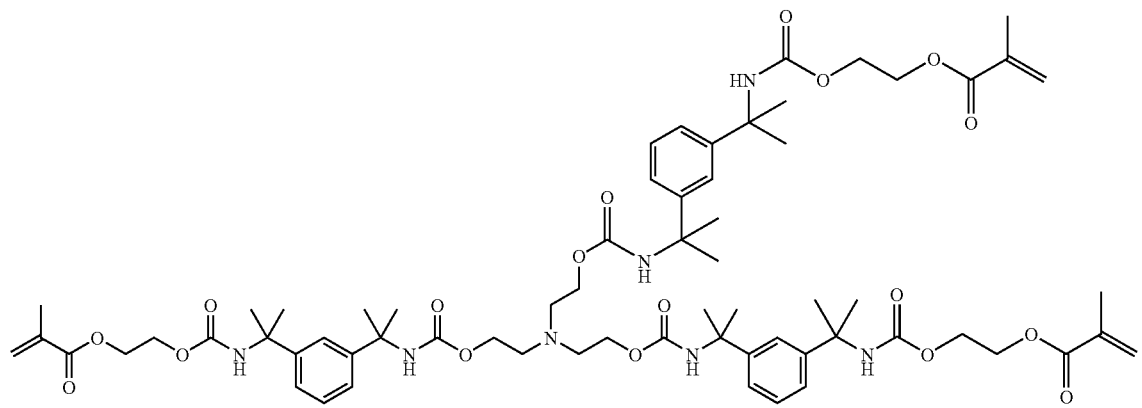
10-16
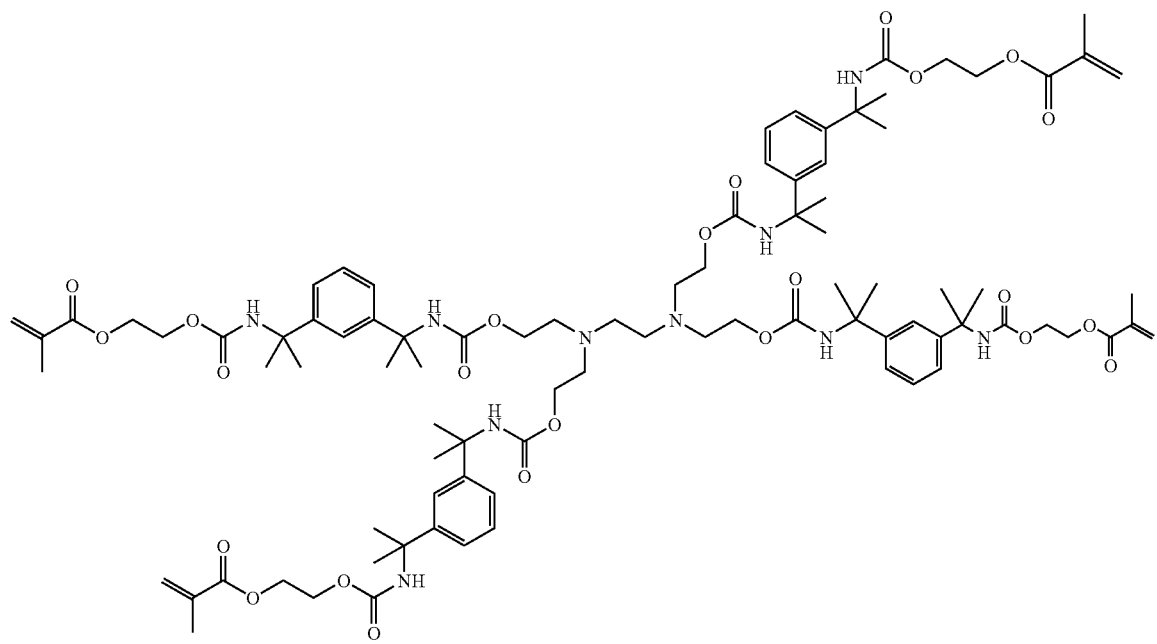

-continued $$R^4{}_{(m-n)}Q^1[CH_2\underset{R^2}{\overset{R^1}{C}}O]_a-CONH(X^1-NHCOO)_b-X^2(OOC\underset{}{\overset{R^3}{C}}=CH_2)_c]_n$$

| Compound No. | $R^4$ | $Q^1$ | m | a | $R^1$ | $R^2$ | b | $X^1$ | $X^2$ | c | $R^3$ | n |
|---|---|---|---|---|---|---|---|---|---|---|---|---|
| 10-17 | | | | | | | | | | | | |

30

<<Photopolymerization Initiator>>

Next, the photopolymerization initiator in the invention will be explained. The iron-arene complex will be explained which is essential to attain the effect of the invention. As described above, the iron-arene complex as a polymerization initiator can simultaneously carry out both radical polymerization and cationic polymerization, and use of the iron-arene complex can greatly increase printing durability.

Examples of the iron-arene complex include those disclosed in Japanese Patent O.P.I. Publication No. 59-219307. Typical examples thereof include a compound represented by the following formula (B).

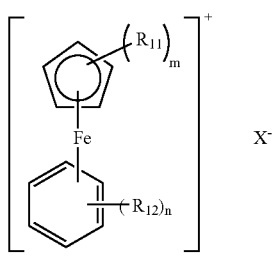

Formula (B)

wherein $R_{11}$ and $R_{12}$ may be the same or different, and independently represent an alkyl group having a carbon atom number of from 1 to 12, an alkinyl group having a carbon atom number of from 2 to 12, an alkoxy group having a carbon atom number of from 1 to 8, a cyano group, an alkylthio group, a phenoxy group, a monocarboxyl or ester group having a carbon atom number of from 2 to 6, an alkanoyl group having a carbon atom number of from 2 to 5, an ammonium group, a pyridinium group, a nitro group, an alkylsulfinyl group, an alkylsulfonyl group, a sulfamoyl group or a halogen atom, provided that $R_{12}$ may form a condensed ring with the benzene ring; X represents $BF_4$, $PF_6$, $AsF_6$, $FeCl_4$, $SnCl_6$, $SbCl_6$, or $BiCl_6$; m is an integer of from 1 to 4; and n is an integer of from 1 to 5.

Examples of the iron-arene compound represented by formula (B) include (η6-benzene)(η5-cyclopentadienyl)iron (2) hexafluorophosphate, (η6-toluene)(η5-cyclopentadienyl)iron (2) hexafluorophosphate, (η6-cumene)(η5-cyclopentadienyl)iron (2) hexafluorophosphate, (η6-benzene)(η5-cyclopentadienyl)iron (2) hexafluoroarsenate, (η6-benzene) (η5-cyclopentadienyl)iron (2) tetrafluoroborate, (η6-naphthalene) (η5-cyclopentadienyl)iron (2) hexafluorophosphate, (η6-anthracene)(η5-cyclopentadienyl)iron (2) hexafluorophosphate, (η6-pyrene)(η5-cyclopentadienyl) iron (2) hexafluorophosphate, (η6-benzene)(η5-cyanocyclopentadienyl)iron (2) hexafluorophosphate, (η6-toluene)(η5-acetylcyclopentadienyl)iron (2) hexafluorophosphate, (η6-cumene)(η5-cyclopentadienyl)iron (2) tetrafluoroborate, (η6-benzene)(η5-carboethoxycyclohexadienyl)iron (2) hexafluorophosphate, (η6-benzene) (η5-1,3-dichlorocyclohexadienyl)iron (2) hexafluorophosphate, (η6-acetophenone)(η5-cyclohexadienyl)iron (2) hexafluorophosphate, (η6-methyl benzoate)(η5-cyclopentadienyl)iron (2) hexafluorophosphate, (η6-benzene sulfonamide)(η5-cyclopentadienyl)iron (2) tetrafluoroborate, (η6-benzamide)(η5-cyclopentadienyl)iron (2) hexafluorophosphate, (η6-cyanobenzene)(η5-cyanocyclopentadienyl)iron (2) hexafluorophosphate, (η6-chloronaphthalene)(η5-cyclopentadienyl)iron (2) hexafluorophosphate, (η6-anthracene)(η5-cyanocyclopentadienyl)iron (2) hexafluorophosphate, (η6-chlorobenzene) (η5-cyclopentadienyl)iron (2) hexafluorophosphate, and (η6-chlorobenzene)(η5-cyclopentadienyl)iron (2) tetrafluoroborate. These compounds can be synthesized according to a method described in Dokl. Akd. Nauk. SSSR 149 615 (1963).

The content of the iron-arene compound is preferably 0.1 to 15% by weight, more preferably 1 to 15% by weight, and most preferably 1.5 to 10% by weight, based on the total nonvolatile components contained in the photopolymerizable light sensitive layer.

The photopolymerizable light sensitive layer in the invention preferably contains a polyhaloacetyl compound as a photopolymerization initiator. As the polyhaloacetyl compound, polyhaloacetylamide compound is preferably used. For example, a polyhaloacetyl compound represented by formula (1) and preferably a polyhaloacetyl compound (polyhaloacetylamide compound) represented by formula (2) are listed.

$$R^1-CX_2-(C=O)-R^2 \quad \text{Formula (1)}$$

wherein X represents a chlorine atom or a bromine atom; $R^1$ represents a hydrogen atom, a chlorine atom, a bromine atom, an alkyl group, an aryl group, an acyl group, an alkylsulfonyl group, an arylsulfonyl group or a cyano group; and $R^2$ represents a monovalent substituent, provided that $R^1$ and $R^2$ may combine with each other to form a ring, $$CX_3-(C=O)-Y-R^3 \quad \text{Formula (2)}$$

wherein X repesents a chlorine atom or a bromine atom; $R^3$ represents a monovalent substituent; and Y represents —O— or —$NR^4$—, in which $R^4$ represents a hydrogen atom or an alkyl group, provided that $R^3$ and $R^4$ may combine with each other to form a ring.

Typical examples of the compound represented by formula (1) will be below (BR 1 through BR 79), but are not limited thereto.

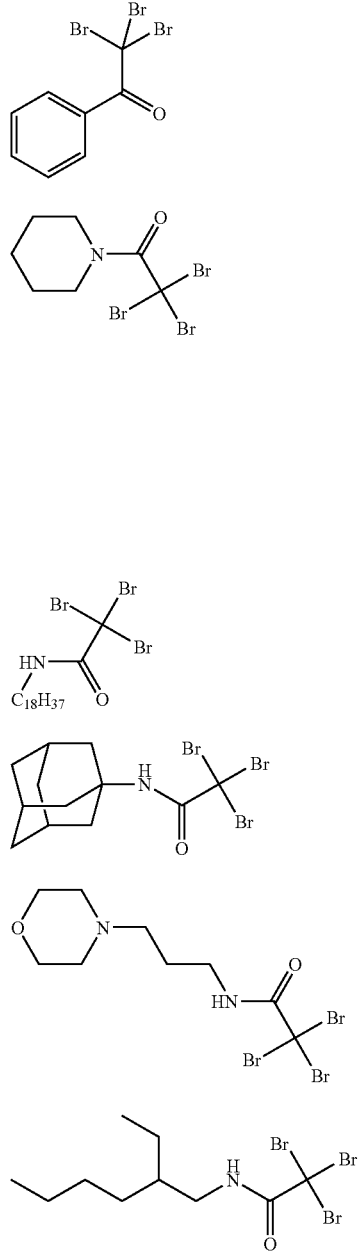

-continued
BR13 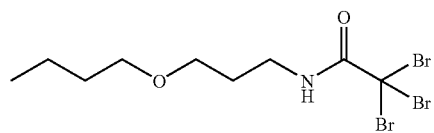 BR14 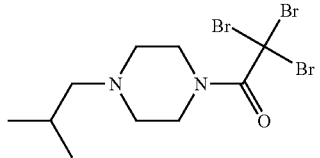
BR15 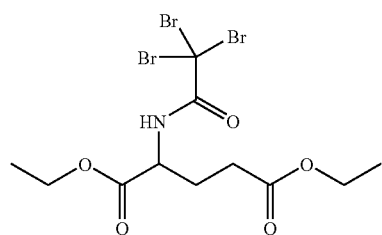 BR16 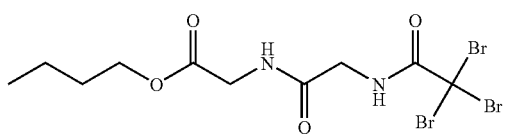
BR17 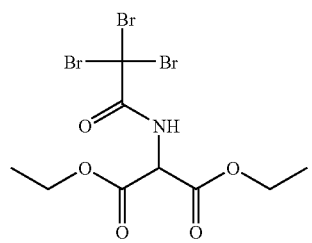 BR18 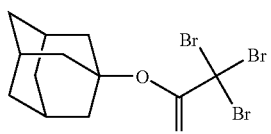
BR19 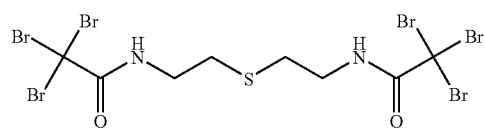 BR20 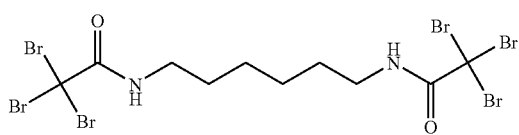
BR21 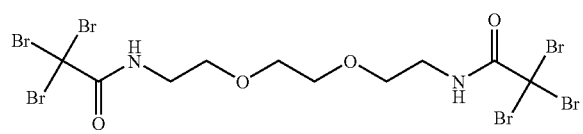 BR22 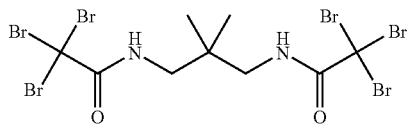
BR23 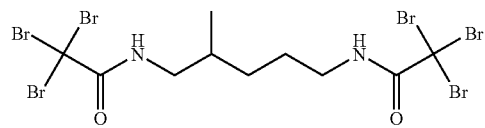 BR24 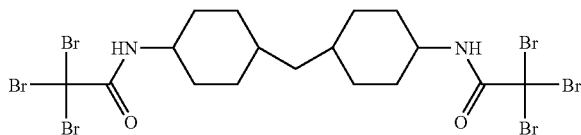
BR25 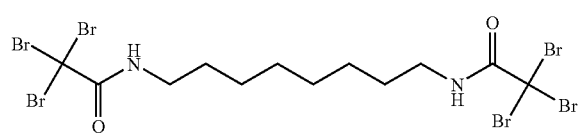 BR26 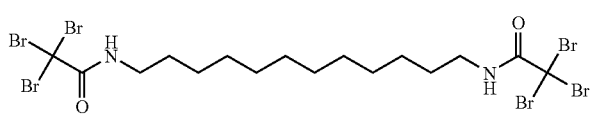
BR27 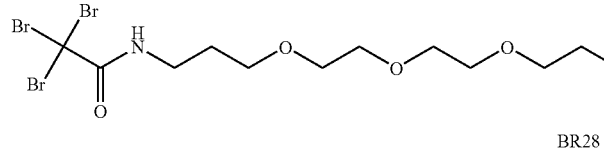
BR28 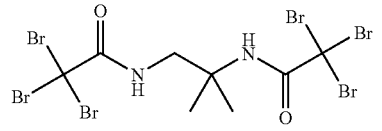 BR29 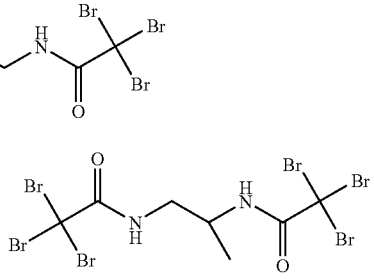

-continued
BR30 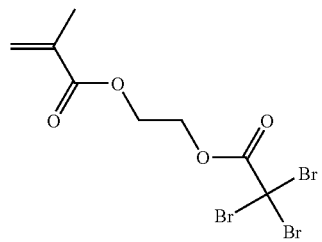 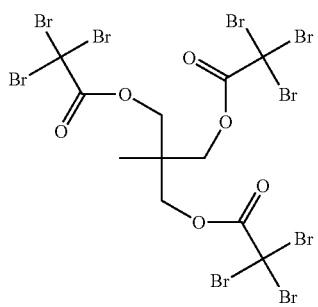 BR31
BR32 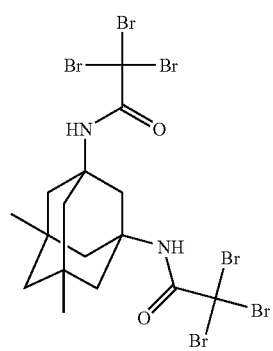 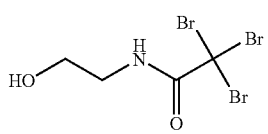 BR33
BR34 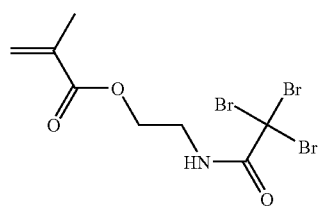 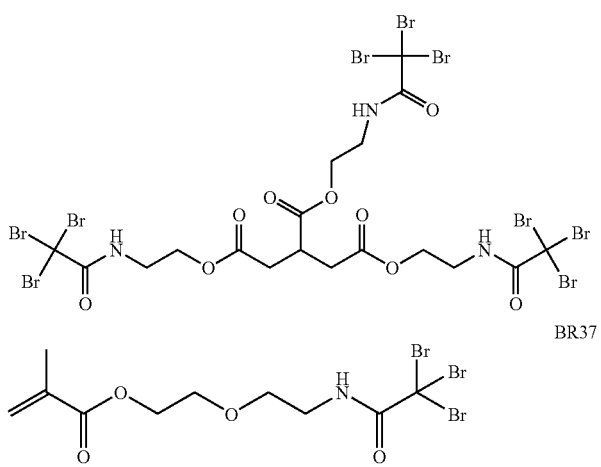 BR35
BR36 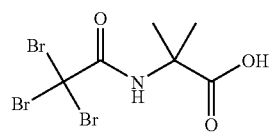 BR37
BR38 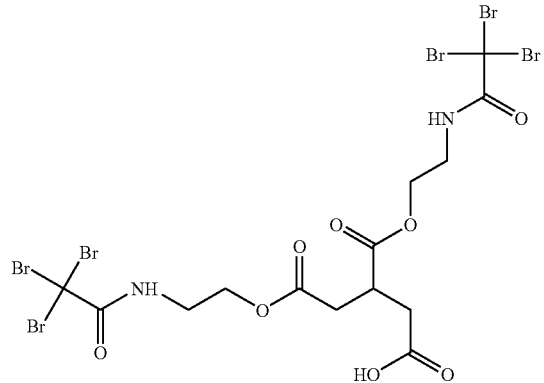 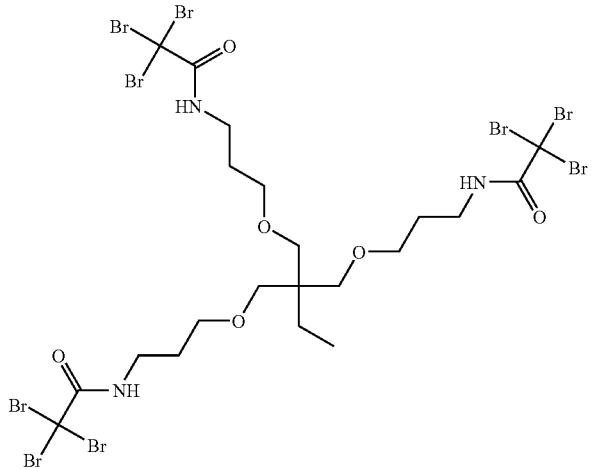 BR39

-continued
BR40
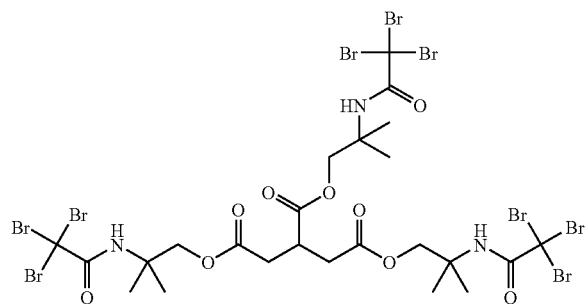
BR41
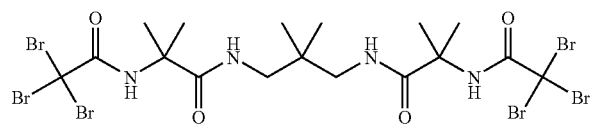
BR42
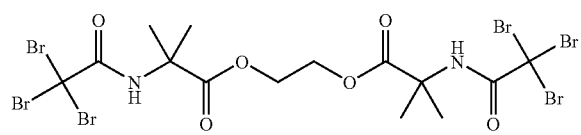
BR43
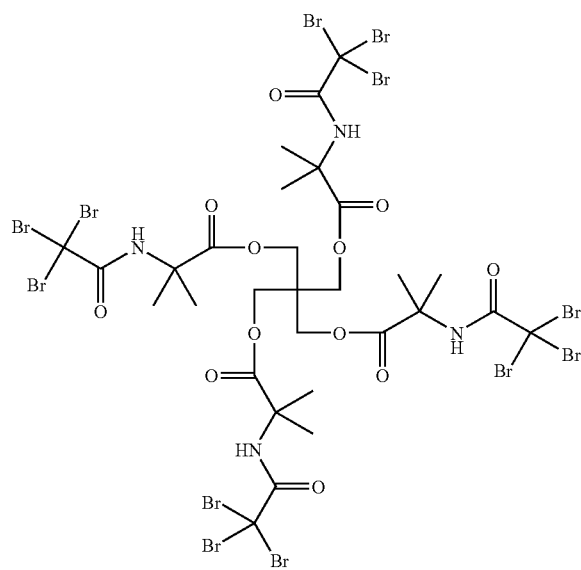
BR44
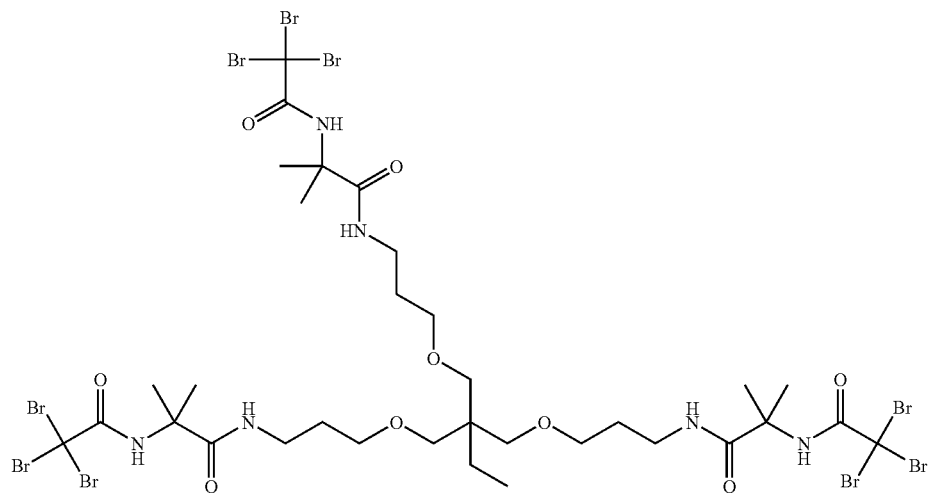

-continued
BR45 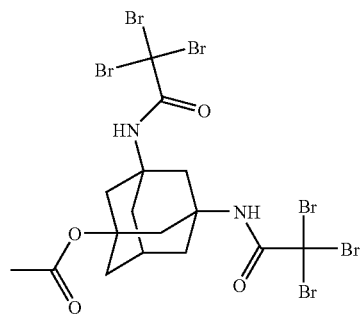 BR46 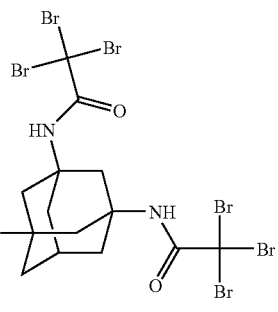
BR47 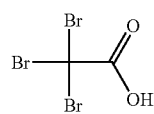 BR48 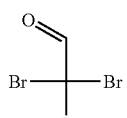
BR49 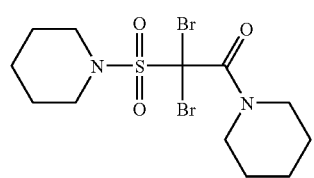 BR50 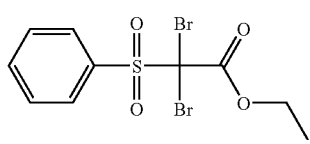
BR51 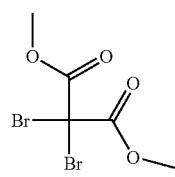 BR52 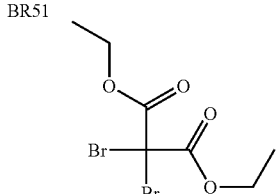
BR53 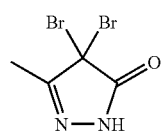 BR54 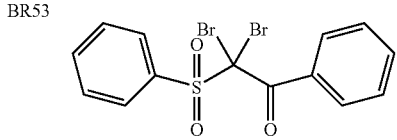
BR55 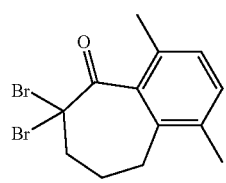 BR56 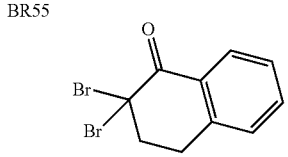
BR57 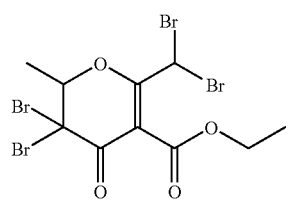 BR58 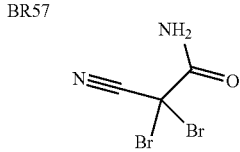
BR59 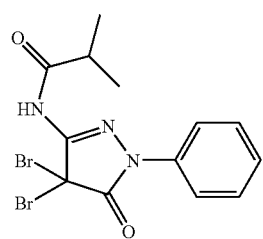 BR60 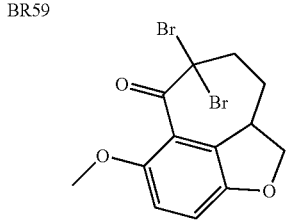

-continued
BR61 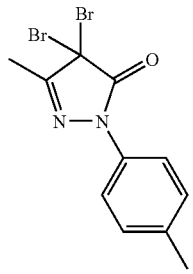
BR62 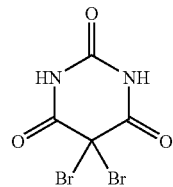
BR63 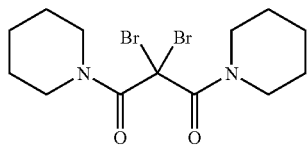
BR64 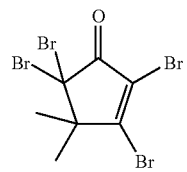
BR65 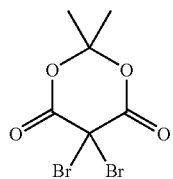
BR66 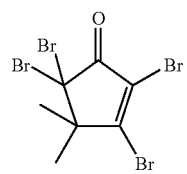
BR67 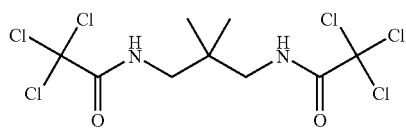
BR68 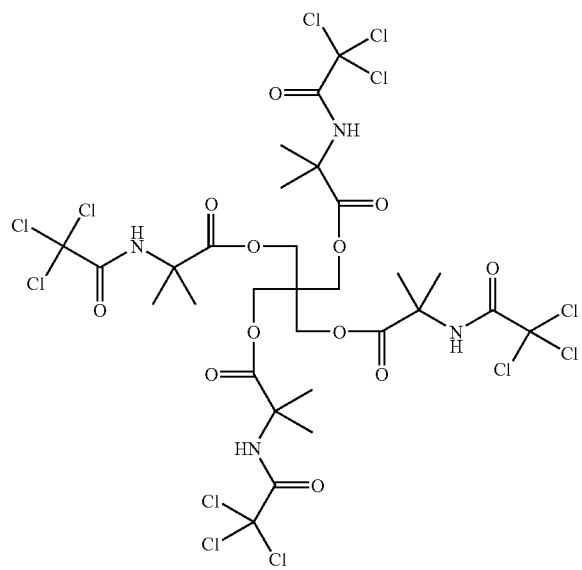
BR69 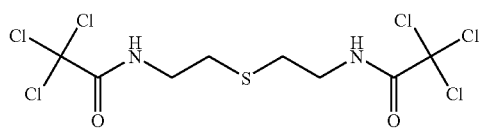
BR70 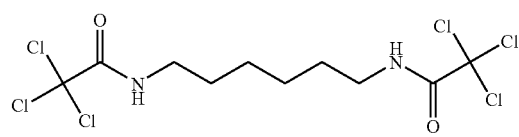
BR71 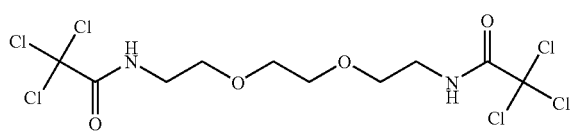
BR72 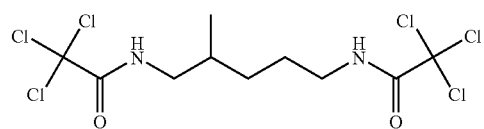

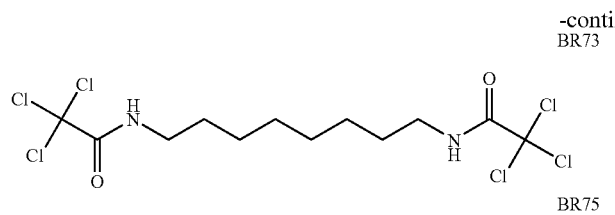 BR73

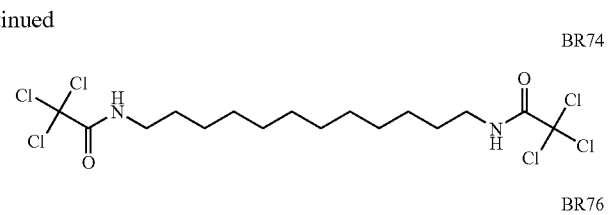 BR74

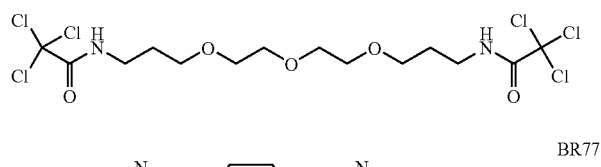 BR75

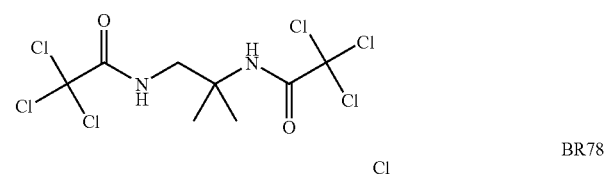 BR76

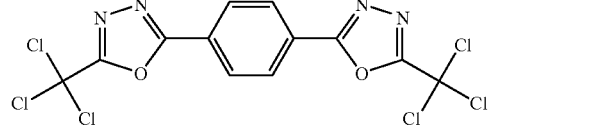 BR77

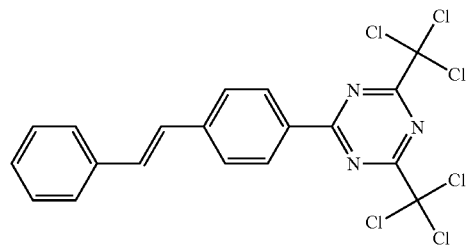 BR78

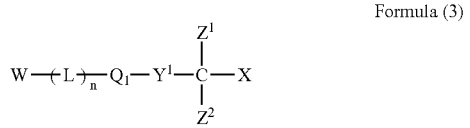 BR79

As the polyhaloacetyl compound, the compound represented by formula (2) is preferably used. Preferred examples of the, compound represented by formula (2) are BR2 through BR47, and BR67 through BR79 above.

Among the compound represented by formula (1) and the compound represented by formula (2) above (polychlorinated compound and polybrominated compound), the polybrominated compound is preferred.

In the invention, a compound represented by formula (3) can be used.

Formula (3)

$$W-(L)_n-Q_1-Y^1-\underset{Z^2}{\overset{Z^1}{\underset{|}{\overset{|}{C}}}}-X$$

wherein $Z^1$ and $Z^2$ independently are a halogen atom; X is a hydrogen atom or an electron-withdrawing group; $Y^1$ is —CO— or —SO$_2$—; $Q_1$ is an arylene group or a divalent heterocyclic group; L is a linkage group; W is a carboxyl group or its salt, a sulfo group or its salt, a phosphoric acid group or its salt, a hydroxyl group, a quaternary ammonium group or a polyethyleneoxy group; and n is 0 or 1.

In formula (3), $Z^1$ and $Z^2$ are each a halogen atom (e.g., fluorine, chlorine, bromine, iodine), and both $Z^1$ and $Z^2$ are preferably bromine atoms; and X is a hydrogen atom or an electron-withdrawing group. X is preferably a hydrogen atom or halogen atom, and more preferably a bromine atom; $Y^1$ is —CO— or —SO$_2$—, and preferably —SO$_2$—.

In formula (3), $Q_1$ is an arylene group or a divalent heterocyclic group. The arylene group is preferably a monocyclic or condensed arylene group having 6 to 30 carbon atoms, and more preferably 6 to 20 carbon atoms, including, for example, phenylene and naphthylene, and $Q_1$ is preferably a phenylene group. The arylene group represented by $Q_1$ may be substituted. Any substituent having no adverse effect on photographic performance is acceptable. Examples of the substituent include a halogen atom (e.g., fluorine atom, chlorine atom, bromine atom, iodine atom), an alkyl group (including an aralkyl group, a cycloalkyl group and an active methylene group), an alkenyl group, an alkynyl group, an aryl group, a heterocyclic group (including an N-substituted nitrogen-containing heterocyclic group), a quaternary nitrogen-containing heterocyclic group (e.g., pyridinio group), an acyl group, an alkoxycarbonyl group, an aryloxycarbonyl group, a carbamoyl group, a carboxyl group and its salt, an imino group, an N-substituted imino group, a thiocarbonyl group, a carbazoyl group, a cyano group, a thiocarbamoyl group, an alkoxy group (including a group having an ethyleneoxy group or propyleneoxy group as a repeating unit), an aryloxy group, a heterocyclic group, acyloxy group (such as alkoxy and aryloxy), a carbamoyloxy group, a sulfonyloxy group, an acylamino group, a sulfonamido group, a ureido group, a thioureido group, an imido group, an alkoxycarbonylamino or aryloxycarbonylamino group, a sulfamoylamino group, a semicarbazido group, a thiosemicarbazido group, a hydrazino group, a quaternary ammonio group, an alkylsaulfonylureido or arylsulfonylureido group, a nitro group, an alkylthio, arylthio or heterocyclicthio group, an acylthio group, an alkylsulfonyl or arylsulfonyl group, an alkylsulfinyl or arylsulfinyl group, a sulfonyl group or its salt, a sulfamoyl group, a phosphoryl group, a phosphoric acid amide group or a group having a phosphoric acid ester structure, and a silyl group. The above substituent groups may be further substituted by the substituent described above. The substituent for the aryl group represented by $Q_1$ is preferably an alkyl group, an alkoxy group, an aryloxy group, a halogen atom, a cyano group, a carboxyl group and its salt, a sulfo group and its salt, or a phosphoric acid group.

In formula (3), the heterocyclic group represented by $Q_1$ is a 5- to 7-membered unsaturated heterocyclic group having at least one of N, O and S atoms, which may be a monocycle or a condensed ring. Examples of the heterocyclic group represented by $Q_1$ include a pyridyl group, a pyrazyl group, a pyrimidyl group, a benzthiazole group, a benzimidazole group, a thiadiazole group, a quinolyl group, and an isoquinolyl group. The foregoing groups may be substituted and examples of substituents are the same as denoted in the arylene group represented by $Q_1$. In the formula (3), $Q_1$ is preferably an arylene group, and more preferably a phenylene group.

In formula (3), L is a linkage group. Examples of such a linkage group include an alkylene group (preferably having 1 to 30 carbon atom, more preferably 1 to 20 carbon atoms, and still more preferably 1 to 10 carbon atoms), an arylene group (preferably having 6 to 30 carbon atom, more preferably 66 to 20 carbon atoms, and still more preferably 6 to 10 carbon atoms), an alkenylene group (preferably having 2 to 30 carbon atom, more preferably 2 to 20 carbon atoms, and still more preferably 2 to 10 carbon atoms), an alkinylene group (preferably having 2 to 30 carbon atom, more preferably 2 to 20 carbon atoms, and still more preferably 2 to 10 carbon atoms), a heterocyclic group (preferably having 1 to 30 carbon atom, more preferably 1 to 20 carbon atoms, and still more preferably 1 to 10 carbon atoms), —O—, —NR—, —CO—, —COO—, —OCOO—, —NRCO—, —NRCONR—, —OCONR—, —S—, —SO—, —SO$_2$—, —SO$_2$NR—, a P-containing group, and a group formed by the combination of the foregoing groups (in which R is a hydrogen atom, an alkyl or an aryl group, which may be substituted). The linkage group represented by L may be substituted and examples of the substituent are the same as denoted in the arylene group represented by $Q^1$. L is preferably an alkylene group, —O—, —NRCO—, —SO$_2$NR—, or a group formed by the combination of the foregoing groups.

In formula (3), W is a carboxyl group or its salt (e.g., Na, K or ammonium salt), sulfo group or its salt (e.g., Na, K or ammonium salt), a phosphoric acid group or its salt (e.g., Na, K or ammonium salt), a hydroxyl group, quaternary ammonium group (e.g., tetrabutylammonium, trimethylbenzylammonium), or a polyethylene oxide group. W is preferably a carboxyl group or its salt, a sulfo group or its salt, or a hydroxyl group.

Typical examples of the compound represented by formula (3) will be listed below, the invention is not limited thereto.

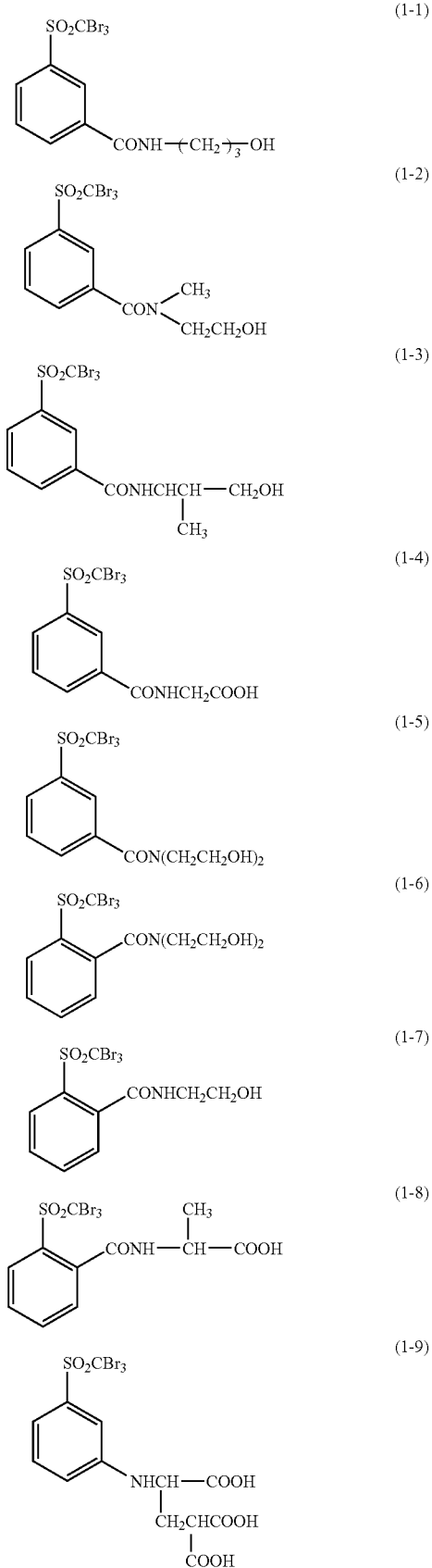

-continued

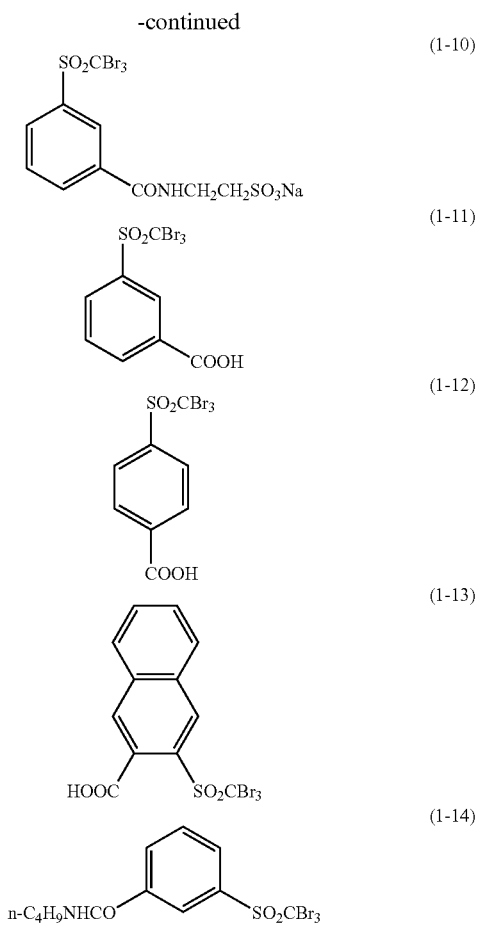

Compounds other than above-described compounds, which fall within the scope of the formula (3) are also described in Japanese Patent O.P.I. Publication No. 2000-284408. The compounds represented by the formula (3) can be synthesized in the conventional organic synthesis reaction, with reference to the foregoing patent document. The content of compound represented by the formula (3) is contained in the photopolymerizable photosensitive layer, preferably at 0.1 to 30%, more preferably 1 to 15%, and still more preferably 1.5 to 10% by weight, based on non-volatile components.

In the invention, a compound represented by the following formula (4) is preferably used.

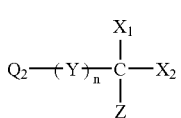

Formula (4)

wherein $Q_2$ is an alkyl group, an aryl group or a heterocyclic group; $X_1$ and $X_2$ are each a halogen atom; Z is a hydrogen atom or an electron-withdrawing group; Y is —C(=O)—, —SO— or —SO$_2$—; and n is 0 or 1.

Formula (4) will be detailed below.

In formula (4), $Q_2$ represents an alkyl group, aryl group or heterocyclic group.

The aryl group represented by $Q_2$ may be monocyclic or condensed, and preferably a monocyclic or condensed aryl group having 6 to 30 carbon atoms (such as phenyl or naphthyl), more preferably a phenyl or naphthyl group, and still more preferably a phenyl group.

The heterocyclic group represented by $Q_2$ is a 3- to 10-membered saturated or unsaturated heterocyclic group containing at least one of N, O and S atoms, which may be monocyclic one or condensed one. The heterocyclic group is preferably a 5- or 6-membered unsaturated heterocyclic group which may be condensed, more preferably a nitrogen containing 5- or 6-membered aromatic heterocyclic group which may be condensed, and still more preferably a 5- or 6-membered nitrogen-containing aromatic heterocyclic group which may be condensed, and most preferably a 5- or 6-membered aromatic heterocyclic group containing one to four nitrogen atoms, which may be condensed. Heterocycles forming the heterocyclic groups include, for example, pyrrolidine, piperidine, piperazine, morpholine, thiophene, furan, pyrrole, imidazole, pyrazole, pyridine, pyrimidine, pyrazine, pyridazine, triazole, triazine, indole, indazole, purine, thiadiazole, oxadiazole, quinoline, phthalazine, naphthyridine, quinoxaline, quinazoline, cinnoline, pteridine, acridine, phenthroline, phenazine, tetrazole, thiazole, oxazole, benzimidazole, benzoxazole, benzthiazole, benzoselenazole, indolenine, and tetrazaindene. Of the heterocycles, imidazole, pyrazole, pyridine, pyrimidine, pyrazine, pyridazine, triazole, triazine, indole, indazole, purine, thiadiazole, oxadiazole, quinoline, phthalazine, naphthyridine, quinoxaline, quinazoline, cinnoline, pteridine, acridine, phenthroline, phenazine, tetrazole, thiazole, oxazole, benzimidazole, benzoxazole, benzthiazole, benzoselenazole, indolenine, and tetrazaindene are preferred; imidazole, pyridine, pyrimidine, pyrazine, pyridazine, triazole, triazine, thiadiazole, quinoline, phthalazine, naphthyridine, quinoxaline, quinazoline, cinnoline, tetrazole, thiazole, benzimidazole, and benzthiazole are more preferred; pyridine, thiadiazole, quinoline and benzthiazole are specifically preferred.

The aryl group or heterocyclic group, represented by $Q_2$ may further have a substituent other than —(Y)n—CZ(X$_1$)(X$_2$). Such substituent groups include,-for example, an alkyl group (preferably having 1 to 20 carbon atom, more preferably 1 to 12 carbon atoms, and still more preferably 1 to 8 carbon atoms (e.g., methyl, ethyl, n-propyl, iso-propyl, n-butyl, iso-butyl, tert-butyl, n-octyl, n-decyl, n-hexadecyl, cyclopropyl, cyclopentyl, cyclohexyl), an alkenyl group preferably having 2 to 20 carbon atoms, more preferably 2 to 12 carbon atoms, and still more preferably 2 to 8 carbon atoms (e.g., vinyl, allyl, 2-butenyl, 3-pentenyl), an alkynyl group (preferably having 2 to 20 carbon atom, more preferably 2 to 12 carbon atoms, and still more preferably 2 to 8 carbon atoms, e.g., propargyl, 3-pentynyl), an amino group (preferably having 0 to 20 carbon atoms, more preferably 0 to 10 carbon atoms, and still more preferably 0 to 6 carbon atoms (e.g., amino, methylamino, dimethylamino, diethylamino, dibenzylamino), an alkoxy group preferably having 1 to 20 carbon atoms, more preferably 1 to 12 carbon atoms, and still more preferably 1 to 8 carbon atoms (e.g., methoxy, ethoxy, butoxy), an aryloxy group preferably having 6 to 20 carbon atoms, more preferably 6 to 16 carbon atoms, and still more preferably 6 to 12 carbon atoms (e.g., phenyloxy, 2-naphthyloxy), an acyl group (preferably having 1 to 20 carbon atoms, more preferably 1 to 16 carbon atoms, and still more preferably 1 to 12 carbon atoms (e.g., acetyl, benzoyl, formyl, pivaloyl), an alkoxycarbonyl group (preferably having 2 to 20 carbon atoms, more preferably 2 to 16 carbon atoms, and still more preferably 2 to 12 carbon atoms (e.g., methoxycarbonyl, ethoxycarbonyl), an aryloxycarbonyl group (preferably having 7 to 20 carbon atoms, more preferably 7 to 16 carbon atoms, and still more preferably 7 to 10 carbon atoms (e.g., phenyloxycarbonyl), an acyloxy group (preferably having 2 to 20 carbon atoms, more preferably 2 to 16 carbon atoms, and still more preferably 2 to 10 carbon atoms (e.g., acetoxy, benzoyloxy), an acylamino group (preferably having 2 to 20 carbon atoms, more preferably 2 to 16 carbon atoms, and still more preferably 2 to 10 carbon atoms (e.g., acetylamino, benzoylamino), an alkoxycarbonylamino group (preferably having 2 to 20 carbon atoms, more preferably 2 to 16 carbon atoms, and still more preferably 2 to 12 carbon atoms (e.g., methoxycarbonylamino), an aryloxycarbonyl group (preferably having 7 to 20 carbon atoms, more preferably 7 to 16 carbon atoms, and still more preferably 7 to 12 carbon atoms (e.g., phenyloxycarbonylamino), a sulfonylamino group (preferably having 1 to 20 carbon atoms, more preferably 1 to 16 carbon atoms, and still more preferably 1 to 12 carbon atoms (e.g., methanesulfonylamino, benzenesulfonylamino), a sulfamoyl group (preferably having 0 to 20 carbon atoms, more preferably 0 to 16 carbon atoms, and still more preferably 0 to 12 carbon atoms (e.g., sulfamoyl, methylsulfamoyl, dimethylsulfamoyl, phenylsulfamoyl), a carbamoyl group (preferably having 1 to 20 carbon atoms, more preferably 1 to 16 carbon atoms, and still more preferably 1 to 12 carbon atoms (e.g., carbamoyl, methylcarbamoyl, dimethylcarbamoyl, phenylcarbamoyl), an alkylthio group (preferably having 1 to 20 carbon atoms, more preferably 1 to 16 carbon atoms, and still more preferably 1 to 12 carbon atoms (e.g., methylthio, ethylthio), an arylthio group (preferably having 6 to 20 carbon atoms, more preferably 6 to 16 carbon atoms, and still more preferably 6 to 12 carbon atoms (e.g., phenylthio), a sulfonyl group (preferably having 1 to 20 carbon atoms, more preferably 1 to 16 carbon atoms, and still more preferably 1 to 12 carbon atoms (e.g., mesyl, tosyl, phenylsufonyl), a sulfinyl group (preferably having 1 to 20 carbon atoms, more preferably 1 to 16 carbon atoms, and still more preferably 1 to 12 carbon atoms (e.g., methanesulfonyl, benzenesulfonyl), a ureido group (preferably having 1 to 20 carbon atoms, more preferably 1 to 16 carbon atoms, and still more preferably 1 to 12 carbon atoms (e.g., ureido, methylureido, phenylureido), a phosphoric acid amide group (preferably having 1 to 20 carbon atoms, more preferably 1 to 16 carbon atoms, and still more preferably 1 to 12 carbon atoms (e.g., diethylphosphoric acid amide, phenylphosphoric amide), a hydroxy group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, and a heterocyclic group (e.g., imidazolyl, pyridyl, furyl, piperidyl, morpholino). The foregoing substituents may further be substituted. Two or more substituents may be the same or different.

Preferred examples of such a substituent include an alkyl group, an alkenyl group, an aryl group, an alkoxy group, an aryloxy group, an acyloxy group, an acyl group, an alkoxycarbonyl group, an aryloxycarbonyl group, an acylamino group, an alkoxycarbonylamino group, an aryloxycarbonylamino group, a sulfonylamino group, a sulfamoyl group, a carbamoyl group, a sulfonyl group, a ureido group, a phosphoric acid an amide group, a halogen atom, a cyano group, a sulfo group, a carboxyl group, a nitro group, and a heterocyclic group. Of these substituents, an alkyl group, an aryl group, an alkoxy group, an aryloxy group, an acyl group, an acylamino group, an alkoxycarbonylamino group, an aryloxycarbonylamino group, a sulfonylamino group, a sulfamoyl group, a carbamoyl group, a ureido group, a phosphoric acid amide group, a halogen atom, a cyano group, a nitro group, and a heterocyclic group are more preferred; and an aralkyl group, an aryl group, an alkoxy group, an aryloxy group, an acyl group, an acylamino group, a sulfonylamino group, a sulfamoyl group, a carbamoyl group, a halogen atom, a cyano group, a nitro group, and a heterocyclic group are still more preferred. Further, an alkyl group, an aryl group and a halogen atom are specifically preferred.

The alkyl group represented by $Q_2$ may be straight-chain, branched or cyclic one, preferably having 1 to 30 carbon atoms, and more preferably 1 to 15 carbon atoms, such as methyl, ethyl, n-propyl, isopropyl and tertiary octyl. The alkyl group, represented by $Q_2$ may further a substituent, other than —(Y)n-CZ($X_1$)($X_2$). Such substituent are the same as cited in $Q_2$ of the aryl or heterocyclic group described above. Preferred examples of the substituent include an alkenyl group, an aryl group, an alkoxy group, an aryloxy group, an acyloxy group, an acylamino group, an alkoxycarbonyl group, an aryloxycarbonyl group, an acylamino group, an alkoxycarbonylamino group, an aryloxycarbonylamino group, a sulfonylamino group, an alkylthio group, an arylthio group, a ureido group, a phosphoric acid amide group, a hydroxy group, a halogen atom, and a heterocyclic group. Of these, an aryl group, an alkoxy group, an aryloxy group, an acylamino group, an alkoxycarbonylamino group, a sulfonylamino group, a ureido group, a phosphoric acid amide group, and a halogen atom are more preferred; and an aryl group, an alkoxy group, an aryloxy group, an acylamino group, a sulfonylamino group, a ureido group and a phosphoric acid amide group are still more preferred. The substituents may further be substituted. Two or more substituents may be the same or different.

Y represents —C(=O)—, —SO— or —$SO_2$—, preferably —C(=O)— or —$SO_2$—, and more preferably —$SO_2$—; n is 0 or 1, and preferably 1;

$X_1$ and $X_2$, which may be the same or different, are each a halogen atom, such as fluorine, chlorine, bromine or iodine; preferably chlorine, bromine, or iodine; more preferably chlorine or bromine; and still more preferably bromine.

Z represents a hydrogen atom or an electron-withdrawing group. The electron-withdrawing group, represented by Z, is preferably a group having a σp value of not less than 0.01, and more preferably not less than 0.1. The σ value (Harnmett substituent constant) is described in, for example, Journal of Medicinal Chemistry, 1973, Vol. 16, No. 11, 1207–1216. Examples of an electron-withdrawing group include a halogen atom {fluorine atom (σp=0.06), chlorine atom (σp=0.23), bromine atom (σp=0.23), iodine atom (σp=0.18)}, a trihalomethyl group {tribromomethyl (σp=0.29), trichloromethyl (σp=0.33), trifluoromethyl (σp=0.54)}, a cyano group (σp=0.66), a nitro group (σp=0.78), an aliphatic, aryl or heterocyclic sulfonyl group {e.g., methanesulfonyl (σp=0.72)}, an aliphatic, aryl or heterocyclic acyl group {e.g., acetyl (σp=0.50), benzoyl (σp=0.43)}, an alkynyl group {e.g., C≡CH (σp=0.23)}, an aliphatic, aryl or heterocyclic oxycarbonyl group {e.g., methoxycarbonyl (σp=0.45)}, a phenoxycarbonyl group (σp=0.44) and a carbamoyl group (σp=0.36) and a sulfamoyl group (σp=0.57).

Z is preferably an electron-withdrawing group, more preferably a halogen atom, an aliphatic, an aryl or heterocyclic sulfonyl group, an aliphatic, aryl or heterocyclic acyl group, an aliphatic, aryl or heterocyclic oxycarbonyl group, a carbamoyl group or a sulfamoyl group; and still more preferably a halogen atom. Of halogen atoms, chlorine, bromine and iodine atoms are preferred, chlorine and bromine atoms are more preferred, and a bromine atom is still more preferred.

The compound represented by formula (4) is preferably a compound represented by the following formula (4-a):

Formula (4-a)

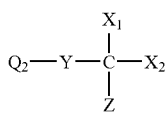

Formula (4-a)

wherein $Q_2$ is the same as defined in formula (4) above, and the preferred scope thereof is the same as defined in formula (4). A substituent, which $Q_2$ may have, is the same as defined in the substituent of $Q_2$ of formula (4) above. $X_1$, $X_2$, Y and Z each are the same as defined in formula (4) above, respectively, and the preferred scope thereof is the same as in defined in formula (4), respectively.

The compound represented by formula (4-a) is preferably a compound represented by the following formula (4-b):

Formula (4-b)

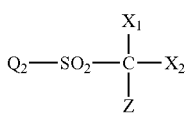

Formula (4-b)

wherein $Q_2$ is the same as defined in formula (4) above, and the preferred scope thereof is the same as defined in formula (4). A substituent, which $Q_2$ may have, is the same as defined in the substituent of $Q_2$ of formula (4) above. $X_1$, $X_2$, and Z each are the same as defined in formula (4) above, respectively, and the preferred scope thereof is the same as in defined in formula (4), respectively.

Typical examples of the compounds represented by formula (4) will be listed below but are by no means limited to these.

(2-1)

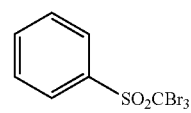

(2-2)

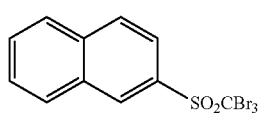

(2-3)

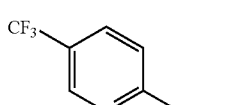

-continued (2-4)

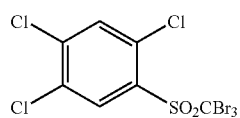

(2-5)

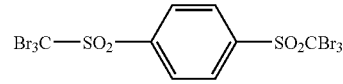

(2-6)

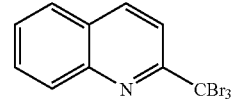

(2-7)

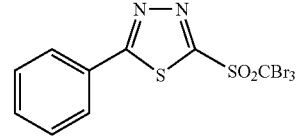

(2-8)

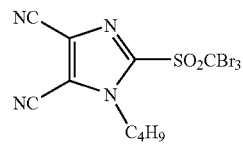

(2-9)

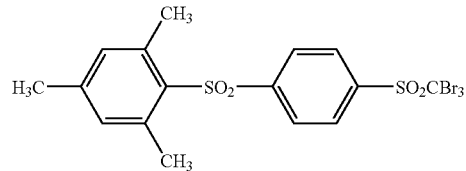

Compounds other than above-described compounds, which fall within the scope of the formula (4) are also described in Japanese Patent O.P.I. Publication No. 2000-305213. The compound represented by formula (4) is contained in the photopolymerizable photosensitive layer, preferably at 0.1 to 30%, more preferably 1 to 15%, and still more preferably 1.5 to 10% by weight, based on non-volatile components.

In the invention, a compound represented by the following formula (5) is preferably used.

Formula (5)

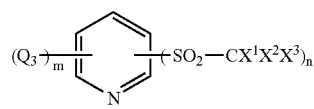

wherein $Q_3$ is an alkyl group, an aryl group or a heterocyclic group; $X^1$, $X^2$ and $X^3$ are each a hydrogen atom or a halogen atom, provided that at least one of $X_1$, $X_2$ and $X_3$ is a halogen atom; m is an integer of 0 to 4; and n is an integer of 1 to 5.

The alkyl group, an aryl group or a heterocyclic group represented by $Q_3$ is the same as those denoted in $Q_2$ Of formula (4). It is preferred that all of $X_1$, $X_2$ and $X_3$ are halogen atoms.

Typical examples of the compound represented by the formula (5) will be listed below but are not specifically limited to these.

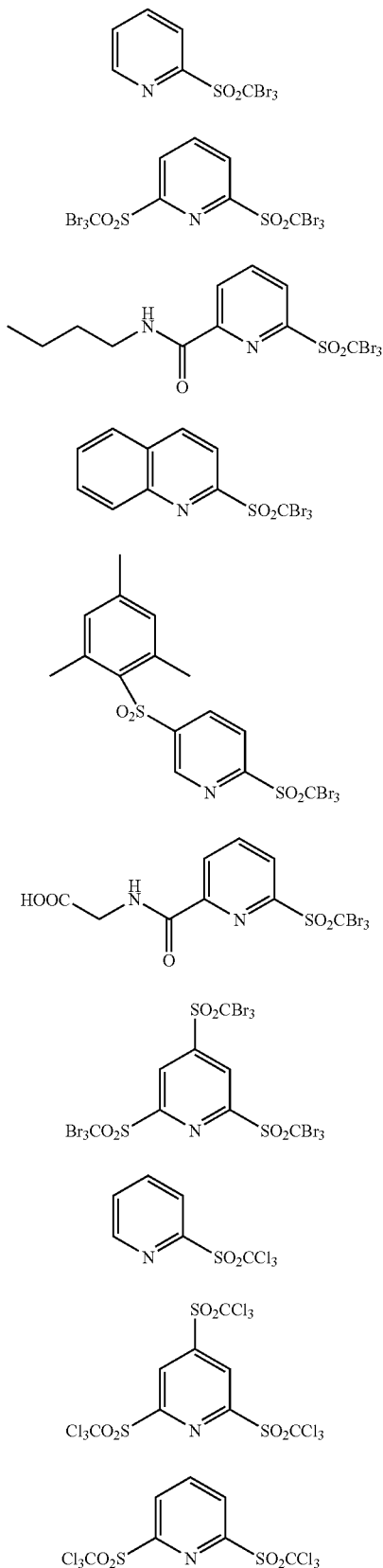

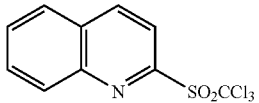

The compounds represented by the formula (5) can be synthesized with reference to the Japanese Patent Publication No. 8-505148.

The compound represented by the formula (5) is contained in the photopolymerizable light sensitive layer, preferably at 0.1 to 30%, more preferably 1 to 15%, and still more preferably 1.5 to 10% by weight, based on non-volatile components.

A titanocene compound will be explained below, which is used together with the foregoing polyhaloacetyl compound, trihaloacetylamide compound or a compound represented by formula (1) or (2) above (hereinafter, the compound is referred to also as a polyhalogenated compound as a general name), and provides preferred effects.

Titanocene compounds are described in Japanese Patent O.P.I. Publication Nos. 63-41483 and 2-291. Preferred examples of titanocene compounds include bis(cyclopentadienyl)-Ti-di-chloride, bis(cyclopentadienyl)-Ti-bis-phenyl, bis(cyclopentadienyl)-Ti-bis-2,3,4,5,6-pentaflurophenyl, bis (cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis (methylcyclopentadienyl)-Ti-bis-2,3,5,6-tetrafluorophenyl, bis(methylcyclopentadienyl)-Ti-bis-2,6-difluorophenyl (IRUGACURE 784, produced by Ciba Speciality Chemicals Co.), bis(cyclopentadienyl)-bis(2,4,6-trifluoro-3-(pyry-1-yl)phenyl)titanium, and bis(cyclopentadienyl)-bis(2,4,6-trifluoro-3-(2-5-dimethylpyry-1-yl)phenyl)titanium.

Chemical structures of representative titanocene compounds are exemplarily shown below.

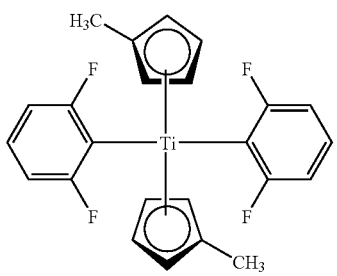

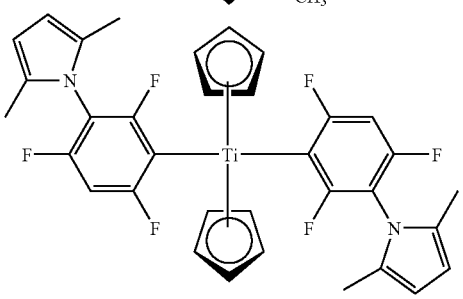

-continued

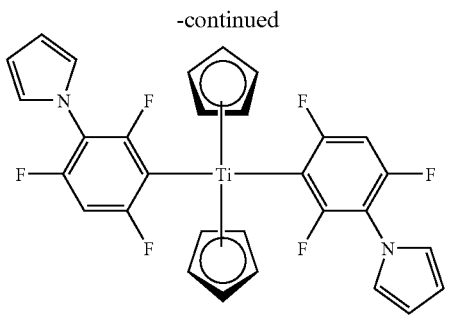

The titanocene compound is contained in the photopolymerizable light sensitive layer, preferably at 0.1 to 15%, more preferably 1 to 15%, and still more preferably 1.5 to 10% by weight, based on non-volatile components.

In this invention, organic borate compounds, which can be used in combination with anyone of the polyhalogenated compound relating to this invention.

As the organic borate compounds, there are monoalkyl-triaryl borate compounds described in Japanese Patent O.P.I. Publication Nos. 62-150242 and 62-143044. Preferred examples of the monoalkyl-triaryl borate compounds include tetra-n-butyl ammonium n-butyl-trinaphthalene-1-yl-borate, tetra-n-butyl ammonium n-butyl-triphenyl-borate, tetra-n-butyl ammonium n-butyl-tri-(4-tert-butylphenyl)-borate, tetra-n-butyl ammonium n-hexyl-tri-(3-chloro-4-methylphenyl)-borate, and tetra-n-butyl ammonium n-hexyl-tri-(3-fluorophenyl)-borate.

The organic borate compound is typically represented by the following formula (6):

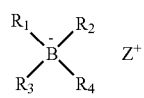

Formula (6)

wherein $R_1$, $R_2$, $R_3$ and $R_4$ independently represent an alkyl group, an aryl group, an aralkyl group, an alkenyl group, an alkinyl group, a silyl group, a heterocyclic group or a halogen atom; and $Z^+$ is a cationic group.

Exemplified compounds of the compound represented by formula (6) will be listed below, but the present invention is not limited thereto.

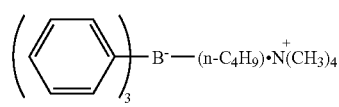
(1)

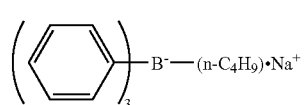
(1-i)

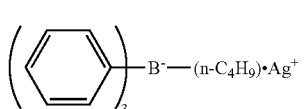
(1-ii)

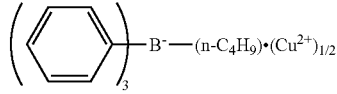
(1-iii)

(2)

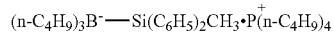
(3)

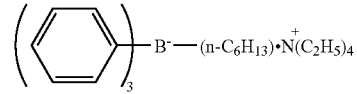
(4)

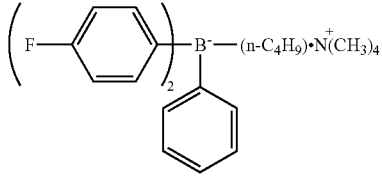
(5)

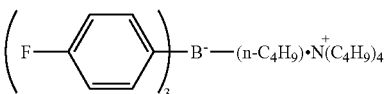
(6)

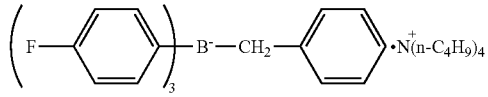
(6-i)

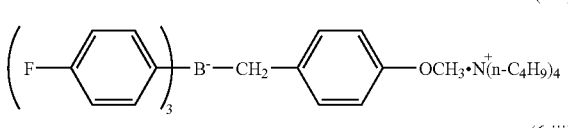
(6-ii)

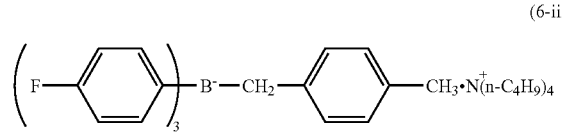
(6-iii)

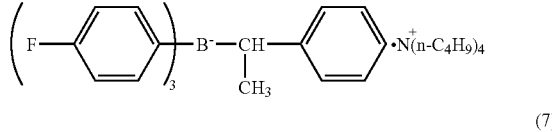
(6-iv)

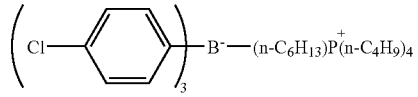
(7)

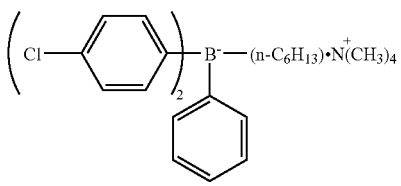
(8)

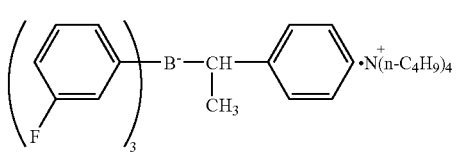
(9)

-continued

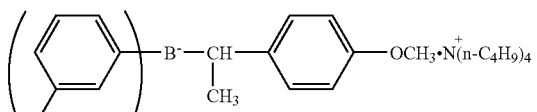

(10)

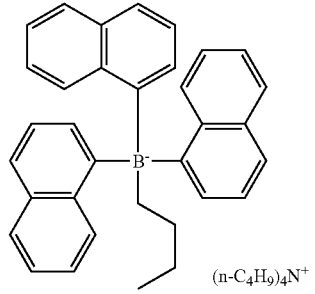

(11)

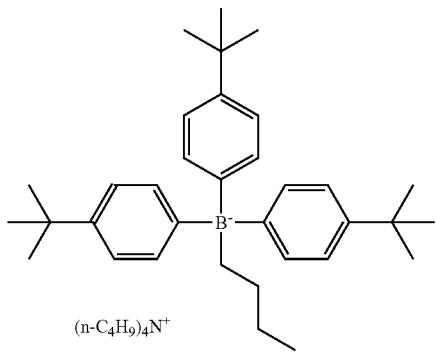

(12)

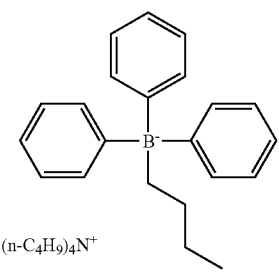

(13)

Exemplified compounds of the organic borate compound other than the above represented by formula (6) include those described in Japanese Patent Application No. 2002-185985.

The organic borate compound is contained in the photopolymerizable light sensitive layer, preferably at 0.1. to 15%, more preferably 1 to 15%, and still more preferably 1.5 to 10% by weight, based on non-volatile components.

Another photopolymerization initiator can be used in combination. Examples thereof include carbonyl compounds, organic sulfur compounds, peroxides, redox compounds, azo or diazo compounds, halides and photo-reducing dyes disclosed in J. Kosar, "Light Sensitive Systems", Paragraph 5, and those disclosed in British Patent No. 1,459,563. Typical examples of the photopolymerization initiator used in combination include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis (dimethylamino) benzophenone; a thioxanthone derivative such as 2-chlorothioxanthone, 2-1-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85–277 (1988) and Japanese Patent O.P.I. Publication No. 2-182701; 2,4,5-triarylimidazol dimmer disclosed in Japanese Patent O.P.I. Publication No. 3-209477; carbon tetrabromide; organic halide compounds disclosed in Japanese Patent O.P.I. Publication No. 59-107344.

<<Polymer Binder>>

Next, a polymer binder will be explained.

As the polymer binder in the invention can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

The polymer binder used in the invention is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer. As the polymer binder is also preferred an unsaturated bond-containing copolymer which is obtained by reacting a carboxyl group contained in the above vinyl copolymer molecule with for example, a compound having a (meth)acryloyl group and an epoxy group. Examples of the compound having a double bond and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC), but is not limited thereto.

The content of the polymer binder in the light sensitive composition is preferably from 10 to 90% by weight, more preferably from 15 to 70% by weight, and still more preferably from 20 to 50% by weight, in view of sensitivity.

The acid value of the polymer binder is preferably from 10 to 150, more preferably from 30 to 120, and still more preferably from 50 to 90, in view of balance of polarity of the photopolymerizable light sensitive layer, which can prevent coagulation of pigment used in the photopolymerizable light sensitive layer coating liquid.

<<Cation-polymerizable Compound>>

The cation-polymerizable compound necessary for the invention will be explained below.

As the cation-polymerizable compound in the invention, the following compounds are cited.

(I) Ethylenically unsaturated compound capable of being polymerized according to a cationic mechanism. Examples thereof include those listed in the following items 1 through 3.

1. Mono- and di-olefins, for example, isobutylene, butadiene, isoprene, styrene, α-methylstyrene, Divinylbenzene, N-vinylpyrrolidone, N-vinylcarbazole, and acrolein 2. Vinyl ethers, for example, methyl vinyl ether, isobutyl vinyl ether, trimethylolpropane trivinyl ether, ethylene glycol divinyl ether, and cyclic vinyl ethers such as 3,4-dihydro-2-formyl-2H-pyran (acrolein dimer), and 3,4-dihydro-2H-pyran-caboxylic acid ester of 2-hydroxymethyl-3,4-dihydro-2H-pyran 3. Vinyl esters, for example, vinyl acetate and vinyl stearate (II) Cation-polymerizable Heterocyclic Compounds Examples thereof include ethylene oxide; propylene oxide; epichlorohydrin; glycidyl ethers of a monovalent alcohol or phenol such as n-butyl glycidyl ether, n-octyl glycidyl ether, phenyl glycidyl ether, and cresyl glycidyl ether; glycidyl acrylate; glycidyl methacrylate; styrene oxide; cyclohexane oxide; oxetanes such as 3,3-dimethyloxetane, 3,3-dichloromethyloxetane; tetrahydrofuran; dioxolane; trioxane; 1,3,6-trioxacycloctane; lactones such as β-propiolactone, γ-valerolactone, and ε-caprolactone; thiiranes such as ethylene sulfide and propylene sulfide; acetidins such as N-acylacetidins, for example, N-benzoylacetidin; adducts of acetidins with diisocyanates, for example, toluilene-2,4- or -2,6-diisocyanate, or 4,4'-diaminodiphenylmethane diisocyanate; straight-chained or branched polymers having a glycidyl group in the side chain, for example, a homopolymer or copolymer of glycidyl (meth)acrylate.

Among the above polymerizable compounds, preferred ones are diepoxides, polyepoxides, or epoxy resins, particularly epoxy resin prepolymers are used for preparing crosslinked epoxy resins. The diepoxides and polyepoxides may be of aliphatic, alicyclic, or aromatic type. Examples thereof include glycidyl ether or β-methylglycidyl ether of aliphatic or alicyclic diols or polyols, for example, glycidyl ether or β-methylglycidyl ether of ethylene glycol, propane-1,2-diol, propane-1,3-diol, butane-1,4-diol, diethylene glycol, polyethylene glycol, polypropylene glycol, glycerin, trimethylolpropane, 1,4-dimethylolcyclohexane, 2,2-bis(4-hydroxycyclohexyl)propane, or N,N-bis(2-hydroxyethyl)aniline; or glycidyl ether of di- or polyphenol, for example, resorcin, 4,4'-dihydroxydiphenylmethane, 4,4'-dihydroxydiphenyl-2,2-propane, novolak resin, or 1,1,2,2-tetrakis(4-hydroxydiphenylethane. Other examples include N-glycidyl compounds, for example, a glycidyl compound of ethyleneurea, 1,3-propyleneurea, 5-methylhydantoin, or 4,4'-methylene-5,5'-tetramethylhydantoin; and triglycidyl isocyanurate.

Other glycidyl compounds which are industrially important include glycidyl esters of carboxylic acids, particularly dicarboxylic acids or polycarboxylic acids, for example, a glycidyl ester of succinic acid, adipic acid, azelaic acid, sebacic acid, phthalic acid, terephthalic acid, tetra or hexahydrophthalic acid, isophthalic acid, trimellitic acid, or dimerized aliphatic acids.

Examples of polyepoxides different from the glycidyl compound include diepoxide of vinylcyclohexene or dicyclopentadiene, 3-(3',4'-epoxycyclohexyl)-8,9-epoxy-2,4-dioxaspiro [5,5] undecane, 3',4'-epoxycyclohexylmethyl 3,4-epoxycyclohexane carboxylate, butadiene diepoxide, isoprene diepoxide, epoxidated linoleic acid derivative or epoxidated polybutadiene.

The epoxy resins are preferably diglycidyl ethers of diphenols or diols having a carbon atom number of from 2 to 4, each of which may be modified with ethylene oxide to incorporate an ethylene glycol unit, and more preferably diglycidyl ether of 2,2-bis-(4-hydroxyphenyl)-propane or bis (4-hydroxyphenyl)methane, each of which may be modified with ethylene oxide to incorporate an ethylene glycol unit.

Besides the above, there are the following compounds as the cation-polymerizable compounds.

(III) Methylol compounds, for example, amides or amide-like compounds, for example, cyclic ureas [ethyleneurea (imidazoline-2-one), hydantoin, uron4 (tetrahydro-oxidiazine-4-one), 1,2-propyleneurea (4-methylimidazolidine-2-one), 1,3-propyleneurea (hexahydro-2H-pyrimide-2-one), hydroxypropyleneurea (5-hydroxy-hexahydro-2H-pyrimide-2-one), 1,3,5-melamine], aminoplasts such as N-hydroxymethyl, N-methoxymethyl, N-n-butoxy-methyl or N-acetoxymethyl derivatives of polytriazines such as acetoguanamine, benzoguanamine or adipoquanamine.

Amino-plasts having N-hydroxymethyl and N-alkoxymethyl or an amino plast having N-hydroxymethyl and N-acetoxymethyl (for example, a mono-, di- or trimethyl ether of hexamethylolmelamine) can be optionally used.

As the aminoplast, a condensation product of urea, urone, hydantoin, or melamine with formaldehyde or a partially or completely etherified compound of the condensation product with an aliphatic alcohol having a carbon atom number of 1 to 3 is preferred.

As the cation polymerizable compound, various known cation polymerizable compounds can be used, which include for example, an epoxy compound, a vinyl ether compound or an oxetane compound disclosed in Japanese Patent O.P.I. Publication Nos. 6-9714, 2001-31892, 2001-40068, 2001-55507, 2001-310938, 2001-310937, and 2001-220526.

The epoxy compounds include an aromatic epoxide, an alicyclic epoxide, and an aliphatic epoxide described below.

A preferable aromatic epoxide is a di- or poly-glycidyl ether manufactured by a reaction of polyhydric phenol having at least one aromatic ring or of an alkylene oxide adduct thereof with epichlorohydrin, and includes, for example, such as di- or poly-glycidyl ether of bisphenol A or of an alkylene oxide adduct thereof, di- or poly-glycidyl ether of hydrogenated bisphenol A or of an alkylene oxide adduct thereof and novolac type epoxy resin. Herein, alkylene oxide includes such as ethylene oxide and propylene oxide.

An alicyclic epoxide is preferably a compound containing cyclohexene oxide or cyclopentene oxide obtained by epoxydizing a compound having at least one cycloalkane ring such as cyclohexene or cyclopentene by use of a suitable oxidizing agent such as hydrogen peroxide or a peracid.

A preferable aliphatic epoxide is such as di- or polyglycidyl ether of aliphatic polyhydric alcohol or of an alkylene oxide adduct thereof; the typical examples include diglycidyl ether of alkylene glycol, such as diglycidyl ether of ethylene glycol, diglycidyl ether of propylene glycol and diglycidyl ether of 1,6-hexane diol; polyglycidyl ether of polyhydric alcohol such as di- or triglycidyl ether of glycerin or of an alkylene oxide adduct thereof; and diglycidyl ether of polyalkylene glycol such as diglycidyl ether of polyethylene glycol or of an alkylene oxide adduct thereof and diglycidyl ether of polypropylene glycol or of an alkylene oxide adduct thereof. Herein, alkylene oxide includes such as ethylene oxide and propylene oxide.

Among these epoxides, aromatic epoxide and alicyclic epoxide are preferable and alicyclic epoxide is specifically preferable, taking a quick curing property in consideration. In the invention, one kind of epoxides described above alone may be utilized, and suitable combinations of two or more kinds thereof may also be utilized.

Examples of the epoxy compounds include the following compounds but the invention is not limited thereto. Celloxide series (Celoxide 2021, Celoxide 2021A, Celoxide 2021P, Celoxide 2081, Celoxide 2000, Celoxide 3000); Epolead series (Epolead GT 301, Epolead GT 401, Epolead PB3600, Epolead PB3600M); EHPE (EHPE-3150, EHPEL3150CE); (meth)acrylate having an epoxy group (Cyclomer A200, Cyclomer M100); a lower molecular weight epoxy compound (GD, STO, MECH, PNO, AOE, X24, X68, Dimac S-300K, Dimac L-500); Plaxel G (Plaxel GL61, Plaxel GL62, Plaxel G101, Plaxel G102, Plaxel G105, Plaxel G401, Plaxel G402, Plaxel G403X); and Epofriend (each manufactured by Daicel Chemical Industries Co. Ltd.)

Examples of the vinyl ether compounds include di- or tri-vinyl ether compounds such as ethylene glycol divinyl ether, diethylene glycol divinyl ether, triethylene glycol divinyl ether, propylene glycol divinyl ether, dipropylene glycol divinyl ether, butane diol divinyl ether, hexane diol divinyl ether, cyclohexane dimethanol divinyl ether, and trimethylol propane trivinyl ether; and mono vinyl ether compounds such as ethyl vinyl ether, n-butyl vinyl ether, iso-butyl vinyl ether, octadecyl vinyl ether, cyclohexyl vinyl ether, hydroxybutyl vinyl ether, 2-ethylhexyl vinyl ether, cyclohexane dimethanol monovinyl ether, n-propyl vinyl ether, isopropyl vinyl ether, isopropenyl ether-o-propylene carbonate, dodecyl vinyl ether, diethylene glycol monovinyl ether and octadecyl vinyl ether.

In these vinyl ether compounds, when the hardenability, adhesion or surface hardness is considered, di- or tri-vinyl ether compounds are preferable, and particularly divinyl ether compounds are preferable. In the present invention, these vinyl ether compounds may be used alone or as an admixture of two or more kinds thereof.

The oxetane compound refers to a compound having an oxetane ring, and in the invention, all the oxetane compounds can be used which are disclosed in Japanese Patent O.P.I. Publication Nos. 2001-220526 and 2001-310937. When an ink composition contains an oxetane compound having five or more oxetane rings, viscosity of the ink composition increases or glass transition point of the ink composition is elevated, which may result in difficulty to handling, and poor tackiness of cured ink composition. Therefore, an oxetane compound having 1 to 4 oxetane rings is preferred.

As one example of an oxetane compound having one oxetane ring, an oxetane compound represented by the following formula (7) is cited.

Formula (7)

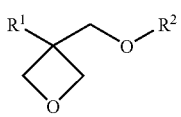

Formula (7)

In formula (7), $R^1$ represents a hydrogen atom, an alkyl group having from 1 to 6 carbon atoms such as a methyl group, an ethyl group, a propyl group, a butyl group, etc.; a fluoroalkyl group having from 1 to 6 carbon atoms; an allyl group; an aryl group; a furyl group; or a thienyl group; and $R^2$ represents an alkyl group having from 1 to 6 carbon atoms such as a methyl group, an ethyl group, a propyl group, a butyl group, etc.; an alkenyl group having from 2 to 6 carbon atoms such as a 1-propenyl group, a 2-propenyl group, a 2-methyl-1-propenyl group, a 2-methyl-2-propenyl group, a 1-butenyl group, a 2-butenyl group, a 3-butenyl group, etc.), an aromatic ring-containing group such as a phenyl group, a benzyl group, a fluorobenzyl group, a methoxybenzyl group; a phenoxyethyl group, etc.; an alkylcarbonyl group having from 2 to 6 carbon atoms such as an ethylcarbonyl group, a propylcarbonyl group, a butylcarbonyl group, etc.; an alkoxycarbonyl group having from 2 to 6 carbon carbons such as an ethoxycarbonyl group, a propoxycarbonyl group, a butoxycarbonyl group, etc.; an N-alkylcarbamoyl group having from 2 to 6 carbon atoms such as an ethylcarbamoyl group, a propylcarbamoyl group, a butylcarbamoyl group, a pentylcarbamoyl, etc. The oxetane compound used in the invention is preferably a compound having one oxetane ring in that the composition containing such a compound is excellent in tackiness, low in viscosity, and is easy to handle.

As one example of an oxetane compound having two oxetane rings, an oxetane compound represented by the following formula (8) is cited.

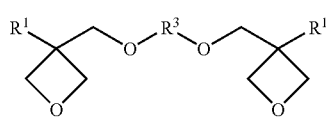

Formula (8)

In formula (8), $R^1$ represents the same group as those denoted in $R_1$ in formula 1; and $R^3$ represents a straight chained or branched alkylene group such as an ethylene group, a propylene group, a butylene group, etc.; a straight chained or branched polyalkyleneoxy group such as a poly(ethyleneoxy) group, a poly(propyleneoxy) group, etc.; a straight chained or branched unsaturated divalent hydrocarbon group such a propenylene group, a methylpropenylene group, a butenylene group, etc.; an alkylene group containing a carbonyl group; an alkylene group containing a carbonyloxy group; or an alkylene group containing a carbamoyl group.

$R^3$ also represents a divalent group selected from groups represented by the following formulae (9), (10), and (11).

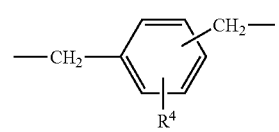

Formula (9)

In formula (9), $R^4$ represents a hydrogen atom, an alkyl group having from 1 to 4 carbon atoms such as a methyl group, an ethyl group, a propyl group, a butyl group, etc.; an alkoxy group having from 1 to 4 carbon atoms such as a methoxy group, an ethoxy group, a propoxy group, a butoxy group, etc.; a halogen atom such as a chlorine atom, a bromine atom, etc.; a nitro group; a cyano group; a mercapto group; a lower alkylcarboxy group; carboxyl group; or a carbamoyl group.

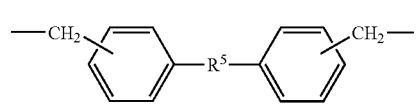

Formula (10)

In formula (10), $R^5$ represents an oxygen atom, a sulfur atom, a methylene group, —NH—, —SO—, —SO$_2$—, —(CF$_3$)$_2$—, or —C(CH$_3$)$_2$—.

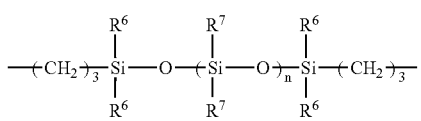

Formula (11)

In formula (11), $R^6$ represents an alkyl group having from 1 to 4 carbon atoms such as a methyl group, an ethyl group, a propyl group, a butyl group, etc., or an aryl group; "n" represents an integer of from 0 to 2000; and $R^7$ represents an alkyl group having from 1 to 4 carbon atoms such as a methyl group, an ethyl group, a propyl group, a butyl group, etc, or an aryl group, or a group represented by the following formula (12).

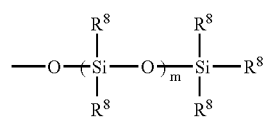

Formula (12)

In formula (12), $R^8$ represents an alkyl group having from 1 to 4 carbon atoms such as a methyl group, an ethyl group, a propyl group, a butyl group, etc., or an aryl group; and m represents an integer of from 0 to 100.

Examples of a compound having two oxetane rings include the following exemplified compounds 1 and 2.

Exemplified compound 1

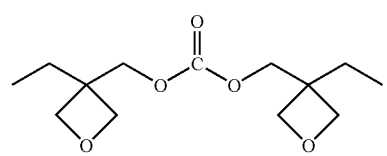

Exemplified compound 2

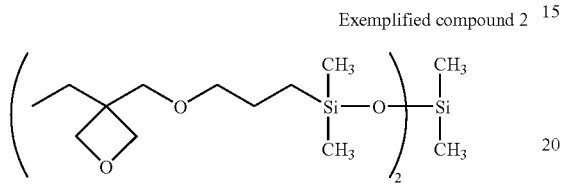

Exemplified compound 1 is a compound in which in formula (8), $R^1$ is an ethyl group, and $R^3$ is a carbonyl group. Exemplified compound 2 is a compound in which in formula (8), $R^1$ is an ethyl group, and $R^3$ is a group in which in formula (11), $R^6$ is a methyl group, $R^7$ is a methyl group, and n is 1.

As another example of an oxetane compound having two oxetane rings, an oxetane compound represented by the following formula (13) is cited. In formula (13), $R^1$ is the same as those denoted in $R^1$ of formula (7).

Formula (13)

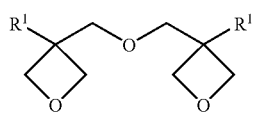

As an example of an oxetane compound having three or four oxetane rings, an oxetane compound represented by the following formula (14) is cited.

Formula (14)

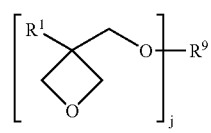

In formula (14), $R^1$ is the same as those denoted in $R^1$ of formula (7); and $R^9$ represents a branched alkylene group having 1 to 12 carbon atoms such as a group represented by A, B, or C below, a branched polyalkyleneoxy group such as a group represented by D below, or a branched alkylene group containing a silylether group such as a group represented by E below. "j" represents an integer of 3 or 4.

A

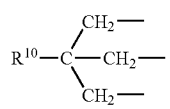

B

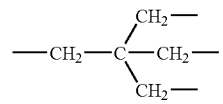

C

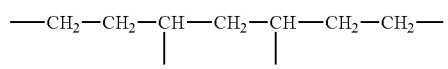

D

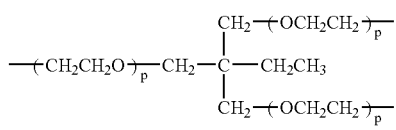

E

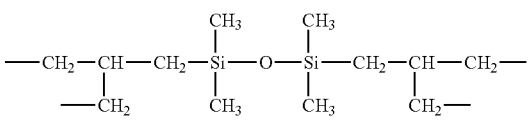

In formula A, $R^{10}$ represents a lower alkyl group such as a methyl group, an ethyl group, or a propyl group. In formula D, n represents an integer of from 1 to 10.

As an example of an oxetane compound having three to four oxetane rings, an exemplified compound 3 is cited.

Exemplified compound 3

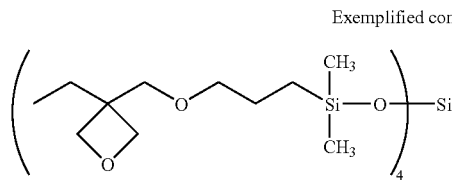

As a compound having 1 to 4 oxetane rings other than the compounds described above, a compound represented by the following formula (15) is cited.

Formula (15)

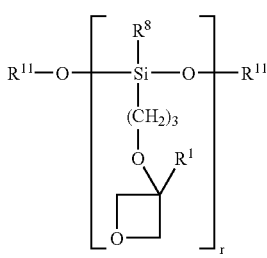

In formula (15), $R^8$ is the same as those denoted in $R^8$ of formula (12); $R^{11}$ represents an alkyl group having 1 to 4 carbon atoms such as a methyl group, an ethyl group, or a propyl group, or a trialkylsilyl group; r represents an integer of from 1 to 4.

The preferred oxetane compounds used in the invention are exemplified compounds as shown below.

Exemplified compound 4

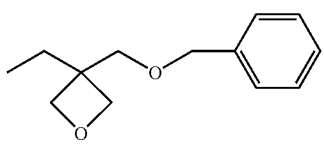

Exemplified compound 5

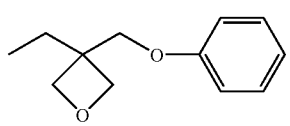

Exemplified compound 6

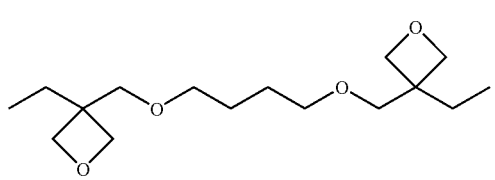

Synthetic method of the above-described oxetane compounds is not specifically limited, and known methods can be used. There is, for example, a method disclosed in D. B. Pattision, J. Am. Chem. Soc., 3455, 79 (1957) in which an oxetane ring is synthesized from diols.

Besides the above-described oxetane compounds, polymeric oxetane compounds having 1 to 4 oxetane rings with a molecular weight of 1000 to 5000 can be used. Examples thereof include the following compounds.

p:20 to 200 q:15 to 100 s:20 to 200

Preferred examples of the cation-polymerizable compound in the invention include a compound having both radical polymerizable group and cation-polymerizable group in the molecule. Examples of the radical polymerizable group include an acryloyl group, a methacryloyl group, and a styryl group. An acryloyl group and a methacryloyl group are especially preferred. Examples of the cation-polymerizable group include the polymerizable group contained in the ethylenically unsaturated monomer capable of being cationically polymerized or the cation-polymerizable heterocyclic compound described above. Typical examples thereof include a group having an oxirane ring (epoxy), an oxetane ring, an oxolane ring, a dioxolane ring, a trioxolane ring, and lactone ring.

Preferred examples of the compound having both radical polymerizable group and cation-polymerizable group in the molecule will be listed below, but the invention is not specifically limited thereto.

RCM-1

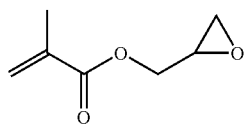

RCM-2

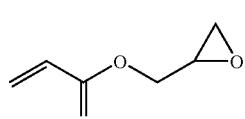

RCM-3

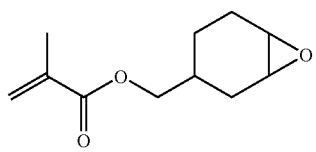

RCM-4

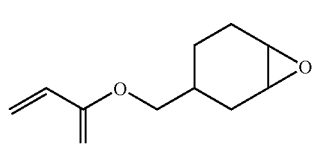

RCM-5

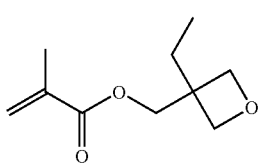

RCM-6

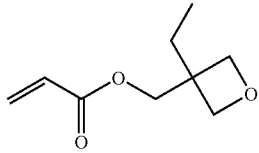

RCM-7

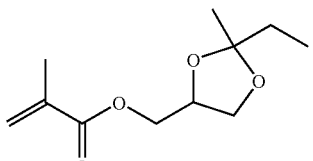

RCM-8

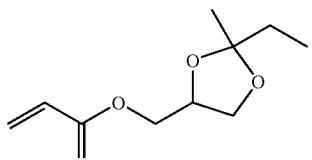

-continued

RCM-9

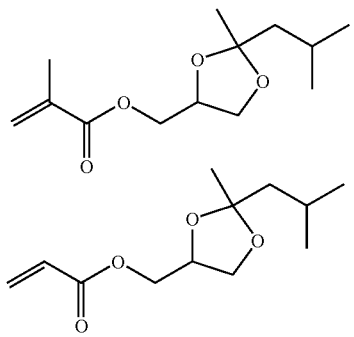

RCM-10

Especially preferred examples of the compound having both radical polymerizable group and cation-polymerizable group in the molecule include a compound represented by formula (I) or (II) described above. Examples of this compound include RCM-3, RCM-4, RCM-5, and RCM-6, described above. The content of these compounds in the light sensitive layer is preferably from 2 to 50% by weight, and more preferably from 3 to 30% by weight.

<<Spectral Sensitizing Dye>>

It is preferred that the light sensitive composition of the invention further comprises a compound having an absorption maximum in the wavelength regions of from 700 to 1200 nm. The compound having an absorption maximum in the wavelength regions of from 700 to 1200 nm refers to a compound called a sensitizing dye or a dye providing an absorption maximum in the wavelength regions of from 700 to 1200 nm in the absorption spectra obtained by measuring a solution in which the compound is dissolved in methanol.

Examples of the sensitizing dye or the dye include the following compound, but the invention is not specifically limited thereto.

(1) A sensitizing dye represented by the following formula [1-a], [1-b], [1-c] or [1-d] disclosed in Japanese Patent O.P.I. Publication No. 11-352628.

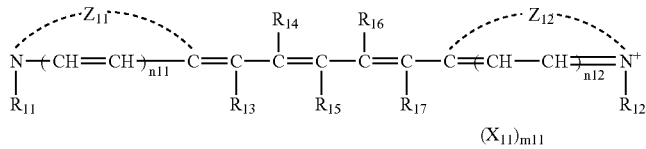

Formula [1-a]

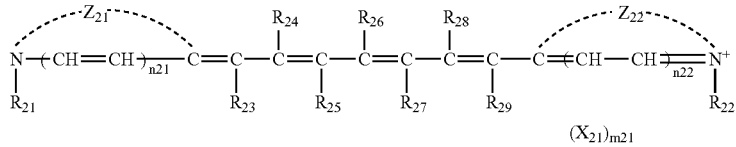

Formula [1-b]

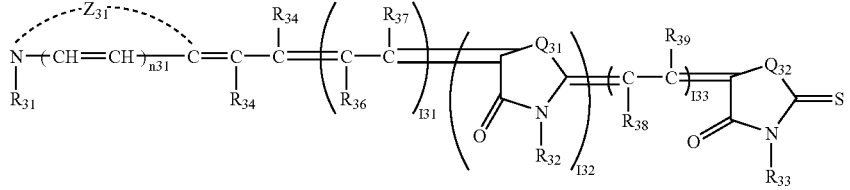

Formula [1-c]

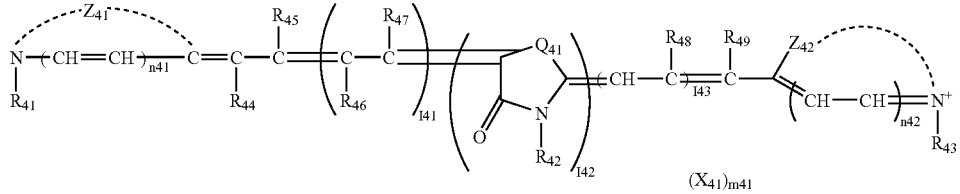

Formula [1-d]

wherein $Z_{11}$, $Z_{12}$, $Z_{21}$, $Z_{22}$, $Z_{31}$, $Z_{41}$, and $Z_{42}$ independently represent a non-metallic atom group necessary to form a nitrogen-containing heterocyclic ring which may be a single ring or a condensed ring. $Q_{31}$, $Q_{32}$, and $Q_{41}$ independently represent an oxygen atom, a sulfur atom, a selenium atom or —N(R)—, in which R represents an alkyl group, an aryl group or a heterocyclic group. $R_{11}$, $R_{12}$, $R_{21}$, $R_{22}$, $R_{31}$, $R_{41}$, and $R_{43}$ independently represent an aliphatic group, $R_{32}$, $R_{33}$, and $R_{42}$ independently represent an alkyl group, an aryl group or a heterocyclic group. $R_{13}$, $R_{14}$, $R_{15}$, $R_{16}$, $R_{17}$, $R_{23}$, $R_{24}$, $R_{25}$, $R_{26}$, $R_{27}$, $R_{28}$, $R_{29}$, $R_{44}$, $R_{35}$, $R_{36}$, $R_{37}$, $R_{38}$, $R_{39}$, $R_{44}$, $R_{45}$, $R_{46}$, $R_{47}$, $R_{48}$, and $R_{49}$ independently represent a hydrogen atom, a substituted or unsubstituted alkyl, alkoxy, aryloxy or aryl group, —N($W_1$, $W_2$), —SR or a heterocyclic group in which R represents an alkyl group, an aryl group or a heterocyclic group, and $W_1$ and $W_2$ independently represent a substituted or unsubstituted alkyl or aryl group, provided that $W_1$ and $W_2$ may combine with each other to form a 5- or 6-membered nitrogen-containing heterocyclic ring. $R_{11}$ and $R_{13}$, $R_{14}$ and $R_{16}$, $R_{17}$ and $R_{12}$, $R_{21}$ and $R_{23}$, $R_{24}$ and $R_{26}$, $R_{25}$ and $R_{27}$, $R_{26}$ and $R_{28}$, $R_{22}$ and $R_{29}$, $R_{31}$ and $R_{34}$, $R_{35}$ and $R_{37}$, $R_{41}$ and $R_{44}$, $R_{45}$ and $R_{47}$, and $R_{49}$ and $R_{43}$ may combine with each other to form a 5- or 6-membered ring. $X_{11}$, $X_{21}$, and $X_{41}$, represent an ion necessary to neutralize the charge of the molecule, and $m_{11}$, $m_{21}$, and $m_{41}$ represent the number of ions necessary to neutralize the charge of the molecule. $n_{11}$, $n_{12}$, $n_{21}$, $n_{22}$, $n_{31}$, $n_{41}$, and $n_{42}$ independently represent an integer of 0 or 1, and $l_{31}$, $l_{32}$, $l_{33}$, $l_{41}$, $l_{42}$, and $l_{43}$ independently represent an integer of 0 or 1.

(2) A dye represented by the following formula (1) disclosed in Japanese Patent O.P.I. Publication No. 2000-16004, Formula (1)

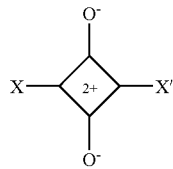

wherein X and X' independently represent a group having the following structure, a hydrogen atom, an alkyl group,

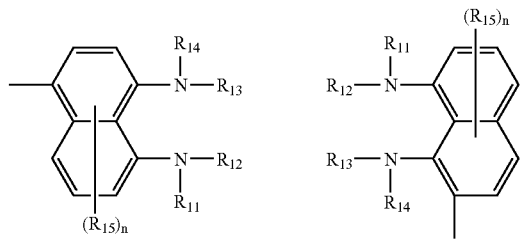

wherein $R_{11}$ through $R_{14}$ independently represent a hydrogen atom or a substituent; $R_{15}$ represents a monovalent substituent; and n is an integer of from 0 to 5, provided that $R_{11}$ and $R_{12}$, $R_{13}$ and $R_{14}$ may combine with each other to form a ring, and $R_{11}$ and $R_{13}$ or $R_{14}$, $R_{12}$ and $R_{13}$ or $R_{14}$ may combine with each other to form a not less than 8-membered heterocyclic ring to condense with the naphthalene ring.

(3) A dye represented by the following formula (1), (2) or (3) disclosed in Japanese Patent O.P.I. Publication No. 2003-5363.

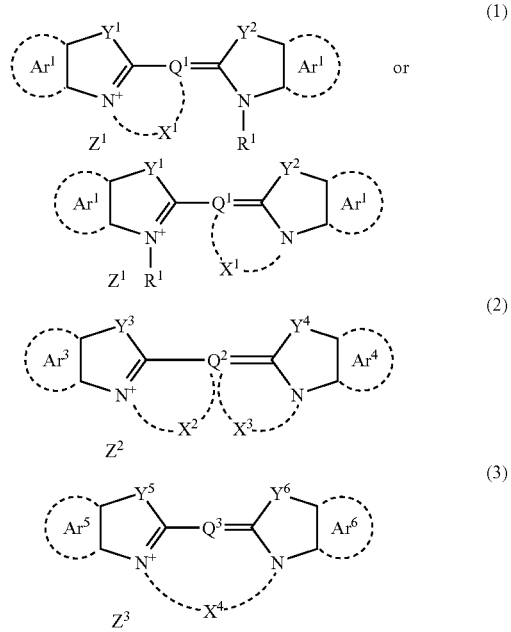

wherein $R^1$ represents a hydrocarbon group having a carbon atom number of not more than 20 which may have a substituent, and preferably an alkyl group having a carbon atom number of from 1 to 4; $Ar^1$ through $Ar^6$ independently represent a substituted or unsubstituted aromatic hydrocarbon group or a substituted or unsubstituted heterocyclic group, preferably a benzene ring, a naphthalene ring, a pyridine ring or pyrazine ring, and more preferably a benzene ring or a naphthalene ring; $Y^1$ through $Y^6$ may be the same or different, independently represent a sulfur atom, an oxygen atom, a nitrogen atom, —CH=CH—, or —N($R^2$)—, in which $R^2$ is the same as those denoted in $R^1$ above, and represent preferably dialkylmethylene such as dimethylmethylene; and Q represents a pentamethine group or a heptamethine group, and preferably a heptamethine group in view of infrared adaptability or stability. Q may have a substituent such as an alkoxy group, an aryloxy group, an alkylthio group, an arylthio group, a dialkylamino group, a diarylamino group, a halogen atom, an alkyl group, an aryl group, an oxy group, or a group represented by the following formula (4). Preferred substituents include a diarylamino group such as a diphenylamino group and an arylthio group such as a phenylthio group.

(4)

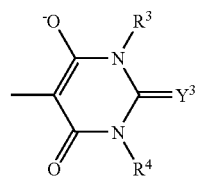

Q is preferably a group comprising a cyclohexene, cyclopentene or cyclobutene group each containing a continuously linked three methine groups in view of stability, and more preferably the a cyclohexane or cyclopentene group. $Z^1$ through $Z^3$ represent a counter ion necessary to neutralize the charge, the counter ion representing an anion such as a halogen ion, a perchlorate ion, a tetrafluoroborate ion, a hexafluorophosphate ion or a sulfonic acid ion, or a cation for example, an organic anion such as an ammonium ion, or a sulfonium ion, or an alkali metal ion or an alkali earth metal ion such as a sodium ion, a potassium ion, or a calcium ion. $X^1$ through $X^4$ independently represent a divalent organic group necessary to form a ring, and preferably an alkylene group having a carbon atom number of not less than 2, provided that the methylene group in the alkylene group may be replaced with a divalent group such as an oxygen atom, a sulfur atom, —NH—, or a phenylene group, and the phenylene group may have a monovalent substituent such as an alkyl group, an alkoxy group, a halogen atom or a carboxyl group.

Typical examples thereof used in the invention include those disclosed in Japanese Patent documents described above.

The content of the above compound in the light sensitive layer is preferably 0.1 to 10 parts and more preferably from 1 to 7 parts based on the 100 parts of the light sensitive layer. The coating amount of the light sensitive layer on the support is preferably from 0.1 to 10 g/m$^2$, and more preferably from 0.5 to 4 g/m$^2$.

(Various Additives)

The photopolymerizable light sensitive layer in the invention is preferably added with a polymerization inhibitor, in order to prevent undesired polymerization of the ethylenically unsaturated monomer during the manufacture or after storage of the light sensitive planographic printing plate material. Examples of the polymerization inhibitor include hydroquinone, p-methoxyphenol, di-t-butyl-p-cresol, pyrrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the light sensitive layer. Further, in order to prevent undesired polymerization induced by oxygen, behenic acid or a higher fatty acid derivative such as behenic amide may be added to the layer. After the light sensitive layer is coated layer, the coated layer may be dried so that the higher fatty acid derivative is localized at the vicinity of the surface of the light sensitive layer. The content of the higher fatty acid derivative is preferably 0.5 to 10% by weight, based on the total solid content of the light sensitive layer.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran". Pigment is preferred.

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

A surfactant may be added to the layer in order to improve coatability of the layer. A preferred surfactant is a fluorine-contained surfactant.

Further, in order to improve physical properties of the cured light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer.

The solvents used in the preparation of the coating liquid for the photopolymerizable light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

(Protective Layer or Oxygen Shielding Layer)

(Protective Layer: Oxygen Shielding Layer)

In the invention, a protective layer is preferably provided on the photopolymerizable light sensitive layer. It is preferred that the protective layer (oxygen shielding layer) is highly soluble in the developer as described above (generally an alkaline solution). Polyvinyl alcohol or polyvinyl pyrrolidone is preferably used in the protective layer. Polyvinyl alcohol has the effect of preventing oxygen from transmitting and polyvinyl pyrrolidone has the effect of increasing adhesion between the oxygen shielding layer and the photopolymerizable light sensitive layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the light sensitive planographic printing plate material in the invention, adhesive strength between the protective layer and the photopolymerizable light sensitive layer is preferably not less than 35 mN/mm, more preferably not less than 50 mN/mm, and still more preferably not less than 75 mN/mm. Preferred composition of the protective layer is disclosed in Japanese Patent Application No. 8-161645.

The adhesive strength in the invention can be measured according to the following procedure.

When an adhesive tape with sufficient adhesive strength having a predetermined width is adhered onto the protective layer, and then peeled at an angle of 90° to the plane of the light sensitive planographic printing plate precursor, strength necessary to peel the protective layer from the photopolymerizable light sensitive layer is measured as the adhesive strength.

The protective layer may further contain a surfactant or a matting agent. The protective layer is formed, coating on the photopolymerizable light sensitive layer a coating solution in which the above protective layer composition is dissolved in an appropriate coating solvent, and drying. The main solvent of the coating solution is preferably water or an alcohol solvent such as methanol, ethanol, or iso-propanol.

The thickness of the protective layer is preferably 0.1 to 5.0 µm, and more preferably 0.5 to 3.0 µm.

(Support)

The supports used in the invention include a plate having a hydrophilic surface of a metal such as aluminum, stainless steel, chromium, or nickel, a plastic film such as a polyester film, a polyethylene film or a polypropylene film which is deposited or laminated with the above-described metal, and a polyester film, a polyvinyl chloride film or a nylon film whose surface is subjected to hydrophilization treatment. Among the above, the aluminum plate is preferably used, and may be a pure aluminum plate or an aluminum alloy plate. As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 µm are dispersed in water to the surface of the support. The honing roughening method is carried out by ejecting obliquely slurry with pressure applied from nozzles to the surface of the support, the slurry containing volcanic ash particles with a particle size of 10 to 100 µm dispersed in water. A surface roughening can be also carried out by laminating a support surface with a sheet on the surface of which abrading particles with a particle size of from 10 to 100 µm was coated at intervals of 100 to 200 µm and at a density of $2.5 \times 10^3$ to $10 \times 10^3/cm^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali. include sodium hydroxide and potassium hydroxide. Among those mentioned above, an aqueous alkali solution of for example, sodium hydroxide is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the electrolytic surface roughening method, a method, in which the support is electrolytically surface roughened in an acidic electrolytic solution, is preferred. Though an acidic electrolytic solution generally used for the electrolytic surface roughening can be used, it is preferable to use an electrolytic solution of hydrochloric acid or that of nitric acid. The electrolytic surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C.

When the support is electrolytically surface roughened by using an electrolytic solution of nitric acid, voltage applied is generally from 1 to 50 V, and preferably from 5 to 30 V. The current density used can be selected from the range from 10 to 200 $A/dm^2$, and is preferably from 20 to 100 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electrolytically surface roughened by using an electrolytic solution of hydrochloric acid, voltage applied is generally from 1 to 50 V, and preferably from 2 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The hydrochloric acid concentration in the electrolytic solution is preferably from 0.1% by weight to 5% by weight.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m$^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 A/dm$^2$ to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 mg/dm$^2$, and preferably 10 to 40 mg/dm$^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye; an amine salt; and so on, for hydrophilization treatment. The sol-gel treatment support disclosed in Japanese Patent O.P.I. Publication No. 5-304358, which has a functional group capable of causing addition reaction by radicals as a covalent bond, is suitably used.

(Coating)

The prepared coating liquid for the photopolymerizable light sensitive layer is coated on the support according to a conventional method, and dried to obtain a light sensitive planographic printing plate precursor. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated photopolymerizable light sensitive layer cannot provide sufficient printing durability, while too a high drying temperature of the coated photopolymerizable light sensitive layer results in marangoni and produces fog at non-image portions. The drying temperature is preferably from 60 to 160° C., more preferably from 80 to 140° C., and still more preferably from 90 to 120° C.

(Image Formation Method)

The light sources for forming an image on the planographic printing plate material in the invention include, for example, a laser, an emission diode, a xenon flush lamp, a halogen lamp, a carbon arc light, a metal halide lamp, a tungsten lamp, a high pressure mercury lamp, and a non-electrode light source.

When the planographic printing plate material is imagewise exposed at one time, a mask having a negative image pattern made of a light shielding material is put on the plate to be in close contact with the plate material, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As the laser, argon laser, He—Ne gas laser, YAG laser or semi-conductor laser is preferably used. Typically, there is a YAG laser having a two times high wavelength emitting light with a wavelength of about 532 nm, or an argon ion emitting light with a wavelength of about 488 nm. In the invention, a semiconductor laser employing InGaN type material or ZnSn type material, which can continuously emit light with a wavelength of from 380 to 430 nm, can be also used.

The planographic printing plate material of the invention is preferably exposed employing a laser having an emission wavelength in infrared regions. Typically, imagewise exposure is carried out employing a solid laser or semiconductor laser each being capable of emitting infrared rays with a wavelength from 700 to 1200 nm (for example, a 830 nm semiconductor laser or a 1064 nm Nd:YAG laser). The output power of the laser is preferably not less than 100 mW, and a multi-beam laser device is preferably used in order to shorten exposure time. Exposure time per one pixel is preferably not more than 20 microseconds. Exposure energy of laser irradiated to a printing plate material is not less than 1 mJ/cm$^2$, and preferably from 10 to 300 mJ/cm$^2$. Such a high power laser exposure has advantage in that photopolymerization is accelerated and a preheating treatment can be eliminated.

As a laser scanning method by means of a laser beam, there are a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are suitable for high density image recording, since it is easier to increase accuracy of an optical system.

(Preheating)

In the invention, the exposed planographic printing plate material can be subjected to heat treatment before or during development. Such a heat treatment can improve adhesion between the support and the light sensitive photopolymerizable layer.

Regarding heat treatment, there is, for example, a developing machine in which a preheating roller for preheating an exposed planographic printing plate material to a predetermined temperature is arranged upstream a development section where the preheating is carried out before development. The preheating roller is a roller comprised of a pair of rollers, at least one of the pair of the rollers having a heating means within the roller. The roller having a heating means in it is a pipe of a metal with high thermal conductivity such as aluminum or iron, the pipe having a nichrome wire as a heating element. The outside surface of the pipe may be covered with a sheet of a plastic such as polyethylene, polystyrene or Teflon. Details of such a preheating roller can refer to Japanese Patent O.P.I. Publication No. 64-80962.

In the invention, it is preferred that the preheating is carried out at 70 to 180° C. for 3 to 120 seconds.

<<Developer>>

The developer concentrate in the invention may be prepared by forming a developer solution, followed by evaporation to dryness and is preferably prepared in such a manner that plural components are mixed with a small amount of water or without adding any water. The developer concentrate can also be prepared in the form of granules or tablets, as described in Japanese Patent O.P.I. Publication Nos. 51-61837, 2-109042, 2-109043, 3-39735, 5-142786, 6-266062 and 7-13341.

The developer concentrate may be divided into plural parts differing in material species or compounding ratio. The concentrate is used for development preferably by diluting with water to a prescribed concentration prior to development. When the developer concentrate is used as a developer replenisher, it is preferred that the developer concentrate is diluted with water to a prescribed concentration, followed by being supplied to a working developer, whereby it is also feasible to supply a developer at a higher concentration than the prescribed one or, without being diluted to the prescribed concentration, to the working developer. When supplied at a higher concentration than the prescribed one or without being diluted to the prescribed concentration, water may be separately added in the same timing or in a different timing.

The developer concentrate in the invention has a water content of not more than 10% by weight, and preferably not more than 1% by weight, based on the concentrate. The higher water content often causes problems such that developer components separate out in water, losing homogeneity or becomes liquid, making handling hard.

Components contained in a developer for a conventional lithographic printing plate material can be employed as the components for the developer concentrate and it is preferred to exclude a component which reacts at a water content of not more than 10% by weight and cannot be recovered even with dilution, a material having a large moisture content or a liquid material at ordinary temperature. For example, a silicate petrifies at a reduced water content and becomes hard to be solved. Therefore, carbonates, phosphates or organic acid salts described later are contained in the developer concentrate instead of silicates. Carbonates are especially preferred.

Components contained in the developer concentrate will be explained below. Explanation is made on those of both developer concentrate and developer replenisher concentrate, unless otherwise specified. The term "developer" refers to a developer or a developer replenisher after the concentrate has been diluted with a given amount of water.

(Alkali Reagent)

Examples of an inorganic alkali reagent include sodium tertiary phosphate, potassium tertiary phosphate, ammonium tertiary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide, and lithium hydroxide. Examples of an organic alkali reagent include monomethhylamine, dimethylamine, trimethylamine, monoethylamine, diethylamine, triethylamine, monoisobutylamine, diisobutylamine, triisobutylamine, n-butylamine, monoethanolamine, diethanolamine, triethanolamine, monoisopropanolamine, diisopropanolamine, ethyleneimine, ethylenediamine, pyridine, and tetramethylammonium hydroxide.

The alkali reagents can be used alone or in combination thereof. An alkali reagent is used preferably in an amount giving a pH of 9 to 13.5, and more preferably 10.0 to 12.5, and an electric conductivity of 2 to 40 mS/cm, more preferably 3 to 30 mS/cm, and still more preferably 5 to 20 mS/cm) when used as a developer (or developer solution). A pH lower than the foregoing range results in no image formation and a pH exceeding the foregoing range often causes over-development, leading to increased damages in development at exposed areas. A conductivity lower than the foregoing range usually renders difficult dissolution of the light sensitive layer provided on the surface of an aluminum plate support, leading to stained printing. A conductivity exceeding the foregoing range results in an increased salt concentration, retarding dissolution of the light sensitive layer, resulting in residual layer at unexposed areas.

The developer concentrate in the invention preferably contains a nonionic surfactant having a polyoxyalkylene ether group. Addition of such a surfactant promotes dissolution of the light sensitive layer in unexposed areas and minimizes penetration of a developer to exposed areas. As the surfactant having a polyoxyalkylene ether group is suitably used a compound represented by the following formula (X):

$$R_1\text{—}O\text{—}(R_2\text{—}O)_n H \qquad (X)$$

wherein $R_1$ is an alkyl group having 3 to 15 carbon atoms, an aromatic hydrocarbon group having 6 to 16 carbon atoms or an aromatic heterocyclic group having 4 to 15 carbon atoms, each of which may have a substituent, (examples of the substituent include an alkyl group having 1 to 20 carbon atoms, a halogen atom such as Br, Cl or I, an aromatic hydrocarbon group having 6 to 15 carbon atoms, an aralkyl group having 7 to 17 carbon atoms, an alkoxy group having 1 to 20 carbon atoms, an alkoxycarbonyl group having 2 to 20 carbon atoms and an acyl group having 2 to 15 carbon atoms); $R_2$ is an alkylene group having 1 to 100 carbon atoms, which may have a substituent (examples of the substituent include an alkyl group having 1 to 20 carbon atoms and an aromatic hydrocarbon group having 6 to 15 carbon atoms); and n is an integer of 1 to 100.

In formula (X), $(R_2—O)_n$ may be comprised of a combination of two or three kinds thereof, as long as it falls within the above-described range. Typical examples thereof include those in which a combination of an ethylene oxy group and a propyleneoxy group, an ethylene oxy group and an isopropyleneoxy group, an ethylene oxy group and butyleneoxy group, or an ethylene oxy group and an isobutyleneoxy group is arranged randomly or in block form. Surfactants having a polyoxyalkylene ether group, which may be used alone or in their combination, are added to a developer, preferably in an amount of 1 to 30%, and more preferably 2 to 20% by weight. A lesser addition amount lowers developability and an excessive addition results in increased damages in development, leading to lowering of printing durability of printing plate.

There may be incorporated other surfactants. Examples thereof include nonionic surfactants including polyoxyethylene alkyl ethers such as polyoxyethylene lauryl ether, polyoxyethylene cetyl ether and polyoxyethylene stearyl ether; polyoxyethylene alkylaryl ethers such as polyoxyethylene octylphenyl ether and polyoxyethylene nonylphenyl ether; polyoxyethylene alkyl esters such as polyoxyethylene stearate; sorbitan alkyl esters such as sorbitan monolaurate, sorbitan monostearate, sorbitan distearate and sorbitan trioleate; monoglyceride alkyl esters such as glycerol monostearate and glycerol monooleate: anionic surfactants including alkylbebzenesulfonates such as sodium dodecylbenzenesulfonate; alkylnaphthalenesulfonates such as sodium butylnaphthalenesulfonate, sodium pentylnaphthalenesulfonate, sodium hexylnaphthalenesulfonate and sodium octylnaphthalenesulfonate; alkylsulfates such as sodium laurylsulfate; alkyl sulfonates such as sodium dodecylsulfonate; sulfosuccinic acid esters such as sodium dilaurylsulfosuccinate: amphoteric surfactants including alkylbetaines such as laurylbetaine and allylbetaine; and amino acids. Of these surfactants, anionic surfactants such as alkylnaphthalenesulfonates are specifically preferred. These surfactants may be used alone on in their combination. These surfactants are preferably contained in an effective amount (in terms of solids) of 0.1 to 20% by weight.

In addition to the components described above, the developer concentrate in the invention may optionally contain additives such as an organic solvent, a chelating agent, a reducing agent, dye, pigment, a water-softening agent, an antiseptic agent and a defoaming agent.

(Development Stabilizing Agent)

The developer concentrtae used in the invention preferably contains a development stabilizing agent. The preferred examples of the development stabilizing agent include an adduct of sugar alcohol with polyethylene glycol, tetraalkylammonium hydroxide such as tetrabutylammonium hydroxide, a phosphonium salt such as tetrabutylphosphonium bromide, and an iodonium salt such as diphenyliodonium chloride, as disclosed in Japanese Patent O.P.I. Publication No. 6-282079. Examples of the development stabilizing agent include anionic surfactants or amphoteric surfactants disclosed in Japanese Patent O.P.I. Publication No. 50-51324, water soluble cationic polymers disclosed in Japanese Patent O.P.I. Publication No. 55-95946, and water soluble amphoteric surfactants disclosed in Japanese Patent O.P.I. Publication No. 56-142528. Further, the examples include organic boron-containing compound to which alkylene glycol is added, disclosed in Japanese Patent O.P.I. Publication No.59-84241, polyoxyethylene-polyoxypropylene block polymer type water-soluble surfactant, disclosed in Japanese Patent O.P.I. Publication No. 60-111264, an alkylenediamine compound having polyoxyethylene-polyoxypropylene, disclosed in Japanese Patent O.P.I. Publication No. 60-129750, polyoxyethylene, glycol with an average weight molecular weight of not less than 300 disclosed in Japanese Patent O.P.I. Publication No. 61-215554, a fluorine-containing surfactant having a cationic group disclosed in Japanese Patent O.P.I. Publication No. 63-175858, and a water soluble ethyleneoxide adduct obtained by adding ethyleneoxy to an acid or an alcohol, or water soluble polyalkylenes disclosed in Japanese Patent O.P.I. Publication No. 2-39157.

(Organic Solvent)

Organic solvents are optionally added to a developer or a developer replenisher. The organic solvent is a solvent having a solubility in water of suitably 10 weight % or less, and preferably 5 weight % or less. Examples of the organic solvent include 1-phenylethanol, 2-phenylethanol, 3-phenyl-1-propanol, 4-phenyl-1-butanol, 1-phenyl-2-butanol, 2-phonoxyethanol, 2-benzyloxyethanol, o-methoxybenzylalcohol, m-methoxybenzylalcohol, p-methoxybenzylalcohol, benzylalcohol, cyclohexanol, 2-methylcyclohexanol, 3-methylcyclohexanol, 4-methylcyclohexanol, N-phenylethanolamine, and N-phenyldiethanolamine. The organic solvent content of the working developer is preferably 0.1 to 5 weight %. It is preferred that the organic solvent content is not substantially contained in the developer or developer replenisher. The term "not substantially contained" means that the organic solvent is contained in an amount of not more than 1% by weight.

(Reducing Agent)

A reducing agent is optionally added to the developer concentrate used in the invention. This is added in order to prevent occurrence of stains on the printing plate during printing. The addition is particularly effective in developing a negative working light sensitive planographic printing plate precursor comprising a light sensitive diazonium compound. Preferred examples of the reducing agent include a phenolic compound such as thiosalicylic acid, hydroquinone, metol, methoxyquinone, resorcine, or 2-methylresorcine, and an amine compound such as phenylenediamine or phenylhydrazine. Preferred examples of the inorganic reducing agent include a sodium, potassium or ammonium salt of an inorganic acid such as sodium sulfite, potassium sulfite, ammonium sulfite, sodium phosphite, potassium phosphite, ammonium phosphite, sodium hydrogen phosphite, potassium hydrogen phosphite, ammonium hydrogen phosphite, sodium thiosulfate, potassium thiosulfate, ammonium thiosulfate, sodium dithionite, potassium dithionite, ammonium dithionite. It is sulfite of these that shows excellent anti-staining effect. The reducing agent content of the developer is preferably 0.05 to 5% by weight.

(Organic Carboxylic Acid)

An organic carboxylic acid is optionally added to the developer concentrate used in the invention. Preferred organic carboxylic acids include an aliphatic carboxylic acid or an aromatic carboxylic acid each having a carbon atom number of from 6 to 20.

Examples of the aliphatic carboxylic acid include caproic acid, enanthic acid, caprylic acid, lauric acid, myristic acid, palmitic acid, and stearic acid. Particularly preferred are alkanoic acids having a carbon atom number of from 8 to 12. The acid may be an unsaturated acid having a double bond in the molecule or may have a branched carbon chain. The aromatic carboxylic acid is an aromatic compound such as benzene, naphthalene or anthracene having a carboxyl group. Examples of the aromatic carboxylic acid include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid. Hydroxy naphthoic acids are especially preferred. These carboxylic acids are preferably used in the salt form, for example as the sodium salts, potassium salts or ammonium salts, in order to increase their water solubility. The organic carboxylic acid content of the developer is not specifically limited, but the content lass than 0.1% by weight does not exhibit advantageous effects, while the content exceeding 10% by weight cannot enhance the effects, and may prevent dissolution of other additives into the developer. Therefore, the organic carboxylic acid content of the working developer is preferably from 0.1 to 10% by weight, and more preferably from 0.5 to 4% by weight.

(Other Additives)

The developer concentrate in the invention may contain the following additives in order to increase development performance. Examples of the additives include a neutral salt such as sodium chloride, potassium chloride, potassium bromide, as dislosed in Japanese Patent O.P.I. Publication No. 58-75152, a complex such as $[Co(NH_3)_6]Cl_3$ as disclosed in Japanese Patent O.P.I. Publication No. 59-121336, an amphoteric polymer such as a copolymer of vinylbenzyltrimethylammonium chloride and sodium acrylate as disclosed in Japanese Patent O.P.I. Publication No. 56-142258, the organic metal containing surfactant containing Si or Ti as disclosed in Japanese Patent O.P.I. Publication No. 59-75255, and the organic boron containing compound disclosed in Japanese Patent O.P.I. Publication No. 59-84241. The developer or developer replenisher in the invention can further contain an antiseptic agent, a coloring agent, a viscosity increasing agent, an antifoaming agent, or a water softener. Examples of the antifoaming agent include mineral oil, vegetable oil, alcohols, surfactants, and silicon oil. The water softeners include polyphosphoric acid or its sodium, potassium or ammonium salt; aminopolycarboxylic acids or their salts such as ethylenediaminetetraacetic acid or its sodium, potassium or ammonium salt, diethylenetriaminepentaacetic acid or its sodium, potassium or ammonium salt, triethylenetetraminehexaacetic acid or its sodium, potassium or ammonium salt, hydroxyethylethylene-diaminetriacetic acid or its sodium, potassium or ammonium salt, nitrilotriacetic acid or its sodium, potassium or ammonium salt, 1,2-diaminocyclohexane-tetraacetic acid or its sodium, potassium or ammonium salt, 1,3-diamino-2-propanoltetraacetic acid or its sodium, potassium or ammonium salt; and phosphonic acids or their salts such as aminotri(methylenephosphonic acid) or its sodium, potassium or ammonium salt, ethylenediaminetetra(methylenephosphonic acid) or its sodium, potassium or ammonium salt, diethylenetriaminepenta(methylenephosphonic acid) or its sodium, potassium or ammonium salt, triethylenetetraminehexa(methylenephosphonic acid) or its sodium, potassium or ammonium salt, hydroxyethylethylenediaminetri(methylenephosphonic acid) or its sodium, potassium or ammonium salt, and 1-hydroxyethane-1,1-diphosphonic acid or its sodium, potassium or ammonium salt. The water softener content of the developer varies on hardness or amount of a hard water used, but the content is preferably 0.01 to 5 weight %, and more preferably 0.01 to 0.5 weight %. The content less than the above range cannot attain the desired objects while the content exceeding the above range has an adverse effect on image areas such as dye elimination.

(Automatic Developing Machine)

It is preferred that a means for replenishing a developer replenisher in a necessary amount, a means for discharging any excessive developer, or a means for automatically replenishing water in necessary amounts is attached to the development section B. It is preferred that the automatic developing machine comprises a means for detecting a transported planographic printing plate precursor, a means for calculating the area of the planographic printing plate precursor based on the detection, or a means for controlling the replenishing amount of a developer replenisher, the replenishing amount of water to be replenished, or the replenishing timing. It is also preferred that the automatic developing machine comprises a means for detecting a pH, temperature and/or electric conductivity of a developer, or a means for controlling the replenishing amount of the developer replenisher, the replenishing amount of water to be replenished or the replenishing timing, based on the detection. It is also preferred to provide a mechanism of diluting the developer concentrate with water and of stirring the diluted concentrate. Where the developing step is followed by a washing step, washing water used for washing can be reused as dilution water for diluting the developer concentrate.

The automatic developing machine used in the invention may be provided with a pre-processing section to allow the plate to be immersed in a pre-processing solution prior to development. The pre-processing section is provided preferably with a mechanism of spraying a pre-processing solution onto the plate surface, preferably with a mechanism of controlling the pre-processing solution at a temperature within the range of 25 to 55° C., and preferably with a mechanism of rubbing the plate surface with a roller-type brush. Common water and the like are employed as the pre-processing solution.

(Post-Processing)

The developed printing plate material is preferably subjected to post-processing. The post-processing step comprises post-processing the developed precursor with a post-processing solution such as washing water, a rinsing solution containing a surfactant, a finisher or a protective gumming solution containing gum arabic or starch derivatives as a main component. The post-processing step is carried out employing an appropriate combination of the post-processing solution described above. For example, a method is preferred in which a developed planographic printing plate precursor is post-washed with washing water, and then processed with a rinsing solution containing a surfactant, or a developed planographic printing plate precursor is post-washed with washing-water, and then processed with a finisher, since it reduces fatigue of the rinsing solution or the finisher. It is preferred that a multi-step countercurrent processing is carried out employing a rinsing solution or a finisher. The post-processing is carried out employing an automatic developing machine having a development section and a post-processing section. In the post-processing step, the developed printing plate is sprayed with the post-processing solution from a spray nozzle or is immersed into the post-processing solution in a post-processing tank. A method is known in which supplies a small amount of water onto the developed printing plate precursor to wash the precursor, and reuses the water used for washing as a dilution water for developer concentrate. In the automatic developing machine, a method is applied in which each processing solution is replenished with the respective processing replenisher according to the area of the printing plate precursor to have been processed or the operating time of the machine. A method (use-and-discard method) can be applied in which the developed printing plate material is processed with fresh processing solution and discarded. The thus obtained planographic printing plate is mounted on a printing press, and printing is carried out.

(Gum Solution)

Gum solution may be suitably added with acids or buffers to remove from the developed plate alkaline ingredients which are contained in the developer. Further, there may be added a hydrophilic polymer compound, a chelating agent, a lubricant, an antiseptic and a solubilizing agent. Inclusion of the hydrophilic polymer compound in the gum solution provides a function as a protecting agent to prevent the developed plate from flawing or staining.

Addition of a surfactant to the gum solution used in this invention improves the surface form of the coated layer. As the surfactant, an anionic surfactant and/or a nonionic surfactant can be used. Examples of the anionic surfactant include fatty acid salts, abietic acid salts, hydroxyalkanesulfonic acid salts, alkanesulfonic acid salts, dialkylsulfosuccinic acid salts, straight chain alkylbebzenesulfonic acid salts, branched alktlbebzenesulfonic acid salts, alkylnaphthalenesulfonic acid salts, alkylphenoxypolyoxyethylene propylsulfonic acid salts, polyoxyethylene alkylsulfophenyl ether, polyoxyethylene aryl ether sulfonic acid salts, polyoxyethylene-naphthyl ether sulfonic acid salts, N-metyl-N-oleyltaurine sodium salts, petroleum sulfonic acid salts, nitrated castor oil, sulfated tallow oil, fatty acid alkyl ester sulfuric acid ester salts, alkylnitrates, polyoxyethylene alkyl ether sulfuric acid ester salts, fatty acid monoglyceride sulfate ester salts, polyoxyethylene alkylphenyl ether sulfuric acid salts, alkylphosphate ester salts, polyoxyethylene alkyl ether phosphoric acid ester salts, polyoxyethylene alkylphenyl ether phosphoric acid ester salts, partially saponified styrene anhydrous maleic acid copolymer, partially saponified olefin-anhydrous maleic acid copolymer, and naphthalenesulfonic acid salt-formaline condensates. Of the foregoing, dialkylsulfosuccinic acid salts, alkylsulfates and alkylnaphthalenesulfonic acid salts are preferred.

Examples of the nonionic surfactant include polyoxyethylene alkyl ethers, polyoxyethylene alkylphenyl ethers, polyoxyethylene-polyoxypropylene block polymers, polyoxyethylene aryl ethers, polyoxyethylene naphthyl ethers, polyoxyethylene polystyrylphenyl ethers, polyoxyethylene polyoxypropylene alkyl ethers, glycerin fatty acid partial esters, sorbitan fatty acid partial esters, pentaerythritol fatyy acid partial esters, propylene glycol monofatty acid esters, sugar fatty acid partial esters, polyoxuethylen sorbitan fatty acid partial esters, polyoxyethylene sorbitol fatty acid partial esters, polyethylene glycol fatty acid partial esters, polyglycerin fatty acid partial esters, polyoxyethylene-modified caster oils, polyoxyethylene grycerin fatty acid partial esters, fatty acid diethanolamides, N,N-bis-2-hydroxyalkylamines, polyoxyethylene alkylamine, triethanolamine fatty acid esters and trialkylamineoxides. Of the foregoing, polyoxyethylene alkylphenyl ethers and polyoxyethylene-polyoxypropylene block polymers are preferred. There are also usable fluorinated or silicone-type anionic or nonionic surfactants. The surfactants may be used as a mixture of two or more kinds thereof. For example, a combination of at least two different anionic surfactants or a combination of at least one anionic surfactant and at least one nonionic surfactant is preferred. The surfactant content is not specifically limited, but is preferably 0.01 to 20% by weight of post-processing solution.

In addition to the above ingredients, the gum solution used in the invention may contain polyhydric alcohols, alcohols or aliphatic hydrocarbons, as a wetting agent. Preferred examples of the polyhydric alcohols include ethylene glycol diethylene glycol, triethylene glycol, propylene glycol, tetraethylene glycol, polyethylene glycol, glycerin, and sorbitol. Preferred alcohols include, for example, alkyl alcohols such as propyl alcohol, butyl alcohol, pentanol, hexanol, butanol, and octanol; and alcohols containing an aromatic ring, such as benzyl alcohol, phenoxyethanol, and phenylaminoethyl alcohol.

Such a wetting agent is contained in the composition preferably at 0.1 to 50%, and more preferably 0.5 to 3.0% by weight. The wetting agents may be used alone or as a mixture of two or more kinds thereof.

There may be contained a variety of hydrophilic polymers for the purpose of enhancing film-forming ability. Any hydrophilic polymer which has been usable in a conventional gum solution is suitably usable. Examples thereof include gum Arabic, cellulose derivatives (e.g., carboxymethyl cellulose, carboxymethyl cellulose, methyl cellulose) and their modified compounds, polyvinyl alcohol and its derivatives, polyvinyl pyrrolidone, polyacrylamide and its copolymers, poly[(vinyl methyl ether)-co-(anhydrous maleic acid)], poly[(vinyl acetate)-co-(anhydrous maleic acid)], and poly[styrene-co-(anhydrous maleic acid)].

The gum solution in the invention is advantageously used within the acidic range of a pH of 3 to 6. Mineral acids, organic acids or inorganic salts are added to the post-processing solution to adjust the pH to the range of 3 to 6, preferably in an amount of 0.01 to 2% by weight. Mineral acids include, for example, nitric acid, sulfuric acid, phosphoric acid and metaphosphoric acid.

Organic acids include, for example, citric acid, acetic acid, oxalic acid, malonic acid, p-toluenesulfonic acid, tartaric acid, malic acid, lactic acid, levulinic acid, phytic acid and organic phosphonic acid. Inorganic salts include, for example, magnesium nitrate, primary phosphate, secondary phosphate, nickel sulfate, sodium hexamethanate, and sodium tripolyphosphate. Mineral acids, organic acids and inorganic salts may be used alone or as a mixture of two or more kinds thereof.

The gum solution may be added with antiseptics or defoaming agents. Examples of the antiseptics include phenol and its derivatives, formaline, imidazole derivatives, sodium dehydroacetate, 4-isothiazoline-3-one derivatives, benzoisothiazoline-3-one, benzotriazole derivatives, amidinoguanine derivatives, quaternary ammonium salts, derivatives of pyridine, quinoline and guanine, diazine, triazole derivatives, oxazole, and oxazine derivatives. A preferred content is a quantity capable of taking stable effect upon bacteria, mold or yeast, depending on the kind of bacteria, molds or yeast. The content is preferably 0.01 to 4% by weight, based on the working gum solution. Two or more antiseptic are preferably used as a mixture of two or more kinds thereof to take effects upon various kinds of bacteria or molds. Silicone defoaming agents are preferred, and any one of emulsion type and solubilization type is usable. A defoaming agent is used suitably at 0.01 to 1.0% by weight, based on the gum solution used.

Further, there may be added chelating agents. Preferred chelating agents include, for example, ethylenediaminetetraacetic acid and its sodium and potassium salts, diethylenetriaminepentaacetic acid and its sodium and potassium salts, triethylenetetraminehexaacetic acid and its sodium and potassium salts, ethylenediaminedisuccinic acid and its sodium and potassium salts, hydroxyethylethylenediaminetriacetic acid and its sodium and potassium salts, nitrilotriacetic acid and its sodium and potassium salts, and organic phosphonic acids or phosphonoalkanecarboxylic acids, such as 1-hydroxyethane-1,1-diphosphonic acid and its sodium and potassium salts, aminotri(methylenephosphonic acid) and its sodium and potassium salts. Besides the foregoing sodium and potassium salts of chelating agents, organic amine salts are also effective. Chelating agents are selected from those which can be stably present in the gum solution composition and is free from adverse effects on printing. The content thereof is preferably 0.001 to 1.0% by weight, based on the gum solution used.

In addition to the above ingredients, a lipophilicity-enhancing agent may be incorporated. Examples thereof include hydrocarbons such as turpentine oil, xylene, toluene, low heptane, solvent naphtha, kerosene, mineral spirit, petroleum fractions exhibiting a boiling point of ca. 120 to 250° C.; and plasticizers exhibiting a freezing point of 15° C. or less and a boiling point of 300° C. or more at 1 atmospheric pressure, including phthalic acid diesters such as dibutyl phthalate, diheptyl phthalate, di-n-octyl phthalate, di(2-ethylhexyl)phthalate, dinonyl phthalate, dodecyl vdilauryl phthalate, and butylbenzyl phthalate; dibasic fatty acid esters, such as dioctyl adipate, butylglycol adipate, dioctyl azelate, dibutyl sebacate, di(2-ethylhexyl)sebacate, and diocyl sebacate; epoxy-modified triglycerides such as epoxy-modified soybean oil; phosphoric acid esters such as tricresyl phosphate, trioctyl phosphate, and triscrolethyl phosphate; and benzoic acid esters such as benzyl benzoate.

Further, there are included saturated fatty acids such as caproic acid, enatoic acid, heralgonic acid, capric acid, undecylic acid, lauric acid, tridecylic acid, myristic acid, pentadecylic acid, palmitic acid, heptadecylic acid, stearic acid, nonadecanoic acid, arachic acid, behenic acid, lignoceric acid, cerotic acid, heptacosanoic acid, montanic acid, melissic acid, lacceric acid, and iso-valeric acid; and unsaturated fatty acids such as acrylic acid, crotonic acid, iso-crotonic acid, undecylenic acidpleic acid, elaidic acid, cetoleic acid, nilcaic acid, btecidinic acid, sorbic acid, linolic acid, linolenic acid, arachidonic acid, propiolic acid, stearolic acid, sardine oil, tariric acid, and licanic acid. Of the foregoing, a fatty acid which is liquid at 50° C. is more preferred, one having 5 to 25 carbons is still more preferred, and one having 8 to 21 carbons is most preferred. These lipophilicity-enhancing agents may be used alone or as a mixture of two or more kinds thereof. The content thereof is preferably 0.01 to 10%, and more preferably 0.05 to 5% by weight, based on the gum solution.

The lipophilicity-enhancing agents may be incorporated through solution in the oil phase of a gum emulsion. Alternatively, they may be solubilized with the aid of a solubilizing agent.

In the invention the solid concentration of the gum solution usable in this invention is preferably 5 to 30 g/l. A gum layer thickness can be controlled by conditions of a squeezing means of a processor. The gum coverage is preferably 1 to 10 g/m². The gum coverage of more than 10 g/m² necessitates drying the plate surface at a relatively high temperature to complete drying for a short period, which is disadvantageous in terms of cost and safety, and whereby effects of this invention cannot be sufficiently achieved. A gum coverage of less than 1 g/m² results in non-uniform coating and unstable processability.

In the invention, the time from completion of coating the gum solution to start of drying is preferably 3 sec. or less, and more preferably 2 sec. or less. The shorter time enhances ink affinity.

The drying time is preferably 1 to 5 sec. Effects of this invention cannot be achieved at a drying time of more than 5 sec. A drying time of less than 1 sec. necessitates raising the plate surface temperature to sufficiently dry the lithographic printing plate, leading to disadvantages in cost and safety.

In the invention, known drying methods using a hot air heater or a far-infrared heater are applicable in this invention.

In the drying stage, solvents included in the gum solution need to be dried, necessitating securing sufficient drying temperature and heater capacity. The temperature needed for drying depends on the composition of the gum solution. In the case of the solvent of the gum solution being water, for example, the drying time is preferably 55° C. or more. The capacity is preferably at least 2.6 kW in a hot air drying system. A larger capacity is desirable and a capacity of 2.6 to 7 kW is preferred in balance with cost.

(Washing Water Used Prior to Development)

Washing solution used in the washing stage prior to development invention is usually common water and may optionally be added with the following additives.

Chelating agents are used which are capable of coordination-bonding with a metal ion to form a chelate compound. Examples of the chelating agents include ethylenediaminetetraacetic acid and its potassium and sodium salts, ethylenediaminedisuccinic acid and its potassium and sodium salts, triethylenetetraminehexaacetic acid and its sodium and potassium salts, diethylenetriaminepentaacetic acid and its sodium and potassium salts, hydroxyethylethylenediaminetriacetic acid and its sodium and potassium salts, nitrilotriacetic acid and its sodium and potassium salts, 1-hydroxyethane-1,1-diphosphonic acid and its sodium and potassium salts, aminotri(methylenephosphonic acid) and its sodium and potassium salts and phosphonoalkanetricarboxylic acid. Besides the sodium and potassium salts of chelating agents, their organic amine salts are also effective. These chelating agents are contained in an amount of 0 to 3.0% by weight.

Surfactants usable in the invention include any one of anionic, nonionic, cationic and amphoteric surfactants, and anionic and nonionic surfactants are preferably used. The kind of preferred surfactants is different depending on the composition of an over-coat layer or photosensitive layer. In general are preferred surfactants which are capable of promoting dissolution of material used in the over-coat layer and exhibit less solubility for components of the photosensitive layer.

Examples of the anionic surfactants include fatty acid salts, abietic acid salts, hydroxyalkanesulfonates, alkanesulfonates, dialkylsulfosuccinates, straight chain alkylbebzenesulfonates, branched alktlbebzenesulfonates, alkylnaphthalenesulfonates, alkylphenoxypolyoxyethylene propylsulfonates, polyoxyethylene alkylsulfophenyl ether, polyoxyethylene aryl ether sulfonic acid salts, polyoxyethylene-naphthyl ether sulfonic acid salts, N-metyl-N-oleyl-taurine sodium salts, petroleum sulfonic acid salts, nitrated castor oil, sulfated tallow oil, fatty acid alkyl ester sulfuric acid ester salts, alkylnitrates, polyoxyethylene alkyl ether sulfuric acid ester salts, fatty acid monoglyceride sulfate ester salts, polyoxyethylene alkylphenyl ether sulfuric acid salts, alkylphosphate ester salts, polyoxyethylene alkyl ether phosphoric acid ester salts, polyoxyethylene alkylphenyl ether phosphoric acid ester salts, partially saponified styrene anhydrous maleic acid copolymer, partially saponified olefin-anhydrous maleic acid copolymer, and naphthalenesulfonate formaline condensates. Of the foregoing, dialkylsulfosuccinates, alkylsulfates and alkylnaphthalenesulfonates are preferred.

Examples of the nonionic surfactants include polyoxyethylene alkyl ethers, polyoxyethylene alkylphenyl ethers, polyoxyethylene-polyoxypropylene block polymers, polyoxyethylene aryl ethers, polyoxyethylene naphthyl ethers, polyoxyethylene polystyrylphenyl ethers, polyoxyethylene polyoxypropylene alkyl ethers, glycerin fatty acid partial esters, sorbitan fatty acid partial esters, pentaerythritol fatyy acid partial esters, propylene glycol monofatty acid esters, sugar fatty acid partial esters, polyoxuethylen sorbitan fatty acid partial esters, polyoxyethylene sorbitol fatty acid partial esters, polyethylene glycol fatty acid partial esters, polyglycerin fatty acid partial esters, polyoxyethylene-modified caster oils, polyoxyethylene grycerin fatty acid partial esters, fatty acid diethanolamides, N,N-bis-2-hydroxyalkylamines, polyoxyethylene alkylamine, triethanolamine fatty acid esters and trialkylamineoxides. The surfactant is contained preferably in an amount of 0 to 10% by weight. The surfactant may be used in combination with defoaming agents.

Antiseptics usable in the invention include, for example, phenol and its derivatives, formaline, imidazole derivatives, sodium dehydroacetate, 4-isothiazoline-3-one derivatives, benzoisothiazoline-3-one, benzotriazole derivatives, amidinoguanine derivatives, quaternary ammonium salts, derivatives of pyridine, quinoline and guanine, diazine, triazole derivatives, oxazole, and oxazine derivatives.

In washing, a washing solution used prior to development is used preferably at a controlled temperature, and more preferably at 10 to 60° C. Washing can be performed using commonly known solution-feeding techniques such as a spraying, dipping or coating method. During washing, a wash promoting method employing a brush, a squeezing roll or a submerged shower in a dipping treatment can be suitably used.

After completion of the washing stage prior to development, development may be immediately conducted, or drying may be conducted after the washing stage, subsequently, development may be performed. The development stage is followed by a post-treatment such as washing, rinsing or a gumming treatment. Washing water used prior to development may also be reused as washing water or for a rinsing solution or gumming solution.

EXAMPLES

Next, the present invention will be explained in the following examples, but the present invention is not limited thereto. In the examples, "parts" represents "parts by weight", unless otherwise specified.

Example 1

<<Polymer Binder: Synthesis of Acryl Copolymer 1>>

Thirty parts of methacrylic acid, 50 parts of methyl methacrylate, 20 parts of ethyl methacrylate, 500 parts of isopropyl alcohol, and 3 parts of $\alpha,\alpha'$-azobisisobutyro-nitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylammonium chloride and 25 parts of glycidyl methacrylate were further added to the mixture, and reacted for additional 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis).

(Preparation of Support)

A 0.24 mm thick and 1030 mm wide aluminum plate (material 1050) was successively treated according to the following procedures.

(a) Employing a conventional mechanical roughening device, mechanical roughening was performed by use of a rotating roller-shape nylon brush while supplying a suspension of an abrasive (pumice) having a specific gravity of 1.12 and water as a grinding slurry onto the aluminum plate surface. The abrasive has an average particle diameter of 40-45 μm and a maximum particle diameter of 200 μm. As a material for the nylon brush, 6,10-nylon was employed, and the blush had a bristle length of 50 mm and a bristle diameter of 0.3 mm. The nylon brush was prepared by planting bristles at a high density in holes provided in a stainless steel cylinder having a diameter of 300 mm. Three rotating brushes were employed. The distance between the two support rollers (φ 200 mm) under the brush was 300 mm. The brush roller was pressed onto the aluminum plate to make a load of 7 kW plus against the load before pressing, based on the load of a driving motor to rotate the brush. The rotation direction of the brush roller was same as the transportation direction of the aluminum plate, and the rotating rate was 200 rpm.

(b) The resulting aluminum plate was subjected to etching treatment, which sprayed the aluminum plate with a 70 ° C. solution having a caustic soda concentration of 2.6 weight % and an aluminum ion concentration of 6.5 weight %, to dissolve the aluminum by 0.3 g/m$^2$. Thereafter, the plate was washed by means of a water spray.

(c) Desmut treatment was performed by spraying the aluminum plate with an aqueous 1% by weight nitric acid solution (containing aluminum ion of 0.5 weight%) at 30° C., followed by washing by a water spray. As the nitric acid aqueous solution employed for the desmut treatment was used a waste solution from the process described later where electrolytic roughening was performed employing an alternating current in a nitric acid aqueous solution.

(d) Electrolytic roughening treatment was continuously performed by utilizing an alternating voltage of 60 Hz. In this case, the used electrolytic solution was an aqueous 1.1% by weight hydrochloric acid or nitric acid solution (containing an aluminum ion of 0.5 weight % and an ammonium ion of 0.007 weight %) and its temperature was 40° C. The electrolytic roughening treatment was performed employing a trapezoid wave alternating current at a TP (time taken for current to reach from zero to the peak value) of 2 msec, and at a duty ratio of 1/1, and employing a carbon electrode as a counter electrode. As a subsidiary anode, ferrite was utilized. Current density was 55 A/dm² in terms of effective value, and the immersion (electrolysis) time was 45 seconds. 2.5% of current from a power source was delivered to the subsidiary anode. Thereafter, the resulting plate was washed by water spray.

(e) The aluminum plate was subjected to etching treatment in which the plate was sprayed at a 32° C. solution having a sodium hydroxide concentration of 26 weight % and an aluminum ion concentration of 6.5 weight % at 32° C. to dissolve 0.2 g/m² of the aluminum, whereby smut components comprising aluminum hydroxide, which had been produced in the previous electrolytic roughening by an alternating current, were removed and the edge portions of the pits generated were dissolved to result in smoothening of the edge portions. Thereafter, the plate was sprayed with water and washed.

(f) The resulting aluminum plate was sprayed with a sulfuric acid aqueous solution having a concentration of 25% by weight (having aluminum ion concentration of 0.5% by weight) at 60° C., and desmutted. Thereafter, the plate was sprayed with water and washed.

(g) Employing a conventional anodizing treatment apparatus employing a two-step power-supplied electrolysis method (in which a length of each of the first and second electrolysis section is 6 m, the first power supply section is 3 m long, the second power supply section is 3 m long, and a length of each of the first and second power supply electrodes is 2.4 m), anodizing treatment was performed at 38° C. in a solution having a sulfuric acid concentration of 170 g/l (having an aluminum ion concentration of 0.5 weight %) in the electrolysis section. Thereafter, the plate was sprayed with water and washed. At this time, in the anodizing treatment apparatus, electric current from power source flowed to the first power supply electrode arranged in the first power supply section, then to the aluminum plate through the electrolytic solution to form an oxidized film on the surface of the aluminum plate in the first electrolysis section, and passed through the electrolysis electrode arranged in the first power supply section to return to the power source. On the other hand, electric current from a power source flowed to the second power supply electrode arranged in the second power supply section, then similarly to the aluminum plate through the electrolytic solution to form an oxidized film on the surface of the aluminum plate in the second electrolysis section. The quantity of electricity supplied from a power-source to the first power supply section and the quantity of electricity supplied from a power source to the second power supply section were same, and the power supply electric current density on the oxidized film surface at the second power supply section was approximately 25 A/dm². In the second power supply section, power was supplied from the surface of the oxidized film of 1.35 g/m². The final amount of the oxidized film was 2.7 g/m². The aluminum plate contains 0.1% by weight of iron, 0.02% by weight of copper and 0.02% by weight of titanium. Further, the resulting aluminum plate was sprayed with water and washed, and then subjected to hydrophilization treatment in which the plate was immersed in a 0.3% by weight polyvinyl phosphonic acid solution for 40 seconds. The hydrophilization treatment was carried out at 85° C. The average molecular weight of the polyvinyl phosphonic acid was approximately 10,000. Thereafter, the plate was sprayed with water and washed, followed by being dried with an infrared heater. Thus, an aluminum support was obtained. The aluminum support obtained above had an average centerline surface roughness (Ra) of 0.65 μm.

(Preparation of Light Sensitive Planographic Printing Plate Material)

The following photopolymerizable light sensitive layer coating solution was coated on the resulting support through a wire bar, and dried at 95° C. for 1.5 minutes to give a light sensitive layer having a dry thickness of 1.5 g/m². After that, the following oxygen shielding layer coating solution 1 was coated on the photopolymerizable light sensitive layer using a wire bar, and dried at 75° C. for 1.5 minutes to give an oxygen shielding layer with a dry thickness of 1.8 g/m². Thus, light sensitive planographic printing plate material samples 101 through 107 (as shown in Table 1) were prepared.

(Photopolymerizable Light Sensitive Layer Coating Solution 1)

| | |
|---|---|
| Ethylenically unsaturated monomer (NK oligo U-4HA, produced by Shinnakamura Kagaku Co., Ltd) | 27.0 parts |
| Cation-polymerizable compound as shown in Table 1 | 14.0 parts |
| Dye a | 3.0 parts |
| (η6-Cumene) (η5-cyclopentadienyl) iron (2) hexafluorophosphate | 4.0 parts |
| Acryl copolymer 1 | 45.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Sumirizer CS: produced by Sumitomo 3M Co., Ltd.) | 0.5 parts |
| Fluorine-contained surfactant (FC-4430: produced by Sumitomo 3M Co., Ltd.) | 0.5 parts |
| Methyl ethyl ketone | 80 parts |
| Cyclohexanone | 820 parts |
| (Oxygen shielding layer coating solution) | |
| Polyvinyl alcohol (GL-05, produced by Nippon Gosei Kagaku Co., Ltd.) | 89 parts |
| Polyvinyl Pyrrolidone (PVP K-30, produced by ISP Japan Co., Ltd.) | 10 parts |
| Surfactant (Surfinol 465, produced by Nisshin Kagaku Kogyo Co., Ltd.) | 0.5 parts |
| Water | 900 parts |

Dye-a

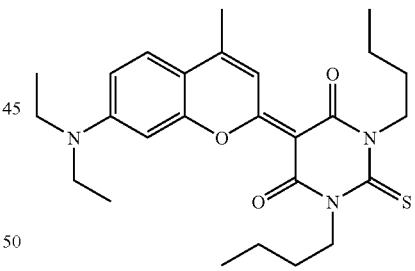

(Evaluation of Light Sensitive Planographic Printing Plate Material Sample)

(Printing Durability)

Employing a plate setter Tiger Cat (produced by ECRM Co., Ltd.) in which a light source emitting a 532 nm light was installed, the light sensitive planographic printing plate material sample obtained above was imagewise exposed at a resolving degree of 2400 dpi, so that exposure energy on the plate surface was 200 μJ/cm². Herein, dpi represents the dot numbers per 2.54 cm. Subsequently, the exposed sample was subjected to development treatment without being preheated, employing a CTP automatic developing machine (PHW 23-V produced by Technigraph Co., Ltd.) to obtain a planographic printing plate. Herein, the developing machine comprised a preheating section for preheating the exposed sample, a pre-washing section for removing the oxygen shielding layer before development, a development section charged with developer D-1 having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, a planographic printing plate was obtained.

(Developer D-1)

| <Developer composition> | |
|---|---|
| Potassium silicate No. A | 8.0% by weight |
| Newcol B-13SN (produced by Nippon Nyukazai Co., Ltd.) | 2.0% by weight |
| Pronon #204 (produced by Nippon Yushi Co., Ltd.) | 1.0% by weight |
| Ethylenediaminetetraacetic acid disodium dihydrate | 0.1% by weight |
| Potassium hydroxide | amount giving pH 12.9 |

Employing the resulting printing plate, printing was carried out on a press (DAIYA1F-1 produced by Mitsubishi Jukogyo Co., Ltd.), wherein a coat paper, printing ink (Toyo King Highecho Magenta M" produced by Toyo Ink Manufacturing Co., Ltd.), and dampening water (SG-51, H solution produced by Tokyo Ink Co., Ltd., Concentration: 1.5%) were used. After one thousand copies were printed, the printing plate surface was wiped with a plate cleaner, and image dots at highlight portions and at shadow portions were then observed. This operation has been repeated, and operation frequency, at which the dot reduction at highlight portions and/or filling-up at shadow portions occurred, was defined as a measure of printing durability. Operation frequency 1 means that one thousand copies were printed, and the printing plate surface was wiped with a plate cleaner. The more the printing durability frequency is, the higher the printing durability. The plate cleaner used was Ultra Plate Cleaner (sold from Dainichi Seika Co., Ltd.).

(Stain Elimination Property)

After one thousand copies were printed, and printing was stopped for 15 minutes, then printing was restarted, and the number of prints, in which stain at the non-image portions was eliminated, was counted. The less the number is, the better the stain elimination property.

(Linearity)

The light sensitive planographic printing plate material sample was exposed to give a dot image with a dot area from 0 to 100% (at an interval of 5%) at a screen frequency of 175 lines at exposure giving two times sensitivity. In the resulting output image, the portion corresponding to the 80% dot area was photographed employing an optical microscope of 500 magnifications, and the area was measured as a measure of linearity. The nearer to 80% the area is, the better the linearity.

The results are shown in Table 1.

TABLE 1

| Sample No. | Cation-polymerizable compound | Printing durability | Stain elimination property | Linearity | Remarks |
|---|---|---|---|---|---|
| 101 | — | 25 | 15 | 92 | Comp. |
| 102 | Epolead GT301 | 40 | 13 | 90 | Inv. |
| 103 | Epolead GT401 | 40 | 13 | 90 | Inv. |
| 104 | EHPE3150 | 43 | 13 | 90 | Inv. |
| 105 | Cyclomer M100 | 50 | 13 | 90 | Inv. |
| 106 | DOX | 40 | 13 | 89 | Inv. |
| 107 | XDO | 45 | 13 | 89 | Inv. |

Comp.: Comparative, Inv.: Inventive
Epolead GT301 (trifunctional alicyclic epoxy resin), produced by Daicel Kagaku Co., ltd.
Epolead GT401 (tetrafunctional alicyclic epoxy resin), produced by Daicel Kagaku Co., ltd.
EHPE 3150 (polyfunctional alicyclic epoxy resin), produced by Daicel Kagaku Co., ltd.
Cyclomer M100: (Exemplified compound RCM-3), produced by Daicel Kagaku Co., ltd.
DOX (OXT-221), the following compound, produced by Toa Gosei Co., Ltd.

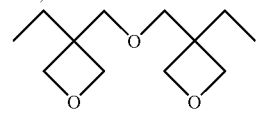

DCX (OXT-121), the following compound, produced by Toa Gosei Co., Ltd.

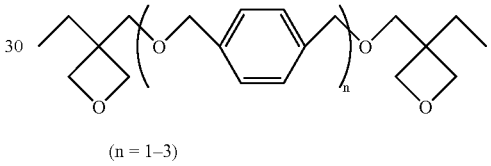

(n = 1–3)

As is apparent from Table 1, the inventive samples provide good printing durability, stain elimination property and linearity, as compared with comparative samples.

Example 2

Light sensitive planographic printing plate material samples 201 through 221 were prepared in the same manner as in Example 1, except that the following photopolymerizable light sensitive layer coating solution was used.

| (Photopolymerizable light sensitive layer coating solution 2) | |
|---|---|
| Compound represented by formula (A) as shown in Table 2 or U-4HA* (produced by Shinnakamura Kagaku Co., Ltd.) | 27.0 parts |
| Cation-polymerizable compound as shown in Table 2 | 14.0 parts |
| Dye a | 3.0 parts |
| (η6-Cumene) (η5-cyclopentadienyl) iron (2) hexafluorophosphate | 4.0 parts |
| Acryl copolymer 1 | 45.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Simirizer GS: produced by Sumitomo 3M Co., Ltd.) | 0.5 parts |
| Fluorine-contained surfactant (FC-4430: produced by Sumitomo 3M Co., Ltd.) | 0.5 parts |
| Methyl ethyl ketone | 80 parts |
| Cyclohexanone | 820 parts |

U-4HA*: Tetra-functional urethane acrylate resin
The results are shown in Table 2.

TABLE 2

| Sample No. | Ethylenically unsaturated compound | Cation-polymerizable compound | Printing durability | Stain elimination property | Linearity | Remarks |
|---|---|---|---|---|---|---|
| 201 | U-4HA | Epolead GT401 | 40 | 13 | 90 | Inv. |
| 202 | Compound 10-5 | Epolead GT401 | 55 | 13 | 89 | Inv. |
| 203 | Compound 10-5 | Cyclomer M100 | 63 | 13 | 89 | Inv. |
| 204 | Compound 10-5 | DOX | 58 | 13 | 89 | Inv. |
| 205 | Compound 10-5 | XDO | 58 | 13 | 89 | Inv. |
| 206 | Compound 10-14 | Epolead GT401 | 56 | 13 | 89 | Inv. |
| 207 | Compound 10-14 | Cyclomer M100 | 65 | 13 | 89 | Inv. |
| 208 | Compound 10-14 | DOX | 60 | 13 | 89 | Inv. |
| 209 | Compound 10-14 | XDO | 60 | 13 | 89 | Inv. |
| 210 | Compound 10-15 | Epolead GT401 | 57 | 13 | 89 | Inv. |
| 211 | Compound 10-15 | Cyclomer M100 | 65 | 13 | 89 | Inv. |
| 212 | Compound 10-15 | DOX | 61 | 13 | 89 | Inv. |
| 213 | Compound 10-15 | XDO | 61 | 13 | 89 | Inv. |
| 214 | Compound 10-16 | Epolead GT401 | 57 | 13 | 88 | Inv. |
| 215 | Compound 10-16 | Cyclomer M100 | 65 | 13 | 88 | Inv. |
| 216 | Compound 10-16 | DOX | 62 | 13 | 88 | Inv. |
| 217 | Compound 10-16 | XDO | 62 | 13 | 88 | Inv. |
| 218 | Compound 10-17 | Epolead GT401 | 59 | 13 | 88 | Inv. |
| 219 | Compound 10-17 | Cyclomer M100 | 69 | 13 | 88 | Inv. |
| 220 | Compound 10-17 | DOX | 63 | 13 | 88 | Inv. |
| 221 | Compound 10-17 | XDO | 63 | 13 | 88 | Inv. |

Inv.: Inventive

As is apparent from Table 2, the inventive samples further containing the compound represented by formula (A) as an ethylenically unsaturated monomer provide further better printing durability and linearity.

Example 3

Light sensitive planographic printing plate material samples 301 through 331 were prepared in the same manner as in Example 1, except that the following photopolymerizable light sensitive layer coating solution was used.

| (Photopolymerizable light sensitive layer coating solution 3) | |
|---|---|
| Compound 10-17 as a compound represented by formula (A) | 27.0 parts |
| Cation-polymerizable compound as shown in Table 3 | 14.0 parts |
| Polyhalogenated compound as shown in Table 3 | 3.0 parts |
| Dye a | 3.0 parts |
| (η6-Cumene) (η5-cyclopentadienyl) iron (2) hexafluorophosphate | 4.0 parts |
| Acryl copolymer 1 | 42.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Simirizer GS: produced by Sumitomo 3M Co., Ltd.) | 0.5 parts |
| Fluorine-contained surfactant (FC-4430: produced by Sumitomo 3M Co., Ltd.) | 0.5 parts |
| Methyl ethyl ketone | 80 parts |
| Cyclohexanone | 820 parts |

The results are shown in Table 3.

TABLE 3

| Sample No. | Polyhalogenated compound | Cation-polymerizable compound | Printing durability | Stain elimination property | Linearity | Remarks |
|---|---|---|---|---|---|---|
| 301 | — | Epolead GT401 | 59 | 13 | 88 | Inv. |
| 302 | BR22 | — | 15 | 13 | 70 | Comp. |
| 303 | BR22 | Epolead GT401 | 67 | 13 | 88 | Inv. |
| 304 | BR22 | Cyclomer M100 | 76 | 13 | 88 | Inv. |
| 305 | BR22 | DOX | 70 | 13 | 88 | Inv. |
| 306 | BR22 | XDO | 70 | 13 | 88 | Inv. |
| 307 | BR43 | Epolead GT401 | 67 | 13 | 88 | Inv. |
| 308 | BR43 | Cyclomer M100 | 76 | 13 | 88 | Inv. |
| 309 | BR43 | DOX | 70 | 13 | 88 | Inv. |
| 310 | BR43 | XDO | 70 | 13 | 88 | Inv. |
| 311 | BR67 | Epolead GT401 | 65 | 13 | 88 | Inv. |
| 312 | BR67 | Cyclomer M100 | 73 | 13 | 88 | Inv. |
| 313 | BR67 | DOX | 67 | 13 | 88 | Inv. |
| 314 | BR67 | XDO | 67 | 13 | 88 | Inv. |
| 315 | BR68 | Epolead GT401 | 65 | 13 | 88 | Inv. |
| 316 | BR68 | Cyclomer M100 | 73 | 13 | 88 | Inv. |
| 317 | BR68 | DOX | 67 | 13 | 88 | Inv. |
| 318 | BR68 | XDO | 67 | 13 | 88 | Inv. |
| 319 | BR77 | Epolead GT401 | 69 | 12 | 87 | Inv. |
| 320 | BR77 | Cyclomer M100 | 80 | 12 | 87 | Inv. |
| 321 | BR77 | DOX | 72 | 12 | 87 | Inv. |
| 322 | BR77 | XDO | 72 | 12 | 87 | Inv. |
| 323 | BR78 | Epolead GT401 | 69 | 12 | 87 | Inv. |
| 324 | BR78 | Cyclomer M100 | 80 | 12 | 87 | Inv. |
| 325 | BR78 | DOX | 72 | 12 | 87 | Inv. |
| 326 | BR78 | XDO | 72 | 12 | 87 | Inv. |
| 327 | BR79 | Epolead GT401 | 70 | 12 | 87 | Inv. |
| 328 | BR79 | Cyclomer M100 | 83 | 12 | 87 | Inv. |
| 329 | BR79 | DOX | 75 | 12 | 87 | Inv. |
| 330 | BR79 | XDO | 74 | 12 | 87 | Inv. |

Comp.: Comparative,
Inv.: Inventive

As is apparent from Table 3, the inventive samples, further containing the polyhalogenated compound, provide further better printing durability, stain elimination property and linearity.

Example 4

Light sensitive planographic printing plate material samples 301 through 331 were prepared in the same manner as in Example 1, except that the following photopolymerizable light sensitive layer coating solution was used.

| (Photopolymerizable light sensitive layer coating solution 4) | |
|---|---|
| Compound 10-17 as a compound represented by formula (A) | 27.0 parts |
| Cation-polymerizable compound as shown in Table 4 | 14.0 parts |

-continued (Photopolymerizable light sensitive layer coating solution 4)

| | |
|---|---|
| Polyhalogenated compound as shown in Table 4 | 3.0 parts |
| Dye b | 3.0 parts |
| (η6-Cumene) (η5-cyclopentadienyl) iron (2) hexafluorophosphate | 4.0 parts |
| Acryl copolymer 1 | 42.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Simirizer GS: produced by Sumitomo 3M Co., Ltd.) | 0.5 parts |
| Fluorine-contained surfactant (FC-4430: produced by Sumitomo 3M Co., Ltd.) | 0.5 parts |
| Methyl ethyl ketone | 80 parts |
| Cyclohexanone | 820 parts |

When compound 10-7 or polyhalogenated compound was not used, addition amount of the acryl copolymer 1 was increased.

Dye b

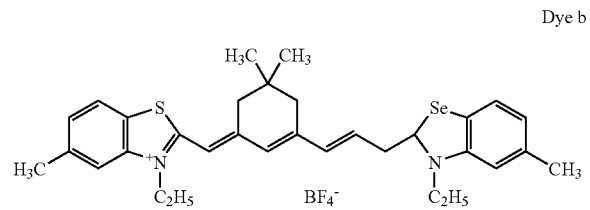

Employing Trendsetter 3244VFS (produced by Creo Co., Ltd.) in which a water cooled 40W infrared semiconductor laser was installed, the light sensitive planographic printing plate material sample obtained above was imagewise exposed at a resolving degree of 2400 dpi, so that exposure energy on the plate surface was as shown in Table 4.

Subsequently, the exposed sample was pre-heated to temperature as shown in Table 4, the power source of the pre-heating section being properly on or off. "–" in the "pre-heating temperature row of Table 4 means that the sample was processed at room temperature, the power being off. The exposed sample was subjected to development treatment, employing a CTP automatic developing machine (PHW 23-V produced by Technigraph Co., Ltd.) to obtain a planographic printing plate. Herein, the developing machine comprised a pre-washing section for removing the oxygen shielding layer before development, a development section charged with developer D-1 having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, a planographic printing plate was obtained.

Employing the resulting printing plate, printing was carried out on a press (DAIYA1F-1 produced by Mitsubishi Jukogyo Co., Ltd.), wherein a coat paper, printing ink (Toyo King Highecho Magenta M" produced by Toyo Ink Manufacturing Co., Ltd.), and dampening water (SG-51, H solution produced by Tokyo Ink Co., Ltd., Concentration: 1.5%) were used. After one thousand copies were printed, the printing plate surface was wiped with a plate cleaner, and image dots at highlight portions and at shadow portions were then observed. This operation has been repeated, and operation frequency, at which the dot reduction at highlight portions and/or filling-up at shadow portions occurred, was defined as a measure of printing durability. Operation frequency 1 means that one thousand copies were printed, and the printing plate surface was wiped with a plate cleaner. The more the printing durability frequency is, the higher the printing durability. The plate cleaner used was Ultra Plate Cleaner (sold from Dainichi Seika Co., Ltd.).

The results are shown in Table 4.

TABLE 4

| Sample No. | Cationpolymerizable compound | Ethylenically unsaturated monomer | Polyhalogenated compound | Dye | Plate surface energy (mJ/cm$^2$) | Pre-heating Temperature (° C.) | Printing durability | Stain elimination property | Linearity | Remarks |
|---|---|---|---|---|---|---|---|---|---|---|
| 401 | — | — | — | Dye b | 50 | — | No image formed | — | — | Comp. |
| 402 | XDO | Compound 10-17 | BR77 | Dye b | 0.15 | 110 | 70 | 14 | 88 | Inv. |
| 403 | XDO | Compound 10-17 | BR77 | Dye b | 10 | — | 70 | 13 | 87 | Inv. |
| 404 | XDO | Compound 10-17 | BR77 | Dye b | 50 | — | 70 | 13 | 87 | Inv. |
| 405 | XDO | Compound 10-17 | BR77 | Dye b | 100 | — | 72 | 13 | 89 | Inv. |
| 406 | XDO | — | — | Dye b | 0.15 | — | No image formed | — | — | Comp. |
| 407 | XDO | — | — | Dye b | 50 | — | No image formed | 13 | 90 | Comp. |
| 408 | XDO | Compound 10-17 | — | Dye b | 50 | — | 62 | 13 | 89 | Inv. |
| 409 | XDO | Compound 10-17 | BR77 | Dye b | 1 | — | 50 | 13 | 86 | Inv. |

Comp.: Comparative,
Inv.: Inventive

As is apparent from Table above, the inventive samples provide good printing durability, stain elimination property and linearity even when infrared semiconductor laser is used. It has been also proved that the pre-heating can be eliminated by application of the preferred exposure energy.

Example 5

Light sensitive planographic printing plate material samples 501 through 504 were prepared in the same manner as in Example 1, except that the following photopolymerizable light sensitive layer coating solution 5 was used instead of Photopolymerizable light sensitive layer coating solution 1. The resulting samples were evaluated in the same manner as in Example 1.

| (Photopolymerizable light sensitive layer coating solution 5) | |
| --- | --- |
| Ethylenically unsaturated monomer (NK OligoU-4HA, produced by Shinnakamura Kagaku Co., Ltd.) | 10.0 parts |
| Ethylenically unsaturated monomer (NK Ester4G, produced by Shinnakamura Kagaku Co., Ltd.) | 8.0 parts |
| Ethylenically unsaturated monomer (Compound 10-14) | 13.0 parts |
| Cation-polymerizable compound as shown in Table 5 | 10.0 parts |
| Dye c | 3.0 parts |
| (η6-Cumene) (η5-cyclopentadienyl) iron (2) hexafluorophosphate | 3.0 parts |
| Polyhalogenated compound BR22 | 1.0 parts |
| Polyhalogenated compound BR78 | 1.0 parts |
| Polyhalogenated compound 2-1 | 1.0 parts |
| Acryl copolymer 1 | 45.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (FC-4430: produced by Sumitomo 3M Co., Ltd.) | 0.5 parts |
| Methyl ethyl ketone | 80 parts |
| Cyclohexanone | 820 parts |

Dye c

TABLE 5

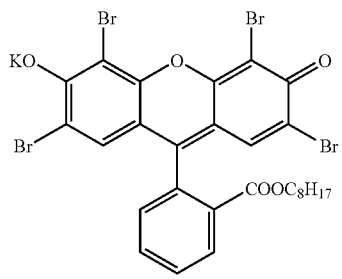

| Sample No. | Cation-polymerizable compound | Printing durability | Stain elimination property | Linearity | Remarks |
| --- | --- | --- | --- | --- | --- |
| 501 | RCM-3 | 73 | 13 | 86 | Inv. |
| 502 | RCM-5 | 68 | 13 | 86 | Inv. |
| 503 | RCM-7 | 67 | 13 | 86 | Inv. |
| 504 | — | 19 | 15 | 71 | Comp. |

Comp.: Comparative, Inv.: Inventive

As is apparent from Table 3, the inventive samples, further containing the cation-polymerizable compound in the invention, provide good printing durability, stain elimination property and linearity.

Example 6

Light sensitive planographic printing plate material samples 601 through 604 were prepared in the same manner as in Example 4, except that the following photopolymerizable light sensitive layer coating solution 6 was used instead of Photopolymerizable light sensitive layer coating solution 4. The resulting samples were evaluated in the same manner as in Example 4.

| (Photopolymerizable light sensitive layer coating solution 5) | |
| --- | --- |
| Ethylenically unsaturated monomer (NK OligoU-4HA, produced by Shinnakamura Kagaku Co., Ltd.) | 10.0 parts |
| Ethylenically unsaturated monomer (NK Ester4G, produced by Shinnakamura Kagaku Co., Ltd.) | 8.0 parts |
| Ethylenically unsaturated monomer (Compound 10-14) | 13.0 parts |
| Cation-polymerizable compound as shown in Table 6 | 10.0 parts |
| Dye d | 3.0 parts |
| (η6-Cumene) (η5-cyclopentadienyl) iron (2) hexafluorophosphate | 3.0 parts |
| Polyhalogenated compound BR22 | 3.0 parts |
| Polyhalogenated compound BR78 | 1.0 parts |
| Polyhalogenated compound 2-1 | 1.0 parts |
| Acryl copolymer 1 | 45.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (FC-4430: produced by Sumitomo 3M Co., Ltd.) | 0.5 parts |
| Methyl ethyl ketone | 80 parts |
| Cyclohexanone | 820 parts |

Dye d

TABLE 6

| Sample No. | Cation-polymerizable compound | Printing durability | Stain elimination property | Linearity | Remarks |
| --- | --- | --- | --- | --- | --- |
| 601 | RCM-3 | 82 | 13 | 86 | Inv. |
| 602 | RCM-5 | 75 | 13 | 85 | Inv. |
| 603 | RCM-7 | 71 | 13 | 85 | Inv. |
| 604 | — | 21 | 15 | 70 | Comp. |

Comp.: Comparative,
Inv.: Inventive

As is apparent from Table 3, the inventive samples, further containing the cation-polymerizable compound in the invention, provide excellent printing durability, stain elimination property and linearity.

EFFECT OF THE INVENTION

The present invention provides a light sensitive composition, a light sensitive planographic printing plate material and an image formation method providing excellent printing durability, stain elimination property and linearity.

What is claimed is:

1. A light sensitive composition comprising an addition polymerizable ethylenically unsaturated monomer A), a photopolymerization initiator B), a polymer binder C), and a cation-polymerizable compound D), wherein the photopolymerization initiator B) is an iron-arene complex, the addition polymerizable ethylenically unsaturated monomer A) is a compound represented by formula (A), $$R^4{}_{(m-n)}Q^1[(CH_2\overset{R^1}{\underset{R^2}{C}}O)_a\!-\!CONH(X^1\!-\!NHCOO)_b\!-\!X^2(OOC\overset{R^3}{C}\!=\!CH_2)_c]_n$$

wherein $Q^1$ represents $$-\!\!\overset{|}{N}\!\!-,\quad -\!\!\overset{|}{N}\!\!-\!E\!-\!\overset{|}{N}\!\!-,\quad -\!\!N\!\!\underset{D^2}{\overset{D^1}{\diamond}}\!\!N\!\!-$$

or —S—; $R^4$ represents an alkyl group, a hydroxyalkyl group, or an aryl group; $R^1$ and $R^2$ independently represent a hydrogen atom, an alkyl group, or an alkoxyalkyl group; $R^3$ represents a hydrogen atom, a methyl group or an ethyl group; $X^1$ represents a divalent group having a carbon atom number of from 2 to 12; and $X^2$ represents a divalent, trivalent or tetravalent group or the following group, $$-\!\!\left\langle\!\!\!\begin{array}{c}(Z)_p\\ (NH\!\!-\!\!)_q\end{array}\!\!\!\right\rangle$$

wherein Z represents a hydrogen atom, an alkyl group, an alkenyl group, an aryl group, a halogen atom, an alkoxy group, or a heterocyclic group; p is an integer of from 1 to 4; q is an integer of from 1 to 3; $D^1$ and $D^2$ independently represent a divalent group having a carbon atom number of from 1 to 5; E represents a divalent group having a carbon atom number of from 2 to 12; an aliphatic group having a 5- to 7-membered heterocyclic group containing one or two atoms selected from the group consisting of a nitrogen atom, an oxygen atom and a sulfur atom; an arylene group having a carbon atom number of from 6 to 12 or a 5- or 6-membered aromatic heterocyclic group; "a" is an integer of 0 to 4; "b" is an integer of 0 or 1; "c" represents an integer of 1 to 3; m is an integer of from 2 to 4; and n represents an integer of 1 to m, and wherein the cation-polymerizable compound D) is a compound represented by formula (I) or (II), Formula (I)

wherein $R^1$ represents a hydrogen atom or a methyl group; $R^2$ represents a hydrogen atom or an alkyl group having a carbon atom number of not more than 4; and $X^2$ represents a chemical bond or a divalent organic group Formula (II)

wherein $R^3$ represents a hydrogen atom or a methyl group; $R^4$ represents a hydrogen atom or an alkyl group having a carbon atom number of not more than 4; and $X^2$ represents a chemical bond, or a divalent organic group.

2. The light sensitive composition of claim 1, further comprising a polyhalogenated compound.

3. The light sensitive composition of claim 1, further comprising a compound having an absorption maximum in the wavelength regions of from 700 to 1200 nm.

4. A light sensitive planographic printing plate material comprising a support and provided thereon, a light sensitive layer comprising an addition polymerizable ethylenically unsaturated monomer A), a photopolymerization initiator B), a polymer binder C), and a cation-polymerizable compound D), wherein the photopolymerization initiator D) is an iron-arene complex, the addition polymerizable ethylenically unsaturated monomer A) is a compound represented by formula (A), Formula (A)

$$R^4{}_{(m-n)}Q^1[(CH_2\overset{R^1}{\underset{R^2}{C}}O)_a\!-\!CONH(X^1\!-\!NHCOO)_b\!-\!X^2(OOC\overset{R^3}{C}\!=\!CH_2)_c]_n$$

wherein $Q^1$ represents $$-\!\!\overset{|}{N}\!\!-,\quad -\!\!\overset{|}{N}\!\!-\!E\!-\!\overset{|}{N}\!\!-,\quad -\!\!N\!\!\underset{D^2}{\overset{D^1}{\diamond}}\!\!N\!\!-$$

or —S—; $R^4$ represents an alkyl group, a hydroxyalkyl group, or an aryl group; $R^1$ and $R^2$ independently represent a hydrogen atom, an alkyl group, or an alkoxyalkyl group; $R^3$ represents a hydrogen atom, a methyl group or an ethyl group; $X^1$ represents a divalent group having a carbon atom number of from 2 to 12; and $X^2$ represents a divalent, trivalent or tetravalent group or the following group,

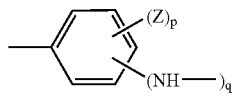

wherein Z represents a hydrogen atom, an alkyl group, an alkenyl group, an aryl group, a halogen atom, an alkoxy group, or a heterocyclic group; p is an integer of from 1 to 4; q is an integer of from 1 to 3; $D^1$ and $D^2$ independently represent a divalent group having a carbon atom number of from 1 to 5; E represents a divalent group having a carbon atom number of from 2 to 12; an aliphatic group having a 5- to 7-membered heterocyclic group containing one or two atoms selected from the group consisting of a nitrogen atom, an oxygen atom and a sulfur atom; an arylene group having a carbon atom number of from 6 to 12 or a 5- or 6-membered aromatic heterocyclic group; "a" is an integer of 0 to 4; "b" is an integer of 0 or 1; "c" represents an integer of 1 to 3; m is an integer of from 2 to 4; and n represents an integer of 1 to m, and wherein the cation-polymerizable compound D) is a compound represented by formula (I) or (II), Formula (I)

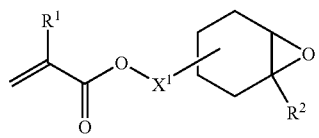

wherein $R^1$ represents a hydrogen atom or a methyl group; $R^2$ represents a hydrogen atom or an alkyl group having a carbon atom number of not more than 4; and $X^1$ represents a chemical bond or a divalent organic group Formula (II)

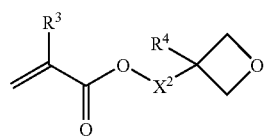

wherein $R^3$ represents a hydrogen atom or a methyl group; $R^4$ represents a hydrogen atom or an alkyl group having a carbon atom number of not more than 4; and $X^1$ represents a chemical bond, or a divalent organic group.

5. The light sensitive planographic printing plate material of claim 4, wherein the light sensitive layer further comprises a polyhalogenated compound.

6. The light sensitive planographic printing plate material of claim 4, wherein the light sensitive layer further comprises a compound having an absorption maximum in the wavelength regions of from 700 to 1200 nm.

7. An image formation method comprising the steps of providing a light sensitive composition comprising an addition polymerizable ethylenically unsaturated monomer A), a photopolymerization initiator B), a polymer binder C), a cation-polymerizable compound D), and a compound having an absorption maximum in the wavelength regions of from 700 to 1200 nm;

coating the light sensitive composition on a support to obtain a light sensitive planographic printing plate material having a light sensitive layer on the support; and imagewise exposing the light sensitive layer employing a light having an emission wavelength of from 700 to 1200 nm so that the exposure energy on the light sensitive layer surface is not less than 1 mJ/cm², whereby an image is recorded on the light sensitive layer, wherein the photopolymerization initiator B) is an iron-arene complex, the addition polymerizable ethylenically unsaturated monomer A) is compound represented by formula (A), Formula (A)

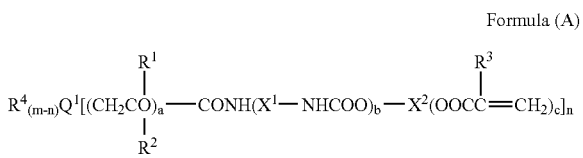

wherein $Q^1$ represents

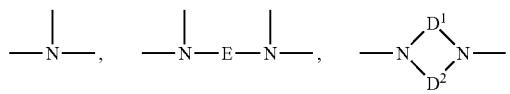

or —S—; $R^4$ represents an alkyl group, a hydroxyalkyl group, or an aryl group; $R^1$ and $R^2$ independently represent a hydrogen atom, an alkyl group, or an alkoxyalkyl group; $R^3$ represents a hydrogen atom, a methyl group or an ethyl group; $X^1$ represents a divalent group having a carbon atom number of from 2 to 12; and $X^2$ represents a divalent, trivalent or tetravalent group or the following group, Formula (II)

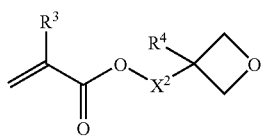

wherein Z represents a hydrogen atom, an alkyl group, an alkenyl group, an aryl group, a halogen atom, an alkoxy group, or a heterocyclic group; p is an integer of from 1 to 4; q is an integer of from 1 to 3; $D^1$ and $D^2$ independently represent a divalent group having a carbon atom number of from 1 to 5; E represents a divalent group having a carbon atom number of from 2 to 12; an aliphatic group having a 5- to 7-membered heterocyclic group containing one or two atoms selected from the group consisting of a nitrogen atom, an oxygen atom and a sulfur atom; an arylene group having a carbon atom number of from 6 to 12 or a 5- or 6-membered aromatic heterocyclic group; "a" is an integer of 0 to 4; "b" is an integer of 0 or 1; "c" represents an integer of 1 to 3; m is an integer of from 2 to 4; and n represents an integer of 1 to m, arid wherein the cation-polymerizable compound D) is a compound represented by formula (I) or (II),

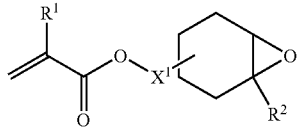

Formula (I)

wherein $R^1$ represents a hydrogen atom or a methyl group; $R^2$ represents a hydrogen atom or an alkyl group having a carbon atom number of not more than 4; and $X^1$ represents a chemical bond, or a divalent organic group

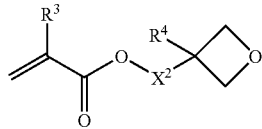

Formula (II)

wherein $R^3$ represents a hydrogen atom or a methyl group; $R^4$ represents a hydrogen atom or an alkyl group having a carbon atom number of not more than 4; and $X^2$ represents a chemical bond, or a divalent organic group.

* * * * *